(12) United States Patent
Taguchi et al.

(10) Patent No.: US 10,678,131 B2
(45) Date of Patent: Jun. 9, 2020

(54) COMPOSITION, FILM, CURED FILM, OPTICAL SENSOR, AND METHOD FOR PRODUCING FILM

(71) Applicant: FUJIFILM Corporation, Tokyo (JP)

(72) Inventors: Yoshinori Taguchi, Haibara-gun (JP); Hidenori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 63 days.

(21) Appl. No.: 16/123,492

(22) Filed: Sep. 6, 2018

(65) Prior Publication Data

US 2019/0004422 A1    Jan. 3, 2019

Related U.S. Application Data

(63) Continuation of application No. PCT/JP2016/083087, filed on Nov. 8, 2016.

(30) Foreign Application Priority Data

Mar. 14, 2016  (JP) .................................. 2016-049983

(51) Int. Cl.
| | | |
|---|---|---|
| *G03F 7/004* | (2006.01) | |
| *C09D 201/00* | (2006.01) | |
| *C08F 2/44* | (2006.01) | |
| *C09D 7/40* | (2018.01) | |
| *C09D 201/08* | (2006.01) | |
| *C08F 2/48* | (2006.01) | |
| *C08F 222/10* | (2006.01) | |
| *G03F 7/105* | (2006.01) | |
| *G03F 7/00* | (2006.01) | |
| *C09D 4/06* | (2006.01) | |
| *G03F 7/038* | (2006.01) | |
| *C08L 101/00* | (2006.01) | |
| *G03F 7/027* | (2006.01) | |
| *G03F 7/031* | (2006.01) | |
| *G03F 7/029* | (2006.01) | |
| *G03F 7/033* | (2006.01) | |
| *G03F 7/16* | (2006.01) | |
| *G03F 7/20* | (2006.01) | |
| *G03F 7/32* | (2006.01) | |

(52) U.S. Cl.
CPC .............. *G03F 7/0043* (2013.01); *C08F 2/44* (2013.01); *C08F 2/48* (2013.01); *C08F 222/1006* (2013.01); *C08L 101/00* (2013.01); *C09D 4/06* (2013.01); *C09D 7/40* (2018.01); *C09D 201/00* (2013.01); *C09D 201/08* (2013.01); *G03F 7/0005* (2013.01); *G03F 7/027* (2013.01); *G03F 7/029* (2013.01); *G03F 7/0275* (2013.01); *G03F 7/031* (2013.01); *G03F 7/033* (2013.01); *G03F 7/0388* (2013.01); *G03F 7/105* (2013.01); *G03F 7/162* (2013.01); *G03F 7/168* (2013.01); *G03F 7/2004* (2013.01); *G03F 7/322* (2013.01); *C08F 222/104* (2020.02); *C09D 7/66* (2018.01)

(58) Field of Classification Search
CPC ...... G03F 7/0043; G03F 7/105; G03F 7/0005; G03F 7/0388; G03F 7/027; G03F 7/0275; G03F 7/029; G03F 7/033; G03F 7/162; G03F 7/168; G03F 7/2004; G03F 7/322; G03F 7/031; G03F 7/004; G03F 7/26; C09D 201/00; C09D 7/40; C09D 201/08; C09D 4/06; C09D 7/66; C08F 2/44; C08F 2/48; C08F 222/1006; C08F 2222/104; C08L 101/00; C08K 3/22; C08K 2003/2241

See application file for complete search history.

(56) References Cited

U.S. PATENT DOCUMENTS

| | | | | |
|---|---|---|---|---|
| 5,788,759 | A * | 8/1998 | Takao | ................. C09B 67/0025 |
| | | | | 106/498 |
| 2008/0213692 | A1 | 9/2008 | Hanamura | |
| 2012/0257283 | A1 | 10/2012 | Maruyama et al. | |
| 2018/0057655 | A1* | 3/2018 | Kikuta | .................. C08L 101/12 |
| 2019/0135951 | A1* | 5/2019 | Taguchi | .................. G03F 7/105 |

FOREIGN PATENT DOCUMENTS

| | | |
|---|---|---|
| EP | 2502963 A1 | 9/2012 |
| EP | 2687548 A1 | 1/2014 |
| JP | 2005-189399 A | 7/2005 |
| JP | 2006-210546 A | 8/2006 |
| JP | 2010-238785 A | 10/2010 |
| JP | 2011-127096 A | 6/2011 |
| JP | 2012-220759 A | 11/2012 |
| JP | 2015-22029 A | 2/2015 |
| JP | 2015-34961 A | 2/2015 |

(Continued)

OTHER PUBLICATIONS

HunterLab, Applications Note, "insight on Color", Jul. 1-15, vol. 8, No. 7, year 1996, 4 pages. (Year: 1996).*
Machine translation of Application discription of JP 2016-027384, downloaded Jan. 6, 2020 from J=PlatPat {JPP}, 29 pages (Year: 2020).*
European Communication dated Sep. 3, 2019, for corresponding European Application No. 16894531.9.
International Preliminary Report on Patentability and Written Opinion of the International Searching Authority (forms PCT/IB/373, PCT/ISA/237 and PCT/IB/326), dated Sep. 27, 2018, for corresponding International Application No. PCT/JP2016/083087, with Written Opinion translation.

(Continued)

*Primary Examiner* — Cynthia Hamilton
(74) *Attorney, Agent, or Firm* — Birch, Stewart, Kolasch & Birch, LLP

(57) ABSTRACT

A composition includes at least one of particles having an average primary particle diameter of 50 to 150 nm or particles having an average major axis length of 50 to 150 nm, and a resin, in which the composition has an L* in an L*a*b* color space of CIE 1976 of 35 to 75 in a case of forming a film with a thickness of 3 μm using the composition. A film; a cured film; an optical sensor; and a method for producing a film each use the composition.

18 Claims, 1 Drawing Sheet

(56) References Cited

FOREIGN PATENT DOCUMENTS

JP        2016-27384 A       2/2016
KR   10-2013-0053383 A       5/2013

OTHER PUBLICATIONS

International Search Report (form PCT/ISA/210), dated Dec. 13, 2016, for corresponding International Application No. PCT/JP2016/083087, with an English translation.
Extended European Search Report dated Jan. 21, 2019, for corresponding European Application No. 16894531.9
Japanese Office Action for corresponding Japanese application No. 2018-505229, dated Oct. 1, 2019, with English translation.
Korean Office Action for corresponding Korean Application No. 10-2018-7026247, dated Dec. 16, 2019, with a English translation.
European Office Action dated Mar. 18, 2020, for corresponding European Application No. 16894531.9.

* cited by examiner

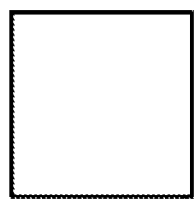 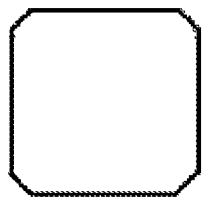 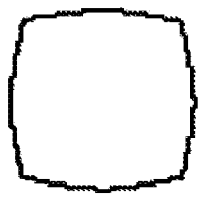 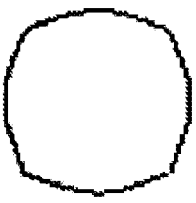 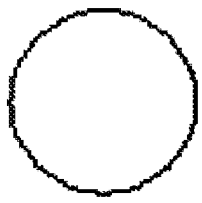
(a) (b) (c) (d) (e)

COMPOSITION, FILM, CURED FILM, OPTICAL SENSOR, AND METHOD FOR PRODUCING FILM

CROSS-REFERENCE TO RELATED APPLICATIONS

This application is a Continuation of PCT International Application No. PCT/JP2016/083087, filed on Nov. 8, 2016, which claims priority under 35 U.S.C. § 119(a) to Japanese Patent Application No. 2016-049983, filed on Mar. 14, 2016. Each of the above application(s) is hereby expressly incorporated by reference, in its entirety, into the present application.

BACKGROUND OF THE INVENTION

1. Field of the Invention

The present invention relates to a composition, a film, a cured film, an optical sensor, and a method for producing a film.

2. Description of the Related Art

Production of a film using a composition including a resin and particles has been performed. In particular, production of a film using a composition including particles such as titanium oxide has been performed (see JP2015-34961A, JP2010-238785A, JP2005-189399A, JP2006-210546A, and JP2015-22029A).

SUMMARY OF THE INVENTION

A film formed using a composition including a resin and particles is a white film, which can be used in an optical sensor application using a semiconductor. As the film in the optical sensor application using a semiconductor, a shielding film which is thin, has a shielding degree that makes it possible to hide an optical sensor, and simultaneously, transmits light sufficient for detection of a change in the amount of light received by driving the optical sensor is required. In a case of using a film having an L* in an L*a*b* color space of CIE 1976 in a range of more than 75 close to pure white color, the transmittance of light is low, and it is difficult for light in the amount sufficient for detection of a change in the amount of light received by driving the optical sensor to be transmitted. Even in a case where the film is formed into a thin film, from the viewpoint of hiding an optical sensor, it is necessary for the film to have an L* in an L*a*b* color space of CIE 1976 of 35 or more as a whiteness. Thus, in order to satisfy both the shielding degree and the transmittance, the film is required to have an L* in a region ranging from 35 to 75.

Furthermore, in a case of producing a film using a composition including particles and a resin, the low temporal liquid stability of the composition may cause the particles to sediment in some cases. In particular, in the optical sensor application using a semiconductor, the composition in which the particles or the like hardly sediment is required.

An object to be accomplished by the present invention is to provide a composition which has an L* in an L*a*b* color space of CIE 1976 of 35 to 75 in a case of forming a film with a thickness of 3 µm, and has excellent temporal liquid stability.

Under such circumstances, the present inventors have conducted extensive studies, and as a result, the compositions including a resin and particles, as described in JP2015-34961A, JP2010-238785A, JP2005-189399A, JP2006-210546A, and JP2015-22029A, have been used in the following (1) and (2) applications.

(1) An application for a reflective film, emphasizing whiteness and contrast ratios, which has an L* in an L*a*b* color space of CIE 1976 of more than 75, using particles having large particle diameters (for example, 180 nm or more).

(2) An application for an anti-reflection film and the like, emphasizing transparency and a high refractive index, which has an L* in an L*a*b* color space of CIE 1976 of less than 35, using particles having small particle diameters (for example, less than 50 nm).

The present inventors have found that the object can be accomplished by adopting the following configurations which have not been used in the applications (1) and (2), thereby completing the present invention. The present invention and preferred configurations of the present invention are as shown below.

[1] A composition comprising:
at least one of particles having an average primary particle diameter of 50 to 150 nm or particles having an average major axis length of 50 to 150 nm; and
a resin,
in which the composition has an L* in an L*a*b* color space of CIE 1976 of 35 to 75 in a case of forming a film with a thickness of 3 µm using the composition.

[2] The composition as described in [1],
in which the composition is a curable composition.

[3] The composition as described in [1] or [2],
in which a content of the particles is 30% to 60% by mass with respect to the total solid content of the composition.

[4] The composition as described in any one of [1] to [3],
in which the particles include inorganic particles.

[5] The composition as described in [4],
in which the inorganic particles include a white pigment.

[6] The composition as described in [4] or [5],
in which the inorganic particles include titanium oxide.

[7] The composition as described in any one of [1] to [6],
in which the resin is an alkali-soluble resin.

[8] The composition as described in any one of [1] to [7], further comprising:
a radically polymerizable compound; and
a polymerization initiator.

[9] The composition as described in any one of [1] to [8], further comprising a coloring inhibitor.

[10] The composition as described in any one of [1] to [9], further comprising a chain transfer agent.

[11] The composition as described in any one of [1] to [10], further comprising at least one of a dispersant or a dispersion aid.

[12] A film formed using the composition as described in any one of [1] to [11].

[13] A film comprising:
at least one of particles having an average primary particle diameter of 50 to 150 nm or particles having an average major axis length of 50 to 150 nm; and
a resin,
in which the film has an L* in an L*a*b* color space of CIE 1976 of 35 to 75.

[14] The film as described in [12] or [13],
in which the film has an average transmittance in a wavelength range of 400 to 700 nm of 1% or more with its thickness being 3 µm.

[15] The film as described in any one of [12] to [14],
in which the film has a thickness of 10 µm or less.

[16] A cured film formed by curing the film as described in any one of [12] to [15].

[17] An optical sensor comprising the cured film as described in [16].

[18] A method for producing a film, comprising:
a step of exposing the composition as described in any one of [1] to [11] through a mask with a pattern; and
a step of developing the exposed composition to form a pattern.

According to the present invention, it is possible to provide a composition which has an L* in an L*a*b* color space of CIE 1976 of 35 to 75 in a case of forming a film with a thickness of 3 μm, and has excellent temporal liquid stability.

In addition, according to the present invention, it is also possible to provide a film, a cured film, an optical sensor, and a method for producing a film.

BRIEF DESCRIPTION OF THE DRAWING

FIG. 1 is a view showing a standard for evaluation of a pattern shape.

DESCRIPTION OF THE PREFERRED EMBODIMENTS

Hereinafter, the contents of the present invention will be described in detail.

Description of configuration requirements described below may be made on the basis of representative embodiments of the present invention, but the present invention is not limited to such embodiments.

In the present specification, a numerical range expressed using "to" means a range that includes the preceding and succeeding numerical values of "to" as the lower limit value and the upper limit value, respectively.

In citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, "(meth)acrylate" represents acrylate and methacrylate, "(meth)acryl" represents acryl and methacryl, and "(meth)acryloyl" represents acryloyl and methacryloyl.

In the present specification, "exposure" includes, unless otherwise specified, not only exposure using light but also lithography by particle rays such as electron beams and ion beams. Incidentally, light to be used in exposure means actinic rays or radiation such as a bright line spectrum of a mercury lamp, far ultraviolet rays typified by an excimer laser, extreme ultraviolet rays (EUV light), X-rays, and electron beams.

In the present specification, a weight-average molecular weight and a number-average molecular weight are each defined as a value in terms of polystyrene, as measured by means of gel permeation chromatography (GPC). In the present specification, the weight-average molecular weight (Mw) and the number-average molecular weight (Mn) can be determined, for example, by using HLC-8220 (manufactured by Tosoh Corporation), TSKgel Super AWM-H (manufactured by Tosoh Corporation, 6.0 mm (inner diameter)×15.0 cm) as columns, and a 10-mmol/L lithium bromide N-methylpyrrolidinone (NMP) solution as an eluent.

[Composition]

The composition of the present invention is a composition including at least one of particles having an average primary particle diameter of 50 to 150 nm or particles having an average major axis length of 50 to 150 nm, and a resin, in which the composition has an L* in an L*a*b* color space of CIE 1976 of 35 to 75 in a case of forming a film with a thickness of 3 μm using the composition.

In a case where the average primary particle diameter or the average major axis length is no more than the upper limit value, it is difficult for sedimentation in the composition to occur, and thus, the temporal liquid stability is improved. Further, in a case where the average primary particle diameter or the average major axis length is no more than the upper limit value, the L* in an L*a*b* color space of CIE 1976 is easily controlled to 75 or less in a case of forming a film with a thickness of 3 μm. In a case where the average primary particle diameter or the average major axis length is no less than the lower limit value, L* in an L*a*b* color space of CIE 1976 is easily controlled to 35 or more in a case of forming a film with a thickness of 3 μm.

The composition of the present invention is preferably a curable composition. The curable composition is referred to a composition including a curable compound which will be described later. The curable composition may be either a photocurable composition or a thermosetting composition.

<Characteristics>

Details of the characteristics of the composition of the present invention will be described.

<<L*>>

For the composition of the present invention, the L* in an L*a*b* color space of CIE 1976 is 35 to 75 in a case of forming a film with a thickness of 3 μm using the composition. The upper limit in the L* in an L*a*b* color space of CIE 1976 is preferably 70 or less in a case of forming a film with a thickness of 3 μm using the composition. The lower limit in the L* in an L*a*b* color space of CIE 1976 is preferably 40 or more, and more preferably 50 or more, in a case of forming a film with a thickness of 3 μm using the composition. Further, the value of the L* in an L*a*b* color space of CIE 1976 is a value measured by the method described in Examples which will be described later.

<<a* and b*>>

For the composition of the present invention, the a* in an L*a*b* color space of CIE 1976 is preferably −30 to 30, more preferably −20 to 20, and particularly preferably −10 to 10, in a case of forming a film with a thickness of 3 μm using the composition.

For the composition of the present invention, the b* in an L*a*b* color space of CIE 1976 is preferably −35 to 30, more preferably −33 to 0, and particularly preferably −30 to −15, in a case of forming a film with a thickness of 3 μm using the composition.

<<Sedimentation Rate of Solid Content>>

For the composition of the present invention, the sedimentation rate of the solid content of the composition upon centrifugation for 47 minutes under the condition of 3,500 rotations per minute (rpm) at room temperature (25° C.) is preferably 10% by mass or less, and more preferably 5% by mass or less. Examples of a method for lowering the sedimentation rate of the solid content of the composition include a method for enhancing the viscosity of the composition, a method for lowering the concentration of the solid content of the composition, a method for enhancing the dispersibility of the solid content (preferably particles) in the composition, a method for lowering the density of particles, and a method for decreasing the particle diameters of the particles. The "solid content" in the present specification means, unless otherwise specified, "a solid content before a centrifugation treatment" which will be described later. A sedimentation rate of the solid content is calculated by dividing a difference between "the solid content after the centrifugation treatment" and "the solid content before the centrifugation treatment" which will be described later by "the solid content before the centrifugation treatment".

<<Concentration of Solid Content>>

The concentration of the solid content of the composition is preferably 20% to 75% by mass. The upper limit is more preferably 60% by mass or less. The lower limit is more preferably 30% by mass or more. By setting the concentration of the solid content of the composition to the range, the viscosity of the composition can be enhanced, sedimentation of particles, or the like can be effectively suppressed, and thus, the temporal liquid stability of the composition can be improved.

<Formulation of Composition>

Hereinafter, the formulation of the composition will be described in detail.

<<Particles Having Average Primary Particle Diameter of 50 to 150 nm and Particles Having Average Major Axis Length of 50 to 150 nm (Specific Particles)>>

The composition of the present invention contains at least one of particles having an average primary particle diameter of 50 to 150 nm or particles having an average major axis length of 50 to 150 nm. The particles having an average primary particle diameter of 50 to 150 nm and the particles having an average major axis length of 50 to 150 nm are hereinafter also referred to as specific particles.

For the composition of the present invention, from the viewpoint that the L* in an L*a*b* color space of CIE 1976 is easily controlled to 35 to 75 in a case of forming a film with a thickness of 3 μm, it is preferable that the composition contains particles having an average primary particle diameter of 50 to 150 nm.

The average primary particle diameter of the particles having an average primary particle diameter of 50 to 150 nm is preferably 60 to 140 nm, and more preferably 80 to 130 nm. The particles having an average primary particle diameter of 50 to 150 nm are preferably particles that are circular in the particle images taken by a transmission electron microscope. The particles having an average primary particle diameter of 50 to 150 nm may be particles having a major axis and a minor axis which will be described later, which are not strictly circular particles.

For the composition of the present invention, the particles having an average primary particle diameter of 50 to 150 nm contains particles with primary particle diameters of 50 to 150 nm (preferably 60 to 140 nm, and more preferably 80 to 130 nm), preferably in the proportion of 30% to 60% by mass, more preferably in the proportion of 30% to 50% by mass, and particularly preferably in the proportion of 35% to 50% by mass. In a case where the proportion of the particles with a primary particle diameter of 50 to 150 nm is 30% by mass or more, the L* in an L*a*b* color space of CIE 1976 is easily controlled to 35 to 75 in a case of forming a film with a thickness of 3 μm, and thus, a composition having excellent temporal liquid stability is also easily provided.

In the present invention, the primary particle diameters of the particles can be determined by observing powder particles with a transmission electron microscope (TEM) and measuring portions in which particles are not agglomerated. In the present invention, the particle size distribution of the particles is determined by taking transmission electron microscopic images of the powder particles that are primary particles using a transmission electron microscope, and then measuring the particle size distribution using an image treatment device, using the images. In the present invention, for the average primary particle diameter of the particles, the arithmetic mean diameter on the basis of the number calculated from the particle size distribution is taken as an average primary particle diameter. In the present specification, an electron microscope by Hitachi High-Technologies Corporation (H-7000) is used as the transmission electron microscope, and LUZEX AP manufactured by NIRECO Corporation is used as an image treatment device.

The average major axis length of the particles having an average major axis length of 50 to 150 nm in the present invention is preferably 60 to 140 nm, and more preferably 80 to 130 nm.

The particles having an average major axis length of 50 to 150 nm are preferably particles having a major axis and a minor axis. In the present specification, the major axis of the particle means the longest diameter of the particle in the image of the particle taken with a transmission electron microscope. In the present specification, the minor axis of the particle means the shortest diameter of the particle in the image of the particle taken with a transmission electron microscope. The particles having a major axis and a minor axis are preferably rod-shape particles or ellipsoidal particles in the image of the particles taken with a transmission electron microscope.

The average minor axis length of the particles having an average major axis length of 50 to 150 nm in the present invention is preferably 5 to 50 nm, more preferably 10 to 30 nm, and particularly preferably 10 to 20 nm. The average major axis length of the particles having an average major axis length of 50 to 150 nm is preferably 2 to 10 times, more preferably 3 to 6 times, and particularly preferably 4 to 5 times the average minor axis length.

In the composition of the present invention, the particles having an average major axis length of 50 to 150 nm contain particles with a major axis length of 50 to 150 nm (preferably 60 to 140 nm, and more preferably 60 to 140 nm), preferably in the proportion of 30% to 60% by mass, more preferably 30% to 50% by mass, and particularly preferably 35% to 50% by mass. In a case where the proportion of the particles with a major axis length of 50 to 150 nm is 30% by mass or more, the L* in an L*a*b* color space of CIE 1976 is easily controlled to 35 to 75 in a case of forming a film with a thickness of 3 μm, and a composition having excellent temporal liquid stability is also easily provided. In the present invention, the major axis length and the minor axis length of the particles can be determined by observing powder particles with a transmission electron microscope (TEM) and observing portions in which the particles are not aggregated. In the present invention, the particle size distribution of the particles is determined by imaging the powder particles that are primary particles using a transmission electron microscope to take transmission electron microscopic images, and then measuring the particle size distribution of the major axis length and the minor axis length of the particle with an image treatment device using the images. In the present invention, for the average major axis length and the average minor axis length of the particles, the arithmetic mean diameter on the basis of the number calculated from the particle size distribution is taken as average major axis length and an average minor axis length. In the present specification, an electron microscope by Hitachi High-Technologies Corporation (H-7000) is used as the transmission electron microscope, and LUZEX AP manufactured by NIRECO Corporation is used as an image treatment device.

The density of the specific particles is preferably 1.0 to 6.0 g/cm$^3$. The lower limit is more preferably 2.5 g/cm$^3$ or more, and still more preferably 3.0 g/cm$^3$ or more. The upper limit is more preferably 4.5 g/cm$^3$ or less. As the density of the specific particles is closer to a preferred range of the lower limit value, it is difficult for sedimentation of the particles in the composition to occur, and the temporal liquid stability, the pattern shape, and the defects can be more effectively improved. Further, the ratio of the particles having a density of 2.5 g/cm$^3$ or more (preferably 3.0 g/cm$^3$ or more) in the total amount of particles is preferably 5% by mass or more, and more preferably 10% by mass or more. The upper limit can be set to 100% by mass or to 99% by mass or less.

The type of the specific particles is not particularly limited.

Examples of the particles include various inorganic particles and organic particles known in the related art. The particles preferably include at least inorganic particles. The inorganic particles have a higher density than the organic particles in many cases, and sedimentation of the particles having a higher density in the composition easily occurs. According to the present invention, due to a use of specific particles, even in a case where the inorganic particles are used as the particles, it is possible to suppress the sedimentation of the inorganic particles, and thus, provide a composition having excellent temporal liquid stability.

The inorganic particles are preferably particles including a metal. The particles including a metal more preferably include an elemental metal or a metal oxide.

Examples of the specific particles include a pigment, a ceramic material, a magnetic material, and other particles, with the pigment being preferable.

In the compositions of the present invention, the inorganic particles are preferably white pigments. By using the white pigments as the inorganic particles, the L* in an L*a*b* color space of CIE 1976 is easily controlled to a preferred range in a case of forming a film with a thickness of 3 μm using the composition. In the present invention, the white pigments include not only a pigment in pure white but also a pigment in light gray (for example, grayish white and pale gray) close to white.

The white pigment tends to have a high density, and thus, easily sediments in the composition. According to the present invention, at least one of particles having an average primary particle diameter of 50 to 150 nm or particles having an average major axis length of 50 to 150 nm is used, and therefore, even in a case where a white pigment is used as the particles, the sedimentation of the white pigments is suppressed, and thus, a composition having excellent temporal liquid stability can be provided.

Examples of the white pigments include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably a particle having titanium atom, and more preferably titanium oxide. That is, in the composition of the present invention, the inorganic particles preferably include titanium oxide.

With regard to titanium oxide, the purity of titanium dioxide ($TiO_2$) is preferably 70% or more, more preferably 80% or more, and still more preferably 85% or more. Titanium oxide is a lower titanium oxide represented by $Ti_nO_{2n-1}$ (n represents a number of 2 to 4), and the content of titanium oxynitride and the like is preferably 30% by mass or less, more preferably 20% by mass or less, and still more preferably 15% by mass or less.

Titanium oxide may be either anatase type titanium oxide or rutile type titanium oxide, but from the viewpoints of coloring properties and temporal liquid stability, the rutile type titanium oxide is preferable. In particular, a cured film obtained by curing a composition using the rutile type titanium oxide has a small change in the color difference even with the cured film being heated, and has good coloring properties. Further, the rutilization rate of titanium oxide is preferably 95% or more, and more preferably 99% or more.

As the rutile type titanium oxide, known ones can be used. There are two types of methods for producing rutile type titanium oxide, that is, a sulfuric acid method and a chlorine method, and in the present invention, rutile type titanium oxide produced by any of the production methods can also be suitably used. Here, the sulfuric acid method is referred to as a production method in which ilmenite ore and titanium slag to be used as a raw material are dissolved in concentrated sulfuric acid to separate iron fractions as iron sulfate, the solution is hydrolyzed to obtain a precipitate of a hydroxide, and the precipitate is calcined at a high temperature to extract rutile type titanium oxide. On the other hand, the chlorine method is referred to as a production method in which synthetic rutile or natural rutile to be used as a raw material are reacted with chlorine gas and carbon at a high temperature of about 1,000° C. to synthesize titanium tetrachloride, and the titanium tetrachloride is oxidized to extract rutile type titanium oxide. The rutile type titanium oxide is preferably rutile type titanium oxide obtained by a chlorine method.

The titanium oxide particles having an average primary particle diameter of 50 to 150 nm and the titanium oxide particles having an average major axis length of 50 to 150 nm can be seen white by scattering light, and the L* in an L*a*b* color space of CIE 1976 is easily controlled to 35 to 75 in a case of forming a film with a thickness of 3 μm using the composition. A preferred range of the average primary particle diameter of the titanium oxide particles is the same as the preferred range of the particles having an average primary particle diameter of 50 to 150 nm and the average primary particle diameter of the particles having an average major axis length of 50 to 150 nm.

The refractive index to light at a wavelength of 589 nm of the specific particles is preferably 1.75 to 2.80, more preferably 1.90 to 2.80, still more preferably 2.1 to 2.75, and particularly preferably 2.50 to 2.75. In a case where the refractive index to light at a wavelength of 589 nm of the specific particles is 2.1 or more, the L* in an L*a*b* color space of CIE 1976 can be increased in a case of forming a film with a thickness of 3 μm, which is thus preferable.

The refractive index of the particles is measured by the following method.

Firstly, dispersion is performed using a dispersant with a known refractive index and propylene glycol-1-monomethyl ether 2-acetate (PGMEA). Thereafter, the prepared dispersion liquid and a resin having a known refractive index are mixed such that the concentration of the particles in the solid content reaches 10% by mass, 20% by mass, 30% by mass, and 40% by mass, thereby preparing four kinds of coating liquids. After these coating liquids are used on a Si wafer to form a film in 300 nm, and then the refractive index of the obtained film is measured using ellipsometry (Lambda Ace RE-3300 (trade name), Dainippon Screen Mfg. Co., Ltd.). Thereafter, by plotting the particle concentration and the refractive index, and performing extrapolation, the refractive index of the particles is derived.

Furthermore, the particles are extracted from the composition, the film, or the cured film by the following methods, and then the refractive index of the particles can also be measured by the method in the same manner.

In a case where the refractive index for the particles extracted from the film or the cured film is measured, as for a method for extracting the particles from the film, for example, 2 to 6 mol/L of a basic solution is added to a film or a cured film (in a case of a composition, the composition is applied to form a film) in the amount of 10% to 30% by mass with respect to the mass of the film or the cured film, heated and refluxed for 12 hours, and then filtered and washed, thereby obtaining a particle component.

As the specific surface area of titanium oxide, a value thereof as measured by a Brunauer, Emmett, and Teller (BET) method is preferably 10 to 400 $m^2/g$, more preferably 10 to 200 $m^2/g$, still more preferably 10 to 150 $m^2/g$, particularly preferably 10 to 40 $m^2/g$, and most preferably 10 to 20 $m^2/g$.

The power of hydrogen (pH) of titanium oxide is preferably 6 to 8.

The oil absorption amount (g/100 g) of titanium oxide is preferably 10 to 60 (g/100 g), and more preferably 10 to 40 (g/100 g).

For titanium oxide, the total amount of $Fe_2O_3$, $Al_2O_3$, $SiO_2$, $Nb_2O_5$, and $Na_2O$ is preferably 0.1% by mass or less, more preferably 0.05% by mass or less, and still more preferably 0.02% by mass or less, and particularly preferably, titanium oxide is not substantially included.

The shape of titanium oxide is not particularly limited. Examples thereof include shapes such as an isotropic shape (for example, a spherical shape and a polyhedral shape), an anisotropic shape (for example, a needle-like shape, a rod-like shape, and a plate-like shape), and an amorphous shape.

The hardness (Mohs hardness) of titanium oxide is preferably 5 to 8, and more preferably 7 to 7.5.

The true specific gravity (density) of titanium oxide is preferably 1.0 to 6.0 $g/cm^3$, and more preferably 3.9 to 4.5 $g/cm^3$.

The volume gravity of titanium oxide is preferably 0.1 $g/cm^3$ to 1.0 $g/cm^3$, and more preferably 0.2 $g/cm^3$ to 0.4 $g/cm^3$.

Inorganic particles such as titanium oxide may be the particles which have been subjected to a surface treatment with a surface treating agent such as an organic compound. Examples of the surface treating agent used for the surface treatment include a polyol, aluminum oxide, aluminum hydroxide, silica (silicon oxide), hydrated silica, alkanolamine, stearic acid, organosiloxane, zirconium oxide, hydrogenphosphite dimethicone, a silane coupling agent, and a titanate coupling agent. Among those, the silane coupling agent is preferable. Further, inorganic particles such as titanium oxide are preferably the particles which have been subjected to a surface treatment with any at least one surface treating agent selected from the group consisting of Al, Si, Zr, an organic substance, more preferably the particles which have been subjected to a surface treatment with a surface treating agent with aluminum (Al), silicon (Si), or organic substance, and particularly preferably the particles which have been subjected to a surface treatment with any one surface treating agent selected from the group consisting of an Al compound and organic substance. Since the surface of the inorganic particles such as titanium oxide is coated, the photocatalytic activity of the inorganic particles such as titanium oxide can be suppressed, and thus, light fastness is improved. The surface treatment can be carried out with only one kind of surface treating agent or a combination of two or more kinds of surface treating agent. Further, it is also preferable that the surface of the inorganic particles such as titanium oxide is coated with oxides such as aluminum oxide, silica, and zirconium oxide. Thus, the light fastness and the dispersibility are further improved.

It is also preferable that the inorganic particles such as titanium oxide are coated with a basic metal oxide or a basic metal hydroxide. Examples of the basic metal oxide or the basic metal hydroxide include metal compounds containing magnesium, zirconium, cerium, strontium, antimony, barium, calcium, or the like.

Inorganic particles coated with a basic metal oxide or a basic metal hydroxide can be obtained, for example, as follows.

The inorganic particles are dispersed in water or a liquid including water as a main component to obtain a slurry. The inorganic particles are pulverized using a sand mill, a ball mill, or the like, as desired. Then, the pH of the slurry is adjusted to make the slurry neutral or alkaline, or acidic, as desired. Thereafter, a water-soluble salt thereof which serves as a raw material for a coating material is added to the slurry to coating the surface of the inorganic particles. Thereafter, the slurry was neutralized to recover the inorganic particles. The recovered inorganic particles may be dried or dry-pulverized.

It is preferable that the inorganic particles such as titanium oxide have an acidic site and are surface-treated with a compound capable of reacting with the acidic site. Examples of the compound capable of reacting with the acidic site of the inorganic pigment include polyhydric alcohols such as trimethylolpropane, trimethylolethane, ditrimethylolpropane, trimethylolpropane ethoxylate, and pentaerythritol, alkanolamines such as monoethanolamine, monopropanolamine, diethanolamine, dipropanolamine, triethanolamine, and tripropanolamine, chlorosilanes, and alkoxysilanes.

Examples of a method for reacting inorganic particles with a compound capable of reacting with an acidic site of the inorganic particles include (1) a method in which the compound and inorganic particles are put into a dry pulverizer such as a fluid energy pulverizer and an impact pulverizer, and the inorganic pigment is pulverized, (2) a method in which the compound and the dry-pulverized inorganic particles were stirred and mixed using a high-speed stirrer such as a Henschel mixer and a super mixer, and (3) a method in which the compound is added to an aqueous slurry of the inorganic particles, and stirred.

As the inorganic particles, a commercially available product can be preferably used. Examples of the commercially available product of titanium oxide include:

trade names TIPAQUE R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-401L, PT-501A, PT-501R, UT771, TTO-51C, TTO-80A, TTO-S-2, A-220, MPT-136, MPT-140, and MPT-141, manufactured by ISHIHARA SANGYO KAISHA, LTD.;

trade names R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, STR-100A-LP, STR-100C-LP, and TCA-123E, manufactured by Sakai Chemical Industry Co., Ltd.;

trade names JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, MT-700BS, MT-700HD, and MT-700Z, manufactured by TAYCA CORPORATION;

trade names KR-310, KR-380, KR-380N, and ST-485SA15, manufactured by Titan Kogyo, Ltd.;

trade names TR-600, TR-700, TR-750, TR-840, and TR-900, manufactured by Fuji Titanium Industry Co., Ltd.; and trade name Brilliant 1500 manufactured by Shiraishi Calcium Kaisha, Ltd. Further, titanium oxide described in paragraphs 0025 to 0027 of JP2015-67794A can also be used.

In addition, examples of a commercially available product of strontium titanate include SW-100 (manufactured by Titan Kogyo, Ltd.). Examples of a commercially available product of barium sulfate include BF-1L (manufactured by Sakai Chemical Industry Co., Ltd.). Examples of a commercially available product of zinc oxide include Zincox Super F-1 (manufactured by Hakusui Tech Co., Ltd.), and the like. Examples of a commercially available product of zirconium oxide include Z-NX (manufactured by Taiyo Engineering Corporation).

A commercially available product of titanium oxide may be subjected to a classification treatment, and then used in the composition of the present invention. For example, a classification-treated product of CR-90-2 or a classification-treated product of MPT-141 can be preferably used.

The physical properties and the impurities of commercially available products of the inorganic particles are shown below.

TABLE 2

| | Impurities [%] | | | | |
|---|---|---|---|---|---|
| | $Fe_2O_3$ | $Al_2O_3$ | $SiO_2$ | $Nb_2O_5$ | $Na_2O$ |
| PT-501R | 0.003 | 0 | 0 | 0.13 | 0.001 |
| PT-401M | 0.02 | 0 | 0 | 0 | 0.001 |
| PT-401L | 0.002 | 0 | 0 | 0 | 0.001 |

In the present invention, it is preferable that as the inorganic particles, not only particles including only singular inorganic substance, but also composite particles including other materials may be used. It is preferable to use, for example, particles having pores or other materials therein, particles having a number of inorganic particles attached to core particles, or core-shell composite particles including core particles including polymer particles and a shell layer including inorganic fine nanoparticles. With regard to the core-and-shell composite particles including core particles including polymer particles and a shell layer including inorganic fine nanoparticles, reference can be made to, for example, the descriptions in paragraphs 0012 to 0042 of JP2015-47520A, the contents of which are incorporated herein by reference.

The content of the specific particles is preferably 1% by mass or more, more preferably 3% by mass or more, particularly preferably 5% by mass or more, more particularly preferably 30% by mass or more, and most preferably 35% by mass or more, with respect to the total solid content of the composition. The upper limit is not particularly limited, but is more preferably 70% by mass or less, still more preferably 60% by mass or less, and particularly preferably 50% by mass or less, with respect to the total solid content of the composition.

Furthermore, the proportion of the inorganic particles in the specific particle is preferably 50% by mass or more, and more preferably 80% by mass or more. The upper limit can be set to 100% by mass or to 99% by mass or less. From the

TABLE 1

| | Crystal system | $TiO_2$ [%] | Surface treating agent | Oil absorption amount g/100 g | Specific surface area $m^2/g$ | pH | Moisture % | Rutilization rate [%] |
|---|---|---|---|---|---|---|---|---|
| TTO-80A | Rutile type | 95 to 99 | Aluminum hydroxide | 24 to 30 | 23 to 27 | | | |
| PT-401M | Rutile type | 99.9 | None | | 19.7 | | 0.41 | 61.2 |
| MPT-140 | Rutile type | 95 to 99 | Aluminum hydroxide | 24 to 30 | 18 to 22 | | | |
| MPT-141 | Rutile type | 95 to 99 | Aluminum hydroxide | 23 to 29 | 12.5 to 16.5 | | | |
| PT-401L | Rutile type | 99.9 | None | | 11.7 | | 0.23 | 72.7 |
| TTO-S-2 | | 75 or more | Aluminum hydroxide, silicic acid, stearic acid | | | | | |
| STR-100C-LP | | 89 | Aluminum hydroxide, hydrogen dimethicone | | | | | |
| STR-100A-LP | | 84 | Aluminum hydroxide, hydrogen dimethicone | | | | | |
| ST-457SA | | | Aluminum hydroxide, stearic acid | | | | | |
| ST-485SA15 | | | Aluminum hydroxide, stearic acid | | | | | |
| TTO-51 C | | 75 or more | Aluminum hydroxide, silicic acid, stearic acid | | | | | |
| PT-501R | Rutile type | 99.7 | None | | 8.9 | | 0.18 | 92.4 |
| R-21 | | 91 or more | Aluminum oxide, silica | 21 to 23 | | 7.0 to 9.0 | | |
| R-62N | | 89 or more | Aluminum oxide, silica | 19 to 21 | | 6.0 to 8.0 | | |
| R-45M | | 89 or more | Aluminum oxide, silica | 22 to 24 | | 7.0 to 9.0 | | | viewpoints of whiteness, transmittance, lithography characteristics, and light fastness, the proportion is preferably 99% by mass or less, and more preferably 95% by mass or less.

Moreover, the proportion of the white pigment in the specific particles is preferably 50% by mass or more, and more preferably 80% by mass or more. The upper limit can be set to 100% by mass or 99% by mass or less. From the viewpoints of whiteness, transmittance, lithography characteristics, and light fastness, the proportion is preferably 99% by mass or less, and more preferably 95% by mass or less.

Incidentally, the proportion of titanium oxide in the specific particles is preferably 50% by mass or more, and more preferably 80% by mass or more. The upper limit can be set to 100% by mass or 99% by mass or less. From the viewpoints of whiteness, transmittance, lithography characteristics, and light fastness, the proportion is preferably 99% by mass or less, and more preferably 95% by mass or less.

In addition, the proportion of the particles having a density of 1.0 to 6.0 g/cm$^3$ in the specific particles is preferably 50% by mass or more, and more preferably 80% by mass or more. The upper limit can be set to 100% by mass or 99% by mass or less. From the viewpoints of whiteness, transmittance, lithography characteristics, and light fastness, the proportion is preferably 99% by mass or less, and more preferably 95% by mass or less.

<<Other Coloring Agents>>

The composition may contain other coloring agents, in addition to the specific particles. By incorporation of such other coloring agents, a* and b* in an L*a*b* color space of CIE 1976 are easily controlled to preferred ranges in a case of forming a film with a thickness of 3 μm using the composition. Examples of such other coloring agents include a chromatic coloring agent and a black coloring agent.

(Chromatic Coloring Agent)

The composition of the present invention can contain a chromatic coloring agent. In the present invention, the chromatic coloring agent means a coloring agent other than a white coloring agent (including a white pigment) and a black coloring agent. The chromatic coloring agent is preferably a coloring agent having a maximum collection wavelength in a range of 400 nm or more and less than 650 nm.

The chromatic coloring agent may be either a chromatic pigment or a dye.

The chromatic pigment is preferably an organic pigment. The organic pigment is not particularly limited, and known chromatic pigments can be used. Examples of the organic pigment include the following pigments, but the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (all red pigments), C. I. Pigment Green 7, 10, 36, 37, 58, 59, and the like (all green pigments), C. I. Pigment Violet 1, 19, 23, 27, 32, 37, 42, and the like (all violet pigments), C. I. Pigment Blue 1, 2, 15, 15:1, 15:2, 15:3, 15:4, 15:6, 16, 22, 60, 64, 66, 79, 80, and the like (all blue pigments)

These organic pigments can be used singly or in combination of two or more kinds thereof.

The dye is not particularly limited, and known dyes can be used. In terms of the chemical structure, it is possible to use a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyromethane-based dye, or the like. Incidentally, multimers of these dyes may be used. Further, the dyes described in JP2015-028144A and JP2015-34966A can also be used.

In addition, an acidic dye and a derivative thereof can be suitably used as the dye. In addition, a direct dye, a basic dye, a mordant dye, an acidic mordant dye, an azoic dye, a dispersed dye, an oil-soluble dye, a food dye, and derivatives thereof can also be usefully employed. Specific examples of the acidic dye are shown below, but the present invention is not limited thereto. For example, the following dyes and derivatives of these dyes are included.

Acid Alizarin violet N,

Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, 324:1, Acid Chrome violet K, Acid Fuchsin; acid green 1, 3, 5, 9, 16, 25, 27, 50, Acid Orange 6, 7, 8, 10, 12, 50, 51, 52, 56, 63, 74, 95, Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, 274, Acid Violet 6 B, 7, 9, 17, 19, Acid Yellow 1, 3, 7, 9, 11, 17, 23, 25, 29, 34, 36, 42, 54, 72, 73, 76, 79, 98, 99, 111, 112, 114, 116, 184, 243, Food Yellow 3.

In addition to the above-described examples, an azo-based acidic dye, a xanthene-based acidic dye, and a phthalocyanine-based acidic dye are also preferable, and acidic dyes such as C. I. Solvent Blue 44 and 38; C. I. Solvent Orange 45; and Rhodamine B and Rhodamine 110, and derivatives of these dyes are also preferably used.

In a case where the composition of the present invention contains a chromatic coloring agent, the content of the chromatic coloring agent is preferably 0.1% to 70% by mass in the total solid content of the composition of the present invention. The lower limit is more preferably 0.5% by mass or more, and particularly preferably 1.0% by mass or more. The upper limit is more preferably 60% by mass or less, and particularly preferably 50% by mass or less. In a case where the composition of the present invention includes two or more kinds of chromatic coloring agents, a total amount thereof is preferably within the range.

(Black Coloring Agent)

The composition of the present invention can contain a black coloring agent. The black coloring agent may be either an inorganic black coloring agent or an organic black coloring agent.

Examples of the organic black coloring agent include a bisbenzofuranone compound, an azomethine compound, a perylene compound, and an azo-based compound, and the bisbenzofuranone compound and the perylene compound are preferable. Examples of the bisbenzofuranone compound include those described in JP2010-534726A, JP2012-515233A, and JP2012-515234A, and are available as, for example, "Irgaphor Black" manufactured by BASF Corporation. Examples of the perylene compound include C. I. Pigment Black 31 and 32. Examples of the azomethine compound include those described in JP1989-170601A (JP-H01-170601A), JP1990-34664A (JP-H02-34664A), and the like, and are available as, for example, "CHROMOFINE BLACK A1103" manufactured by Dainichiseika Color & Chemicals Mfg. Co., Ltd.

The inorganic black coloring agent is not particularly limited and known inorganic black coloring agents can be used. Examples thereof include carbon black, titanium black, and graphite, and the inorganic black coloring agent is preferably carbon black or titanium black, and more preferably titanium black. The titanium black is a black particle containing a titanium atom, and preferably lower titanium oxide, titanium oxynitride, or the like. The titanium black can have a surface modified, as desired, for the purpose of improvement of dispersibility, suppression of aggregating properties, and the like. It is possible to coat a surface of the titanium black with silicon oxide, titanium oxide, germanium oxide, aluminum oxide, magnesium oxide, or zirconium oxide. In addition, it is also possible to perform a treatment using a water-repellant as shown in JP2007-302836A. Specific examples of the black pigment include C. I. Pigment Black 1 and 7, and a titanium black pigment.

It is preferable that in titanium black, the primary particle diameters of the respective particles and the average primary particle diameter thereof are both small. Specifically, the average primary particle diameter is preferably in a range of 10 nm to 45 nm.

The specific surface area of titanium black is not particularly limited, but a value thereof as measured by a Brunauer, Emmet and Teller's (BET) method is preferably from 5 $m^2/g$ to 150 $m^2/g$, and more preferably from 20 $m^2/g$ to 120 $m^2/g$. Examples of commercially available product of titanium black include titanium black 10S, 12S, 13R, 13M, 13M-C, 13R, 13R-N, and 13M-T (trade names, manufactured by Mitsubishi Materials Corporation), and Tilack D (trade name: manufactured by Akokasei Co., Ltd.).

The titanium black can also be used as a dispersion. Examples thereof include a dispersion that includes titanium black particles and silica particles, and the content ratio of Si atoms to Ti atoms in the dispersion is adjusted to a range of 0.20 to 0.50. With regard to the dispersion, reference can be made to the description in paragraphs 0020 to 0105 of JP2012-169556A, the contents of which are incorporated herein by reference.

<<Resin>>

The composition of the present invention includes a resin. The resin is blended in, for example, an application for dispersing particles such as a pigment in the composition or an application as a binder. Incidentally, a resin which is used mainly for dispersing particles in a composition is also referred to as a dispersant. However, such uses of the resin are only exemplary, and the resin can also be used for other purposes, in addition to such uses.

The weight-average molecular weight (Mw) of the resin is preferably 1,000 to 200,000, and more preferably 2,000 to 100,000. The weight-average molecular weight (Mw) within the ranges is preferable from the viewpoints of compatibility and whitening.

The content of the resin is preferably 5% to 90% by mass, and more preferably 10% to 60% by mass, with respect to the total solid content of the composition. The content within these ranges is preferable from the viewpoints of a pattern shape, heat resistance, and L*. One kind or two or more kinds of the resins may be included. In a case where two or more kinds of the resins are used, the total amount thereof preferably falls within the range.

(Binder)

The composition of the present invention preferably contains a binder as the resin. By incorporation of the binder, the film characteristics are improved. As the binder, any of known binders can be used. Preferably a resin which is soluble or swellable in water or weakly alkaline water is chosen so as to allow water development or weakly alkaline water development. For example, alkali development can be performed using an alkali-soluble resin. Examples of such the resin include a radical polymer having a carboxyl group in the side chain, for example, the polymers described in JP1984-44615A (JP-S59-44615A), JP1979-34327B (JP-S54-34327B), JP1983-12577A (JP-S58-12577A), and JP1979-25957B (JP-S54-25957B), JP1979-92723A (JP-S54-92723A), JP1984-53836A (JP-S59-53836A), and JP1984-71048A (JP-S59-71048A), that is, a resin obtained by homopolymerizing or copolymerizing a monomer having a carboxyl group; a resin obtained by homopolymerizing or copolymerizing a monomer having an acid anhydride, and subjecting the acid anhydride unit to hydrolysis, semi-esterification or semi-amidation; and an epoxy acrylate obtained by modifying an epoxy resin with an unsaturated monocarboxylic acid and an acid anhydride. Examples of the monomers having a carboxyl group include acrylic acid, methacrylic acid, itaconic acid, crotonic acid, maleic acid, fumaric acid, and 4-carboxylstyrene, and examples of the monomers having an acid anhydride include maleic anhydride. Further, other examples thereof include an acidic cellulose derivative having a carboxyl group in a side chain, and in addition, a polymer having a hydroxyl group with a cyclic acid anhydride, and the like. The binder is preferably a resin which is soluble in an alkali developer. The composition of the present invention preferably includes an alkali-soluble resin. Further, a resin that is a thermosetting compound, such as an epoxy resin and a melamine resin, can also be used as the binder.

The alkali-soluble resin can be appropriately selected from polymers having at least one group enhancing alkali solubility.

The number-average molecular weight (Mn) of the alkali-soluble resin is preferably 1,000 to 20,000.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and most preferably 120 mgKOH/g or less.

As the alkali-soluble resin, a polyhydroxystyrene-based resin, a polysiloxane-based resin, an acrylic resin, an acrylamide-based resin, or an acryl/acrylamide copolymer resin is preferable from the viewpoint of heat resistance, and an acrylic resin, an acrylamide-based resin, or an acryl/acrylamide copolymer resin is preferable from the viewpoint of controlling developability. Examples of the group enhancing alkali solubility (hereinafter also referred to as an acid group) include a carboxyl group, a phosphoric acid group, a sulfo group, and a phenolic hydroxyl group, with the carboxyl group being preferable. The acid group may be used singly or in combination of two or more kinds thereof.

The alkali-soluble resin can be synthesized by, for example, a known radical polymerization method. Polymerization conditions such as a temperature, a pressure, the type and amount of a radical initiator, and the type of a solvent, and the like in the production of the alkali-soluble resin by a radical polymerization method can be easily set by those skilled in the art, and the conditions can also be determined experimentally.

The alkali-soluble resin is preferably a polymer having a carboxyl group in a side chain thereof, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin such as a novolac type resin, or the like; an acidic cellulose derivative having a carboxyl group in a side chain thereof and a product obtained by adding an acid anhydride to a polymer having a hydroxyl group. In particular, a copolymer of a (meth) acrylic acid and another monomer which is copolymerizable therewith is preferable as the alkali-soluble resin. Examples of such other monomer which is copolymerizable with the (meth)acrylic acid include the monomers described in paragraphs 0017 to 0019 of JP2015-34961A, for example, alkyl (meth)acrylate, aryl (meth)acrylate, and a vinyl compound.

Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, cyclohexyl (meth)acrylate, glycidyl methacrylate, and tetrahydrofurfuryl methacrylate; examples of the vinyl compound include styrene, α-methylstyrene, vinyltoluene, acrylonitrile, vinyl acetate, N-vinylpyrrolidone, a polystyrene macromonomer, and a polymethyl methacrylate macromonomer; and examples of the N-position-substituted maleimide monomer disclosed in JP1998-300922A (JP-H10-300922A) include N-phenylmaleimide and N-cyclohexylmaleimide. Further, such the other monomer which is copolymerizable with a (meth)acrylic acid may be used singly or in combination of two or more kinds thereof.

As the alkali-soluble resin, a benzyl (meth)acrylate/ (meth)acrylic acid copolymer, benzyl (meth)acrylate/(meth) acrylic acid/2-hydroxyethyl (meth)acrylate copolymer, or a multicomponent copolymer including benzyl (meth)acrylate/(meth)acrylic acid/other monomers can also be preferably used. Further, copolymers obtained by copolymerizing 2-hydroxyethyl (meth)acrylate, a 2-hydroxypropyl (meth) acrylate/polystyrene macromonomer/benzyl methacrylate/ methacrylic acid copolymer described in JP1995-140654A (JP-H07-140654A), a 2-hydroxy-3-phenoxypropylacrylate/ polymethyl methacrylate macromonomer/benzyl methacrylate/methacrylic acid copolymer, a 2-hydroxyethyl methacrylate/polystyrene macromonomer/methyl methacrylate/ methacrylic acid copolymer, a 2-hydroxyethyl methacrylate/ polystyrene macromonomer/benzyl methacrylate/ methacrylic acid copolymer, and the like can also be preferably used. In addition, as a commercially available product thereof, for example, FF-426 (manufactured by Fujikura Kasei Co., Ltd.) or the like can also be used.

Moreover, an alkali-soluble resin having a polymerizable group may be used as the alkali-soluble resin. According to this aspect, the solvent resistance of a film thus obtained tends to be improved. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), Photomer 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), Ebecryl 3800 (manufactured by Daicel-UCB Co., Ltd.), and ACRYCURE RD-F8 (manufactured by Nippon Shokubai Co., Ltd.).

It is also preferable that the alkali-soluble resin includes a polymer obtained by polymerizing monomer components including at least one of a compound represented by Formula (ED1) and a compound represented by Formula (ED2) (these compounds are hereinafter also referred to as an "ether dimer" in some cases). With regard to the polymer obtained by polymerizing monomer components including an ether dimer, reference can be made to paragraphs 0022 to 0031 of JP2015-34961A, the contents of which are incorporated herein by reference.

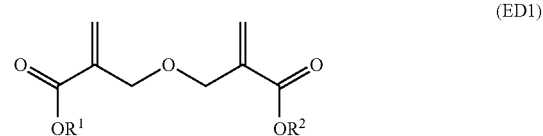

(ED1)

In Formula (ED1), $R^1$ and $R^2$ each independently represent a hydrogen atom, or a hydrocarbon group having 1 to 25 carbon atoms, which may have a substituent.

(ED2)

In Formula (ED2), R represents a hydrogen atom or an organic group having 1 to 30 carbon atoms. With regard to the specific examples of Formula (ED2), reference can be made to the descriptions in JP2010-168539A.

With regard to the specific examples of the ether dimer, reference can be made to paragraph 0317 of JP2013-29760A, the contents of which are incorporated herein by reference. The ether dimers may be used singly or in combination of two or more kinds thereof.

The alkali-soluble resin may include a structural unit derived from a compound represented by Formula (X).

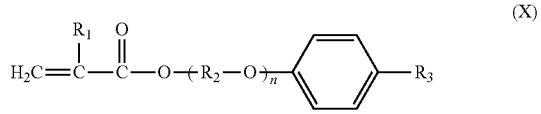

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

In Formula (X), the number of carbon atoms of the alkylene group of $R_2$ is preferably 2 or 3. Further, the number of carbon atoms of the alkyl group of $R_3$ is 1 to 20, and more preferably 1 to 10, and the alkyl group of $R_3$ may contain a benzene ring. Examples of the alkyl group containing a benzene ring, represented by $R_3$, include a benzyl group and a 2-phenyl(iso)propyl group.

Specific examples of the alkali-soluble resin include the following resins, and also include the resins described in paragraph 0037 of JP2015-34961A. Among these resins, an alkali-soluble resin having a polymerizable group, such as C-2, is preferable from the viewpoint of solvent resistance.

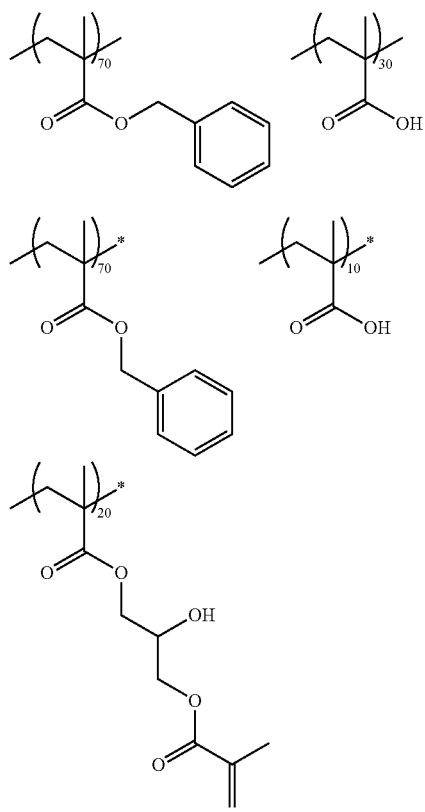

With regard to the alkali-soluble resin, reference can be made to the descriptions in paragraphs 0558 to 0571 of JP2012-208494A (<0685> to <0700> of the corresponding US2012/0235099A), the contents of which are incorporated herein by reference. Moreover, it is possible to use the copolymers (B) described in paragraph Nos. 0029 to 0063 of JP2012-32767A and the alkali-soluble resins used in Examples of the document; the binder resins described in paragraph Nos. 0088 to 0098 of JP2012-208474A and the binder resins used in Examples of the document; the binder resins described in paragraph Nos. 0022 to 0032 of JP2012-137531A and the binder resins in Examples of the document; the binder resins described in paragraph Nos. 0132 to 0143 of JP2013-024934A and the binder resins used in Examples of the document; the binder resins described in paragraph Nos. 0092 to 0098 of JP2011-242752A and used in Examples; or the binder resins described in paragraph Nos. 0030 to 0072 of JP2012-032770A, the contents of which are incorporated herein by reference.

As the binder, a resin having a refractive index to light at a wavelength of 589 nm of 1.5 or less may be used.

Examples of the resin having a refractive index to light at a wavelength of 589 nm of 1.5 or less include a fluorine-based resin and a polysiloxane-based resin which is the above-mentioned alkali-soluble resin. In the present invention, the resin is preferably the polysiloxane-based resin, more preferably the polysiloxane-based resin having a refractive index to light at a wavelength of 589 nm of 1.5 or less, and particularly preferably the polysiloxane-based resin which is an alkali-soluble resin having a refractive index to light at a wavelength of 589 nm of 1.5 or less.

The refractive index of the resin can be measured in an uncured state by the following method.

A specific measurement method is as follows: a film formed of only a resin to be measured on a Si wafer to 300 nm, and then the refractive index of the obtained film is measured using an ellipsometry (Lambda Ace RE-3300 (trade name), Dainippon Screen Mfg. Co., Ltd.).

—Fluorine-Based Resin—

The fluorine-based resin is not particularly limited as long as the resin includes a fluorine atom. For example, a polymer compound having (a) a repeating unit derived from a monomer represented by General Formula (F1) is also preferably used as the fluorine-based resin.

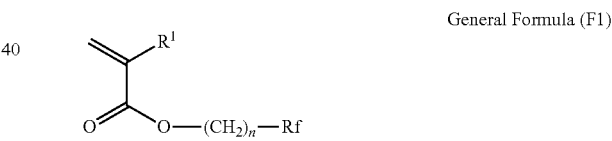

General Formula (F1)

In General Formula (F1), Rf is a substituent containing a fluoroalkyl group or a perfluoroalkyl group, n represents 1 or 2, and $R^1$ represents hydrogen or a methyl group.

Rf is preferably a substituent containing a fluoroalkyl group or a perfluoroalkyl group having 9 or more fluorine atoms. Specific examples of the substituent containing a fluoroalkyl group or a perfluoroalkyl group having 9 or more fluorine atoms include fluoroalkyl (meth)acrylates as follows.

$$CH_2=CRCO_2(CH_2)_mC_nF_{2n+1}$$

(m represents 1 or 2, n represents an integer of 4 to 12. Further, R represents an alkyl group having 1 to 4 carbon atoms.)

$$CH_2=CRCO_2(CH_2)_m(CF_2)_nH$$

(m represents 1 or 2, n represents an integer of 4 to 12. Further, R represents an alkyl group having 1 to 4 carbon atoms.)

In particular, the number of fluorine atom per substituent containing a fluoroalkyl group or a perfluoroalkyl group is preferably 9 to 30, and more preferably 13 to 25.

Furthermore, a polymer compound having a repeating unit derived from a fluorine atom-containing unsaturated monomer is also preferably used as the fluorine-based resin. Examples of the fluorine atom-containing unsaturated monomer include a radically polymerizable monomer having a polyfluoroalkyl group or a polyfluoroether group, and as the perfluoroalkyl group, a perfluoromethyl group, a perfluoroethyl group, a perfluoropropyl group, a perfluorobutyl group, a perfluorohexyl group, a perfluorooctyl group, a perfluorodecyl group, a perfluorododecyl group, or a perfluorotetradecyl group is suitable.

As such the fluorine atom-containing unsaturated monomers, $CH_2=C(CH_3)COOCH_2(CF_2)_4CF_3$, $CH_2=C(CH_3)COOCH_2CH_2(CF_2)_6CF_3$, $CH_2=CHCOO(CF_2)_6CF_3$, $CH_2=CHCOOCH_2CH_2(CF_2)_7CF_3$, $CH_2=CHCOOCH_2CH_2(CF_2)_5CF(CF_3)_2$, $CH_2=C(CH_3)COOCH(OCOCH_3)CH_2(CF_2)_6CF(CF_3)_2$, $CH_2=CHCOOCH_2CH(OH)CH_2(CF_2)_6CF(CF_3)_2$, $CH_2=CHCOOCH_2CH_2(CF_2)_8CF_3$, $CH_2=C(CH_3)COOCH_2CH_2NHCO(CF_2)_8CF_3$, $CH_2=CHOCONH-CO(CF_2)_7CF(CF_2Cl)CF_3$, $CH_2=CHCOOCH_2CH_2N(C_3H_7)SO_2(CF_2)_7CF_3$, $CH_2=CHCOOCH_2CH_2CH_2CH_2(CF_2)_7CF_3$, $CH_2=C(CH_3)COOCH_2CH_2N(C_2H_5)SO_2(CF_2)_7CF_3$, $CH_2=CHCOOCH_2CH_2NHCO(CF_2)_7CF_3$, $CH_2=CHCOO(CH_2)_3(CF_2)_6CF(CF_3)_2$, $CH_2=CHCOOCH_2(CF_2)_{10}H$, $CH_2=C(CH_3)COOCH_2(CF_2)_{10}CF_2Cl$, $CH_2=CHCON\text{-}HCH_2CH_2OCOCF(CF_3)OC_3F_7$, or $CH_2=CHCONHCH_2CH_2OCOCF(CF_3)(OC_3F_6)_2OC_3F_7$ is suitable.

The fluorine atom-containing unsaturated monomers may be used singly or in combination of two or more kinds thereof. As the fluorine atom-containing unsaturated monomer, commercially available products thereof can also be used. Examples thereof include trade names LIGHT ESTER FM-108, LIGHT ESTER M-3F, and LIGHT ESTER M-4F, manufactured by Kyoeisha Chemical Co., Ltd.; and trade names CHEMINOX FAAC, CHEMINOX FAMAC, CHEMINOX FAAC-M, CHEMINOX FAMAC-M, CHEMINOX PFAE, and CHEMINOX PFOE, manufactured by Nihon Mectron Co., Ltd.

Moreover, a polymer compound having a repeating unit having at least one of (a) a repeating unit derived from a monomer represented by General Formula (F1) or a repeating unit derived from a fluorine atom-containing unsaturated monomer, and an alkali solubility-accelerating group can also be used as the fluorine-based resin. A preferred range of the alkali solubility-accelerating group is the same as the preferred range of the alkali solubility-accelerating group contained in the alkali-soluble resin which will be described later.

With regard to examples of the fluorine-based resins, reference can also be made to the fluorine-based surfactants described in the right column at page 9 of JP1990-804A (JP-H02-804A), the contents of which are incorporated herein by reference.

Preferred Specific examples of the fluorine-based resin are described below.

Fluorine-based resin 1: Mw = 10,000

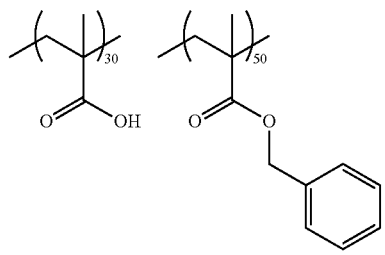

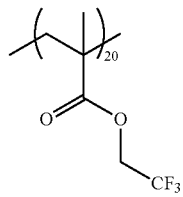

Fluorine-based resin 2: Mw = 9,000

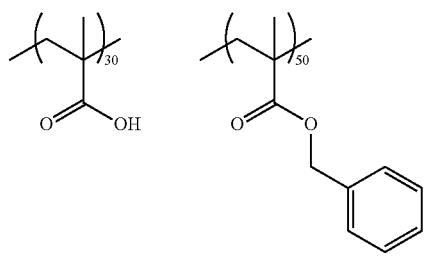

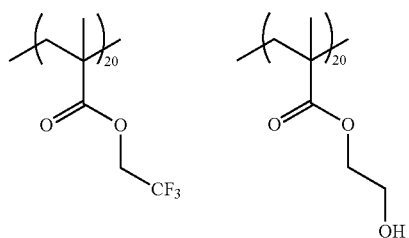

Fluorine-based resin 3: Mw = 12,000

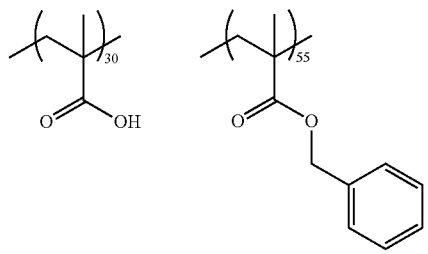

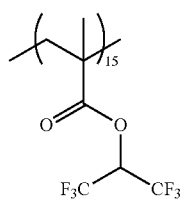

-continued

Fluorine-based resin 4: Mw = 11,000

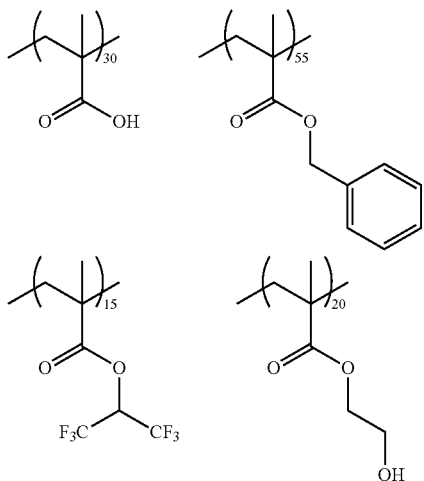

Fluorine-based resin 5: Mw = 10,000

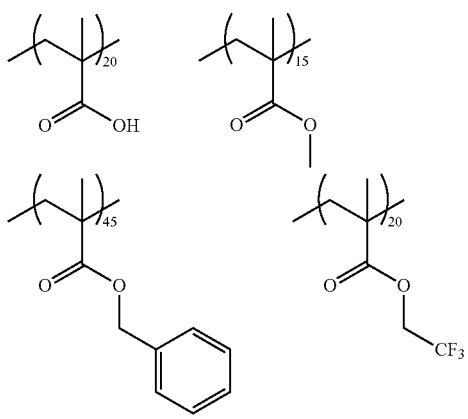

Fluorine-based resin 6: Mw = 13,000

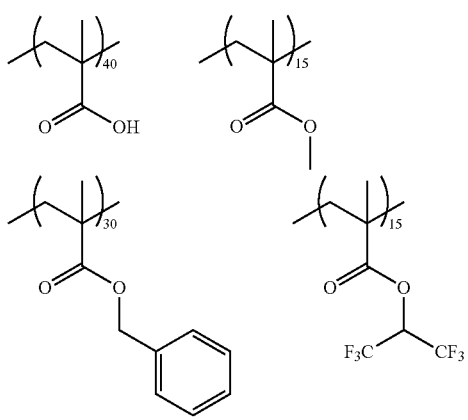

—Polysiloxane-Based Resin—

The polysiloxane-based resin is not particularly limited. For example, as the polysiloxane-based resin, a polysiloxane-based resin obtained by condensation by monohydrolysis from a compound represented by General Formula (1), or a polysiloxane-based resin obtained by condensation by cohydrolysis of the compound represented by General Formula (1) and another silane compound. With regard to the polysiloxane-based resin, reference can be made to the descriptions in <0014> to <0035> of JP2014-66988A, the contents of which are incorporated herein by reference.

It is preferable to use a polysiloxane-based resin obtained by condensation by cohydrolysis of an alkoxysilane compound further including a compound represented by General Formula (2), in addition to the compound represented by General Formula (1), from the viewpoint of enhancing the solvent resistance.

It is preferable to use a polysiloxane-based resin obtained by condensation by cohydrolysis of an alkoxysilane compound including the compound represented by General Formula (1) and further including a compound represented by General Formula (3) from the viewpoint of enhancing an acid value of the polysiloxane-based resin and improving the pattern shape. Further, a polysiloxane-based resin obtained by condensation by cohydrolysis of an alkoxysilane compound including the compound represented by General Formula (3) can also be used as the alkali-soluble resin.

$$R^1_2Si(OR^2)_2 \qquad \text{General Formula (1)}$$

In General Formula (1), $R^1$'s each independently an alkyl group or a phenyl group, and $R^2$'s each independently represent a hydrogen atom or an alkyl group.

In General Formula (1), $R^1$ and $R^2$ are each preferably an alkyl group having 1 to 6 carbon atoms, more preferably an alkyl group having 1 to 4 carbon atoms, particularly preferably an alkyl group having 1 to 3 carbon atoms, more particularly preferably an alkyl group having 1 or 2 carbon atoms, and most preferably a methyl group. Specific examples thereof include a methyl group, an ethyl group, an n-propyl group, an isopropyl group, an n-butyl group, a sec-butyl group, a tert-butyl group, a pentyl group, a hexyl group, and a cyclohexyl group, and among those, the methyl group or the ethyl group is particularly preferable. Further, in a case where a plurality of $R^1$'s are present in the same molecule, they may be the same as or different from each other, which is the same as for $R^2$ in General Formula (1). The alkyl group in $R^1$ and $R^2$ in General Formula (1) may be linear, branched, or cyclic, and is preferably linear.

General Formula (2)

$$H_2C=C\begin{matrix}R_3\\ \\C\\ \parallel\\O\end{matrix}O-R^4-Si(OR^5)_n\\R^6_{(3-n)}$$

In General Formula (2), $R^3$ represents a methyl group or a hydrogen atom, $R^4$ represents an alkylene group having 1 to 4 carbon atoms, $R^5$'s each independently represent a hydrogen atom or an alkyl group having 1 to 4 carbon atoms, $R^6$'s each independently an alkyl group having 1 to 6 carbon atoms, and n represents an integer of 1 to 3.

$R^4$ in General Formula (2) is preferably an alkylene group having 1 to 3 carbon atoms, and more preferably an alkylene group having 3 carbon atoms.

Preferred ranges of $R^6$ and $R^5$ in General Formula (2) are the same as the preferred ranges of $R^1$ and $R^2$ in General Formula (1).

n in General Formula (2) is preferably 2 or 3, and more preferably 3.

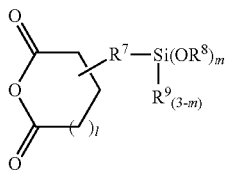

General Formula (3)

In General Formula (3), l represents an integer of 0 to 2, m represents an integer of 0 to 2, $R^7$ represents an alkylene group having 1 to 4 carbon atoms, $R^8$'s each independently represent a hydrogen atom or an alkyl group having 1 to 4 carbon atoms, and $R^9$'s each independently represent an alkyl group having 1 to 6 carbon atoms.

l in General Formula (3) is more preferably 1.

m in General Formula (3) is preferably 2 or 3, and more preferably 3.

$R^7$ in General Formula (3) is preferably an alkylene group having 1 to 3 carbon atoms, and more preferably an alkylene group having 3 carbon atoms.

Preferred ranges of $R^9$ and $R^8$ in General Formula (3) are the same as the preferred ranges of $R^1$ and $R^2$ in General Formula (1).

Examples of the compound represented by General Formula (1) include dimethoxydimethylsilane, diethoxydimethylsilane, dimethoxydiphenylsilane, diethoxydiphenylsilane, dihydroxydiphenylsilane, dimethoxy(methyl)(phenyl)silane, diethoxy(methyl)(phenyl)silane, dimethoxy(methyl)(phenethyl)silane, dicyclopentyldimethoxysilane or cyclohexyldimethoxy(methyl)silane, methyltrimethoxysilane, ethyltrimethoxysilane, phenyltrimethoxysilane, methyltriethoxysilane, ethyltriethoxysilane, and phenyltriethoxysilane.

As the compound represented by General Formula (1), dimethoxydimethylsilane, dimethoxydiphenylsilane, or phenyltrimethoxysilane is preferable, and dimethoxydimethylsilane is more preferable.

The proportion of the compound represented by General Formula (1) in the alkoxysilane compound to be subjected to condensation by cohydrolysis is preferably 25% to 75% by mole, more preferably 35% to 75% by mole, and particularly preferably 50% to 70% by mole. Further, the proportion of dimethoxydiphenylsilane, diethoxydiphenylsilane, and dihydroxydiphenylsilane in the alkoxysilane compound to be subjected to condensation by cohydrolysis is preferably 0% to 50% by mole, more preferably 0% to 45% by mole, particularly preferably 0% to 30% by mole, and more particularly preferably 0% to 10% by mole.

Examples of the compound represented by General Formula (2) include 3-methacryloxypropyltrimethoxysilane, 3-methacryloxypropyltriethoxysilane, 3-acryloxypropyltrimethoxysilane, 3-methacryloxypropylmethyldimethoxysilane, 3-methacryloxypropylmethyldiethoxysilane, 3-acryloxypropylmethyldimethoxysilane, 3-acryloxypropyltriethoxysilane, and 3-acryloxypropylmethyldiethoxysilane.

The compound represented by General Formula (2) is preferably 3-methacryloxypropyltrimethoxysilane.

The proportion of the compound represented by General Formula (2) in the alkoxysilane compound to be subjected to condensation by cohydrolysis is preferably 10% to 45% by mole, more preferably 10% to 30% by mole, and particularly preferably 15% to 20% by mole. By using the compound represented by General Formula (2) as the alkoxysilane compound to be subjected to condensation by cohydrolysis, solvent resistance can be enhanced.

Examples of the compound represented by General Formula (3) include 3-trimethoxysilylpropyl succinic anhydride, 3-triethoxysilylpropyl succinic anhydride, 3-trimethoxysilylethyl succinic anhydride, 3-trimethoxysilylbutyl succinic anhydride, 3-diethoxymethylsilylpropyl succinic anhydride, 3-dimethoxymethylsilylethyl succinic anhydride, and 3-dimethoxymethylsilylbutyl succinic anhydride.

The compound represented by General Formula (3) is preferably 3-trimethoxysilylpropyl succinic anhydride.

The proportion of the compound represented by General Formula (3) in the alkoxysilane compound to be subjected to condensation by cohydrolysis is preferably 1% to 30% by mole, and more preferably 1% to 25% by mole from the viewpoint of increasing the acid value of the polysiloxane-based resin to improve the pattern shape, and the proportion is particularly preferably 1% to 20% by mole from the viewpoint of suppressing the concentration unevenness after passage of one month.

The alkoxysilane compound to be subjected to condensation by cohydrolysis preferably further includes a compound represented by General Formula (5).

$$R^{12}Si(OR^{13})_3 \qquad \text{General Formula (5)}$$

In General Formula (5), $R^{12}$ represents a monovalent organic group having an epoxy group, and $R^{13}$'s each independently represent an alkyl group.

The monovalent organic group having an epoxy group represented by $R^{12}$ in General Formula (5) preferably has 1 to 5 epoxy groups, more preferably has 1 or 2 epoxy groups, and particularly preferably has one epoxy group. The monovalent organic group having an epoxy group represented by $R^{12}$ in General Formula (5) is preferably the group in which an epoxy group is bonded to a terminal through a linking group, more preferably the group in which an epoxy group is bonded to a terminal through at least one of an alkylene group (preferably having 1 to 10 carbon atoms, more preferably having 1 to 6 carbon atoms, and particularly preferably having 1 to 3 carbon atoms) or an oxygen atom.

A preferred range of $R^{13}$ in General Formula (5) is the same as the preferred range of $R^2$ in General Formula (1).

Examples of the compound represented by General Formula (5) include 3-glycidyloxypropyltrimethoxysilane, 3-glycidyloxypropyltriethoxysilane, 3-(3,4-epoxycyclohexyl)propyltrimethoxysilane, and 3-(3,4-epoxycyclohexyl)propyltriethoxysilane.

The compound represented by General Formula (5) is preferably 3-glycidyloxypropyltrimethoxysilane or 3-(3,4-epoxycyclohexyl)propyltrimethoxysilane.

The proportion of the compound represented by General Formula (5) in the alkoxysilane compound to be subjected to condensation by cohydrolysis is preferably 10% by mole or less, more preferably 8% by mole or less, and particularly preferably 5% by mole or less.

The alkoxysilane compound to be subjected to condensation by cohydrolysis may include alkoxysilane compounds other than the compounds represented by General Formulae (1) to (3), and (5). Examples of such other alkoxysilane compounds other than the compounds represented by General Formulae (1) to (3), and (5) include phenethyltrimethoxysilane, naphthyltrimethoxysilane, phenethyltriethoxysilane, naphthyltriethoxysilane, tetramethoxysilane, and tetraethoxysilane.

The proportion of such other alkoxysilane compounds in the alkoxysilane compound to be subjected to condensation by cohydrolysis is preferably 3% by mole or less, more preferably 2% by mole or less, and particularly preferably 1% by mole or less, from the viewpoints of suppressing the concentration unevenness after passage of one month and improving solvent resistance.

In the present invention, 20% by mole or more (preferably 40% by mole or more, more preferably 50% by mole or more, and particularly preferably 60% by mole or more) of the side chains of the polysiloxane-based resin preferably are at least one of an alkyl group having 1 to 4 carbon atoms or an alkoxy group having 1 to 4 carbon atoms, from the viewpoint of each control of the refractive index to light at a wavelength of 589 nm to 1.5 or less, more preferably at least one of an alkyl group having 1 to 3 carbon atoms or an alkoxy group having 1 to 3 carbon atoms, particularly preferably at least one of an alkyl group having 1 or 2 carbon atoms or an alkoxy group having 1 or 2 carbon atoms, and more particularly preferably an alkyl group having 1 or 2 carbon atoms.

The proportion of the side chains including a phenyl group in the side chains of the polysiloxane-based resin is preferably 20% by mole or less from the viewpoint of lowering the refractive index of the polysiloxane-based resin, more preferably 10% by mole or less, and particularly preferably 5% by mole or less.

The polysiloxane-based resin is obtained by subjecting an alkoxysilane compound to condensation by cohydrolysis, that is, to hydrolysis and partial condensation. For the condensation by cohydrolysis, a general method can be used. For example, a method in which an organic solvent, water, and if desired, a catalyst are added to a mixture, and the mixture is heated and stirred at 50° C. to 150° C. for approximately 0.5 to 100 hours can be used. Further, during the heating and stirring, removal of hydrolysis by-products (alcohols such as methanol) and condensation by-products (water) by distillation may also be carried out.

Preferred examples of the polysiloxane-based resin include a polysiloxane-based resin obtained by condensation of monomers that are the alkoxysilane compounds described in the following tables by cohydrolysis. Further, specific examples of the polysiloxane-based resin are obtained by condensation of, for example, a monomer 1, a monomer 2, a monomer 3, a monomer 4, and a monomer 5 of the respective Specific Examples described in the following tables by cohydrolysis. The blanks in the tables indicate that monomers are not contained.

TABLE 3

|  | Monomer 1 | | Monomer 2 | |
| --- | --- | --- | --- | --- |
|  | Name | Molar ratio | Name | Molar ratio |
| Specific Example 1 | Dimethoxydimethylsilane | 0.67 | 3-Methacryloxypropyltrimethoxysilane | 0.18 |
| Specific Example 2 | Dimethoxydimethylsilane | 0.62 | 3-Methacryloxypropyltrimethoxysilane | 0.18 |
| Specific Example 3 | Dimethoxydimethylsilane | 0.62 | 3-Methacryloxypropyltrimethoxysilane | 0.18 |
| Specific Example 4 | Dimethoxydimethylsilane | 0.63 | 3-Methacryloxypropyltrimethoxysilane | 0.18 |
| Specific Example 5 | Dimethoxydimethylsilane | 0.58 | 3-Methacryloxypropyltrimethoxysilane | 0.18 |
| Specific Example 6 | Dimethoxydimethylsilane | 0.58 | 3-Methacryloxypropyltrimethoxysilane | 0.18 |
| Specific Example 7 | Dimethoxydimethylsilane | 0.63 | 3-Methacryloxypropyltrimethoxysilane | 0.18 |
| Specific Example 8 | Dimethoxydimethylsilane | 0.58 | 3-Methacryloxypropyltrimethoxysilane | 0.18 |
| Specific Example 9 | Dimethoxydimethylsilane | 0.58 | 3-Methacryloxypropyltrimethoxysilane | 0.18 |
| Specific Example 10 | Dimethoxydimethylsilane | 0.67 | 3-Methacryloxypropyltrimethoxysilane | 0.18 |
| Specific Example 11 | Dimethoxydimethylsilane | 0.62 | 3-Methacryloxypropyltrimethoxysilane | 0.18 |
| Specific Example 12 | Dimethoxydimethylsilane | 0.62 | 3-Methacryloxypropyltrimethoxysilane | 0.18 |
| Specific Example 13 | Dimethoxydimethylsilane | 0.58 | 3-Methacryloxypropyltrimethoxysilane | 0.18 |
| Specific Example 14 | Dimethoxydimethylsilane | 0.58 | 3-Methacryloxypropyltrimethoxysilane | 0.18 |
| Specific Example 15 | Dimethoxydimethylsilane | 0.58 | 3-Methacryloxypropyltrimethoxysilane | 0.18 |
| Specific Example 16 | Dimethoxydimethylsilane | 0.63 | 3-Methacryloxypropyltrimethoxysilane | 0.18 |
| Specific Example 17 | Dimethoxydimethylsilane | 0.58 | 3-Methacryloxypropyltrimethoxysilane | 0.18 |
| Specific Example 18 | Dimethoxydimethylsilane | 0.58 | 3-Methacryloxypropyltrimethoxysilane | 0.18 |
| Specific Example 19 | Dimethoxydimethylsilane | 0.63 | 3-Methacryloxypropyltrimethoxysilane | 0.18 |
| Specific Example 20 | Dimethoxydimethylsilane | 0.58 | 3-Methacryloxypropyltrimethoxysilane | 0.18 |
| Specific Example 21 | Dimethoxydimethylsilane | 0.53 | 3-Methacryloxypropyltrimethoxysilane | 0.18 |
| Specific Example 22 | Dimethoxydimethylsilane | 0.68 | 3-Methacryloxypropyltrimethoxysilane | 0.18 |
| Specific Example 23 | Dimethoxydimethylsilane | 0.58 | 3-Methacryloxypropyltrimethoxysilane | 0.18 |
| Specific Example 24 | Dimethoxydimethylsilane | 0.53 | 3-Methacryloxypropyltrimethoxysilane | 0.18 |
| Specific Example 25 | Dimethoxydimethylsilane | 0.48 | 3-Methacryloxypropyltrimethoxysilane | 0.18 |
| Specific Example 26 | Dimethoxydimethylsilane | 0.63 | 3-Methacryloxypropyltrimethoxysilane | 0.18 |
| Specific Example 27 | Dimethoxydimethylsilane | 0.67 | 3-Methacryloxypropyltriethoxysilane | 0.18 |
| Specific Example 28 | Dimethoxydimethylsilane | 0.62 | 3-Methacryloxypropyltriethoxysilane | 0.18 |
| Specific Example 29 | Dimethoxydimethylsilane | 0.62 | 3-Methacryloxypropyltriethoxysilane | 0.18 |
| Specific Example 30 | Dimethoxydimethylsilane | 0.63 | 3-Methacryloxypropyltriethoxysilane | 0.18 |
| Specific Example 31 | Dimethoxydimethylsilane | 0.58 | 3-Methacryloxypropyltriethoxysilane | 0.18 |
| Specific Example 32 | Dimethoxydimethylsilane | 0.58 | 3-Methacryloxypropyltriethoxysilane | 0.18 |
| Specific Example 33 | Dimethoxydimethylsilane | 0.63 | 3-Methacryloxypropyltriethoxysilane | 0.18 |
| Specific Example 34 | Dimethoxydimethylsilane | 0.58 | 3-Methacryloxypropyltriethoxysilane | 0.18 |
| Specific Example 35 | Dimethoxydimethylsilane | 0.58 | 3-Methacryloxypropyltriethoxysilane | 0.18 |
| Specific Example 36 | Dimethoxydimethylsilane | 0.67 | 3-Methacryloxypropyltriethoxysilane | 0.18 |
| Specific Example 37 | Dimethoxydimethylsilane | 0.62 | 3-Methacryloxypropyltriethoxysilane | 0.18 |
| Specific Example 38 | Dimethoxydimethylsilane | 0.62 | 3-Methacryloxypropyltriethoxysilane | 0.18 |
| Specific Example 39 | Dimethoxydimethylsilane | 0.63 | 3-Methacryloxypropyltriethoxysilane | 0.18 |
| Specific Example 40 | Dimethoxydimethylsilane | 0.58 | 3-Methacryloxypropyltriethoxysilane | 0.18 |
| Specific Example 41 | Dimethoxydimethylsilane | 0.58 | 3-Methacryloxypropyltriethoxysilane | 0.18 |
| Specific Example 42 | Dimethoxydimethylsilane | 0.63 | 3-Methacryloxypropyltriethoxysilane | 0.18 |
| Specific Example 43 | Dimethoxydimethylsilane | 0.58 | 3-Methacryloxypropyltriethoxysilane | 0.18 |
| Specific Example 44 | Dimethoxydimethylsilane | 0.58 | 3-Methacryloxypropyltriethoxysilane | 0.18 |
| Specific Example 45 | Dimethoxydimethylsilane | 0.63 | 3-Methacryloxypropyltriethoxysilane | 0.18 |

TABLE 3-continued

| | | | | |
|---|---|---|---|---|
| Specific Example 46 | Dimethoxydimethylsilane | 0.58 | 3-Methacryloxypropyltriethoxysilane | 0.18 |
| Specific Example 47 | Dimethoxydimethylsilane | 0.53 | 3-Methacryloxypropyltriethoxysilane | 0.18 |
| Specific Example 48 | Dimethoxydimethylsilane | 0.68 | 3-Methacryloxypropyltriethoxysilane | 0.18 |
| Specific Example 49 | Dimethoxydimethylsilane | 0.58 | 3-Methacryloxypropyltriethoxysilane | 0.18 |
| Specific Example 50 | Dimethoxydimethylsilane | 0.53 | 3-Methacryloxypropyltriethoxysilane | 0.18 |
| Specific Example 51 | Dimethoxydimethylsilane | 0.48 | 3-Methacryloxypropyltriethoxysilane | 0.18 |
| Specific Example 52 | Dimethoxydimethylsilane | 0.63 | 3-Methacryloxypropyltriethoxysilane | 0.18 |

| | Monomer 3 | | Monomer 4 | |
|---|---|---|---|---|
| | Name | Molar ratio | Name | Molar ratio |
| Specific Example 1 | 3-Trimethoxysilylpropyl succinic anhydride | 0.15 | | |
| Specific Example 2 | 3-Trimethoxysilylpropyl succinic anhydride | 0.15 | | |
| Specific Example 3 | 3-Trimethoxysilylpropyl succinic anhydride | 0.15 | | |
| Specific Example 4 | 3-Trimethoxysilylpropyl succinic anhydride | 0.15 | 3-Glycidyloxypropyltriethoxysilane | 0.04 |
| Specific Example 5 | 3-Trimethoxysilylpropyl succinic anhydride | 0.15 | 3-Glycidyloxypropyltriethoxysilane | 0.04 |
| Specific Example 6 | 3-Trimethoxysilylpropyl succinic anhydride | 0.15 | 3-Glycidyloxypropyltriethoxysilane | 0.04 |
| Specific Example 7 | 3-Trimethoxysilylpropyl succinic anhydride | 0.15 | 3-Glycidyloxypropyltrimethoxysilane | 0.04 |
| Specific Example 8 | 3-Trimethoxysilylpropyl succinic anhydride | 0.15 | 3-Glycidyloxypropyltrimethoxysilane | 0.04 |
| Specific Example 9 | 3-Trimethoxysilylpropyl succinic anhydride | 0.15 | 3-Glycidyloxypropyltrimethoxysilane | 0.04 |
| Specific Example 10 | 3-Triethoxysilylpropyl succinic anhydride | 0.15 | | |
| Specific Example 11 | 3-Triethoxysilylpropyl succinic anhydride | 0.15 | | |
| Specific Example 12 | 3-Triethoxysilylpropyl succinic anhydride | 0.15 | | |
| Specific Example 13 | 3-Triethoxysilylpropyl succinic anhydride | 0.15 | 3-Glycidyloxypropyltriethoxysilane | 0.04 |
| Specific Example 14 | 3-Triethoxysilylpropyl succinic anhydride | 0.15 | 3-Glycidyloxypropyltriethoxysilane | 0.04 |
| Specific Example 15 | 3-Triethoxysilylpropyl succinic anhydride | 0.15 | 3-Glycidyloxypropyltriethoxysilane | 0.04 |
| Specific Example 16 | 3-Triethoxysilylpropyl succinic anhydride | 0.15 | 3-Glycidyloxypropyltrimethoxysilane | 0.04 |
| Specific Example 17 | 3-Triethoxysilylpropyl succinic anhydride | 0.15 | 3-Glycidyloxypropyltrimethoxysilane | 0.04 |
| Specific Example 18 | 3-Triethoxysilylpropyl succinic anhydride | 0.15 | 3-Glycidyloxypropyltrimethoxysilane | 0.04 |
| Specific Example 19 | 3-Trimethoxysilylpropyl succinic anhydride | 0.15 | 3-Glycidyloxypropyltriethoxysilane | 0.04 |
| Specific Example 20 | 3-Trimethoxysilylpropyl succinic anhydride | 0.20 | 3-Glycidyloxypropyltriethoxysilane | 0.04 |
| Specific Example 21 | 3-Trimethoxysilylpropyl succinic anhydride | 0.25 | 3-Glycidyloxypropyltriethoxysilane | 0.04 |
| Specific Example 22 | 3-Trimethoxysilylpropyl succinic anhydride | 0.10 | 3-Glycidyloxypropyltriethoxysilane | 0.04 |
| Specific Example 23 | 3-Trimethoxysilylpropyl succinic anhydride | 0.15 | 3-Glycidyloxypropyltriethoxysilane | 0.04 |
| Specific Example 24 | 3-Trimethoxysilylpropyl succinic anhydride | 0.20 | 3-Glycidyloxypropyltriethoxysilane | 0.04 |
| Specific Example 25 | 3-Trimethoxysilylpropyl succinic anhydride | 0.25 | 3-Glycidyloxypropyltriethoxysilane | 0.04 |
| Specific Example 26 | 3-Trimethoxysilylpropyl succinic anhydride | 0.10 | 3-Glycidyloxypropyltriethoxysilane | 0.04 |
| Specific Example 27 | 3-Trimethoxysilylpropyl succinic anhydride | 0.15 | | |
| Specific Example 28 | 3-Trimethoxysilylpropyl succinic anhydride | 0.15 | | |
| Specific Example 29 | 3-Trimethoxysilylpropyl succinic anhydride | 0.15 | | |
| Specific Example 30 | 3-Trimethoxysilylpropyl succinic anhydride | 0.15 | 3-Glycidyloxypropyltriethoxysilane | 0.04 |
| Specific Example 31 | 3-Trimethoxysilylpropyl succinic anhydride | 0.15 | 3-Glycidyloxypropyltriethoxysilane | 0.04 |
| Specific Example 32 | 3-Trimethoxysilylpropyl succinic anhydride | 0.15 | 3-Glycidyloxypropyltriethoxysilane | 0.04 |
| Specific Example 33 | 3-Trimethoxysilylpropyl succinic anhydride | 0.15 | 3-Glycidyloxypropyltrimethoxysilane | 0.04 |
| Specific Example 34 | 3-Trimethoxysilylpropyl succinic anhydride | 0.15 | 3-Glycidyloxypropyltrimethoxysilane | 0.04 |
| Specific Example 35 | 3-Trimethoxysilylpropyl succinic anhydride | 0.15 | 3-Glycidyloxypropyltrimethoxysilane | 0.04 |
| Specific Example 36 | 3-Triethoxysilylpropyl succinic anhydride | 0.15 | | |
| Specific Example 37 | 3-Triethoxysilylpropyl succinic anhydride | 0.15 | | |
| Specific Example 38 | 3-Triethoxysilylpropyl succinic anhydride | 0.15 | | |
| Specific Example 39 | 3-Triethoxysilylpropyl succinic anhydride | 0.15 | 3-Glycidyloxypropyltriethoxysilane | 0.04 |
| Specific Example 40 | 3-Triethoxysilylpropyl succinic anhydride | 0.15 | 3-Glycidyloxypropyltriethoxysilane | 0.04 |
| Specific Example 41 | 3-Triethoxysilylpropyl succinic anhydride | 0.15 | 3-Glycidyloxypropyltriethoxysilane | 0.04 |
| Specific Example 42 | 3-Triethoxysilylpropyl succinic anhydride | 0.15 | 3-Glycidyloxypropyltrimethoxysilane | 0.04 |
| Specific Example 43 | 3-Triethoxysilylpropyl succinic anhydride | 0.15 | 3-Glycidyloxypropyltrimethoxysilane | 0.04 |
| Specific Example 44 | 3-Triethoxysilylpropyl succinic anhydride | 0.15 | 3-Glycidyloxypropyltrimethoxysilane | 0.04 |
| Specific Example 45 | 3-Trimethoxysilylpropyl succinic anhydride | 0.15 | 3-Glycidyloxypropyltriethoxysilane | 0.04 |
| Specific Example 46 | 3-Trimethoxysilylpropyl succinic anhydride | 0.20 | 3-Glycidyloxypropyltriethoxysilane | 0.04 |
| Specific Example 47 | 3-Trimethoxysilylpropyl succinic anhydride | 0.25 | 3-Glycidyloxypropyltriethoxysilane | 0.04 |
| Specific Example 48 | 3-Trimethoxysilylpropyl succinic anhydride | 0.10 | 3-Glycidyloxypropyltriethoxysilane | 0.04 |
| Specific Example 49 | 3-Trimethoxysilylpropyl succinic anhydride | 0.15 | 3-Glycidyloxypropyltriethoxysilane | 0.04 |
| Specific Example 50 | 3-Trimethoxysilylpropyl succinic anhydride | 0.20 | 3-Glycidyloxypropyltriethoxysilane | 0.04 |
| Specific Example 51 | 3-Trimethoxysilylpropyl succinic anhydride | 0.25 | 3-Glycidyloxypropyltriethoxysilane | 0.04 |
| Specific Example 52 | 3-Trimethoxysilylpropyl succinic anhydride | 0.10 | 3-Glycidyloxypropyltriethoxysilane | 0.04 |

| | Monomer 5 | |
|---|---|---|
| | Name | Molar ratio |
| Specific Example 1 | | |
| Specific Example 2 | Tetraethoxysilane | 0.05 |
| Specific Example 3 | Phenyltrimethoxysilane | 0.05 |
| Specific Example 4 | | |
| Specific Example 5 | Tetraethoxysilane | 0.05 |
| Specific Example 6 | Phenyltrimethoxysilane | 0.05 |
| Specific Example 7 | | |
| Specific Example 8 | Tetraethoxysilane | 0.05 |
| Specific Example 9 | Phenyltrimethoxysilane | 0.05 |
| Specific Example 10 | | |

TABLE 3-continued

| | | |
|---|---|---|
| Specific Example 11 | Tetraethoxysilane | 0.05 |
| Specific Example 12 | Phenyltrimethoxysilane | 0.05 |
| Specific Example 13 | | |
| Specific Example 14 | Tetraethoxysilane | 0.05 |
| Specific Example 15 | Phenyltrimethoxysilane | 0.05 |
| Specific Example 16 | | |
| Specific Example 17 | Tetraethoxysilane | 0.05 |
| Specific Example 18 | Phenyltrimethoxysilane | 0.05 |
| Specific Example 19 | | |
| Specific Example 20 | | |
| Specific Example 21 | | |
| Specific Example 22 | | |
| Specific Example 23 | Phenyltrimethoxysilane | 0.05 |
| Specific Example 24 | Phenyltrimethoxysilane | 0.05 |
| Specific Example 25 | Phenyltrimethoxysilane | 0.05 |
| Specific Example 26 | Phenyltrimethoxysilane | 0.05 |
| Specific Example 27 | | |
| Specific Example 28 | Tetraethoxysilane | 0.05 |
| Specific Example 29 | Phenyltrimethoxysilane | 0.05 |
| Specific Example 30 | | |
| Specific Example 31 | Tetraethoxysilane | 0.05 |
| Specific Example 32 | Phenyltrimethoxysilane | 0.05 |
| Specific Example 33 | | |
| Specific Example 34 | Tetraethoxysilane | 0.05 |
| Specific Example 35 | Phenyltrimethoxysilane | 0.05 |
| Specific Example 36 | | |
| Specific Example 37 | Tetraethoxysilane | 0.05 |
| Specific Example 38 | Phenyltrimethoxysilane | 0.05 |
| Specific Example 39 | | |
| Specific Example 40 | Tetraethoxysilane | 0.05 |
| Specific Example 41 | Phenyltrimethoxysilane | 0.05 |
| Specific Example 42 | | |
| Specific Example 43 | Tetraethoxysilane | 0.05 |
| Specific Example 44 | Phenyltrimethoxysilane | 0.05 |
| Specific Example 45 | | |
| Specific Example 46 | | |
| Specific Example 47 | | |
| Specific Example 48 | | |
| Specific Example 49 | Phenyltrimethoxysilane | 0.05 |
| Specific Example 50 | Phenyltrimethoxysilane | 0.05 |
| Specific Example 51 | Phenyltrimethoxysilane | 0.05 |
| Specific Example 52 | Phenyltrimethoxysilane | 0.05 |

TABLE 4

| | Monomer 1 Dimethoxy-dimethylsilane [molar ratio] | Monomer 2 3-Acryloxypropyl-trimethoxysilane [molar ratio] | Monomer 3 3-Trimethoxysilyl-propyl succinic anhydride [molar ratio] | Monomer 4 3-Glycidyloxypropyl-trimethoxysilane [molar ratio] | Monomer 5 Tetraethoxysilane [molar ratio] |
|---|---|---|---|---|---|
| Specific Example 53 | 0.626 | 0.179 | 0.150 | 0.045 | |
| Specific Example 54 | 0.700 | 0.200 | 0.050 | 0.050 | |
| Specific Example 55 | 0.663 | 0.190 | 0.100 | 0.047 | |
| Specific Example 56 | 0.590 | 0.168 | 0.200 | 0.042 | |
| Specific Example 57 | 0.553 | 0.158 | 0.250 | 0.039 | |
| Specific Example 58 | 0.800 | 0.150 | 0.050 | | |
| Specific Example 59 | 0.550 | 0.200 | 0.150 | 0.050 | 0.050 |

(Dispersant)

The composition of the present invention can contain a dispersant as the resin. The dispersant preferably includes at least one selected from an acidic resin, a basic resin, and an amphoteric resin, and more preferably at least one selected from the acidic resin and the amphoteric resin. According to the aspect, the dispersibility of particles is good.

In the present invention, the acidic resin is a resin having an acid group, which has an acid value of 5 mgKOH/g or more and an amine value of less than 5 mgKOH/g. It is preferable that the acidic resin does not have a basic group. Examples of the acid group contained in the acidic resin include a carboxyl group, a phosphoric acid group, a sulfonic acid group, and a phenolic hydroxy group, with the phosphoric acid group and the carboxyl group being preferable. The acid value of the acidic resin is preferably 5 to 200 mgKOH/g. The lower limit is more preferably 10 mgKOH/g or more, and still more preferably 20 mgKOH/g or more. The upper limit is more preferably 100 mgKOH/g or less, and still more preferably 60 mgKOH/g or less. Further, the amine value of the acidic resin is preferably 2 mgKOH/g or less, and more preferably 1 mgKOH/g or less.

In the present invention, the basic resin is a resin having a basic group, which has an amine value of 5 mgKOH/g or more and an acid value of less than 5 mgKOH/g. It is preferable that the basic resin does not have an acid group. As the basic group contained in the basic resin, an amino group is preferable. The amine value of the basic resin is preferably 5 to 200 mgKOH/g, more preferably 5 to 150 mgKOH/g, and still more preferably 5 to 100 mgKOH/g.

In the present invention, the amphoteric resin is a resin having an acid group and a basic group, which has an acid value of 5 mgKOH/g or more and an amine value of 5 mgKOH/g or more. Examples of the acid group include the above-mentioned groups, with the carboxyl group being preferable. As the basic group, an amino group is preferable.

The amphoteric resin preferably has an acid value of 5 mgKOH/g or more and an amine value of 5 mgKOH/g or more. The acid value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The amine value is preferably 5 to 200 mgKOH/g. The lower limit is more preferably 10 mgKOH/g or more, and still more preferably 20 mgKOH/g or more. The upper limit is more preferably 150 mgKOH/g or less, and still more preferably 100 mgKOH/g or less. The ratio of the acid value to the amine value of the amphoteric resin, acid value:amine value, is preferably 1:4 to 4:1, and more preferably 1:3 to 3:1.

Examples of the dispersant include a polymer dispersant [for example, a resin having an amine group (a polyamidoamine and a salt thereof), an oligoimine-based resin, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonic acid/formalin polycondensate]. The polymer dispersants can further be classified into a linear polymer, a terminal-modified polymer, a graft type polymer, and a block type polymer, depending on its structure.

The dispersant preferably has a site having an adsorptive ability onto a pigment (hereinafter also totally referred to as an "adsorptive site"). Examples of the adsorptive site include a monovalent substituent having at least one group selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. The adsorptive site is preferably an acid-based adsorptive site. Examples of the acid-based adsorptive site include an acid group. Among those, the acid-based adsorptive site is preferably at least one of a phosphorus atom-containing group or a carboxyl group. Examples of the phosphorus atom-containing group include a phosphoric acid ester group, a polyphosphoric acid ester group, and a phosphoric acid group. With regard to the details of the adsorptive site, reference can be made to paragraphs 0073 to 0080 of JP2015-34961A, the contents of which are incorporated herein by reference.

In the present invention, the resin (dispersant) is preferably a resin represented by Formula (111).

(111)

In Formula (111), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a heterocyclic group, an alkyloxycarbonyl group, an alkylaminocarbonyl group, a carboxyl group, a sulfonamido group, an alkoxysilyl group, an epoxy group, an isocyanate group, and a hydroxyl group. n $A^1$'s and n $R^2$'s may be same as or different from each other, respectively. m represents a positive number of 8 or less, n represents 1 to 9, and m+n satisfies an integer of 3 to 10. $P^1$ represents a monovalent polymer chain. m $P^1$'s may be the same as or different from each other.

Since the substituent $A^1$ which is contained in the resin represented by Formula (111) can interact with a pigment (for example, inorganic particles such as titanium oxide), the resin represented by Formula (111) may have n (1 to 9) substituents $A^1$'s to firmly interact with a pigment (for example, inorganic particles such as titanium oxide), thereby improving the dispersibility of the pigment in the composition. In addition, in the resin represented by Formula (111), m polymer chains $P^1$'s contained in the resin can serve as a sterically repulsive group, and thus, such m polymer chains $P^1$'s can exhibit good steric repulsion force, and thus, uniformly disperse a pigment (for example, inorganic particles such as titanium oxide).

In Formula (111), $R^1$ represents an (m+n)-valent linking group. Examples of the (m+n)-valent linking group include a group including 1 to 100 carbon atoms, 0 to 10 nitrogen atoms, 0 to 50 oxygen atoms, 1 to 200 hydrogen atoms, and 0 to 20 sulfur atoms. Specific examples of the (m+n)-valent linking group include a group constituted of one of the following structural units or a combination of two or more of the structural units (which may form a cyclic structure). With regard to the details of the (m+n)-valent linking group, reference can be made to paragraphs 0076 to 0084 of JP2007-277514A, the contents of which are incorporated herein by reference.

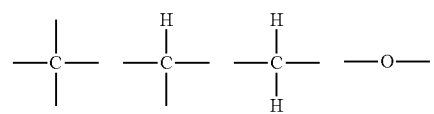

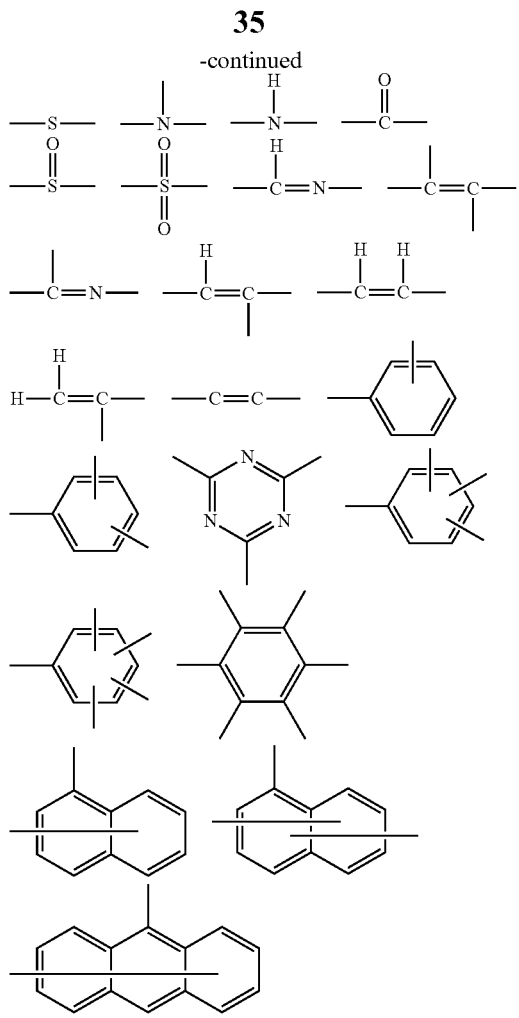

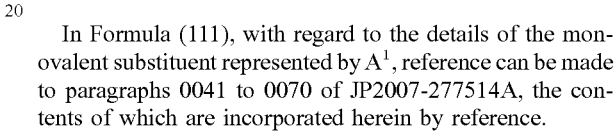

In Formula (111), with regard to the details of the monovalent substituent represented by $A^1$, reference can be made to paragraphs 0041 to 0070 of JP2007-277514A, the contents of which are incorporated herein by reference.

With regard to the polymer compound represented by the Formula (111), reference can be made to the descriptions after paragraph 0039 of JP2007-277514A (<0053> of the corresponding US2010/0233595A), and the descriptions in paragraphs 0081 to 0117 of P2015-34961A, the contents of which are incorporated herein by reference.

In the present invention, as the resin (dispersant), a graft copolymer including a repeating unit represented by any one of Formulae (11) to (14) can also be used.

In Formula (111), $P^1$ represents a monovalent polymer chain. The monovalent polymer chain is preferably a monovalent polymer chain having a repeating unit derived from a vinyl compound. With regard to the details of the polymer chain, reference can be made to paragraphs 0087 to 0098 of JP2007-277514A, the contents of which are incorporated herein by reference.

In Formula (111), $R^2$ represents a single bond or a divalent linking group. Examples of the divalent linking group include a group including 1 to 100 carbon atoms, 0 to 10 nitrogen atoms, 0 to 50 oxygen atoms, 1 to 200 hydrogen atoms, and 0 to 20 sulfur atoms, and the divalent linking group may be unsubstituted or may further, have a substituent. Specific examples of the divalent linking group include a group constituted with one of the following structural units or a combination of two or more structural units. With regard to the details of the divalent linking group, reference can be made to paragraphs 0071 to 0075 of JP2007-277514A, the contents of which are incorporated herein by reference.

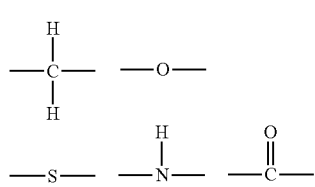

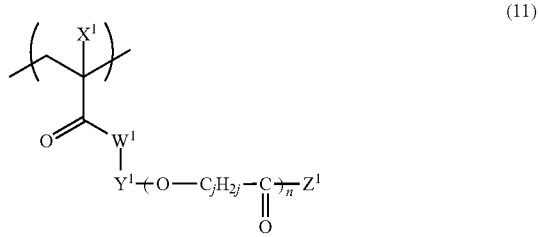

(11)

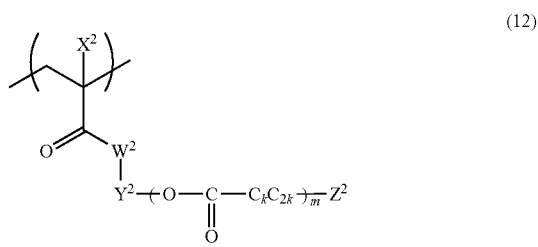

(12)

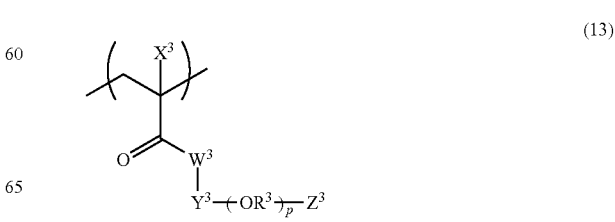

(13)

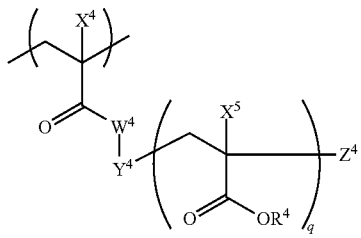

(14)

In Formulae (11) to (14), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p is 2 to 500, $R^3$'s which are present in plural numbers may be the same as or different from each other, and in Formula (14), in a case where q is 2 to 500, $X^5$'s and $R^4$'s which are present in plural numbers may be the same as or different from each other.

$W^1$, $W^2$, $W^3$, and $W^4$ are preferably oxygen atoms. $X^1$, $X^2$, $X^3$, $X^4$, and $X^5$ are preferably a hydrogen atom or an alkyl group having 1 to 12 carbon atoms, and are each independently more preferably a hydrogen atom or methyl group, and particularly preferably methyl groups. $Y^1$, $Y^2$, $Y^3$, and $Y^4$ each independently represent a divalent linking group, and the linking group is not particularly limited in their structures. The structure of the monovalent group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is preferable that $Z^1$, $Z^2$, $Z^3$, and $Z^4$ each independently represent an alkyl group or an alkoxy group having 5 to 24 carbon atoms, and among these, they are each independently particularly preferably a branched alkyl group having 5 to 24 carbon atoms, a cyclic alkyl group having 5 to 24 carbon atoms, or an alkoxy group having 5 to 24 carbon atoms. In addition, the alkyl group contained in the alkoxy group may be linear, branched, or cyclic.

In Formulae (11) to (14), n, m, p, and q are each independently an integer of 1 to 500. Further, in Formulae (11) and (12), j and k each independently represent an integer of 2 to 8. j and k in Formulae (11) and (12) are preferably an integer of 4 to 6, and most preferably 5, from the viewpoint of dispersion stability or developability.

In Formula (13), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (14), $R^4$ represents a hydrogen atom or a monovalent group, and the monovalent group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to the graft copolymer, reference can be made to the descriptions in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

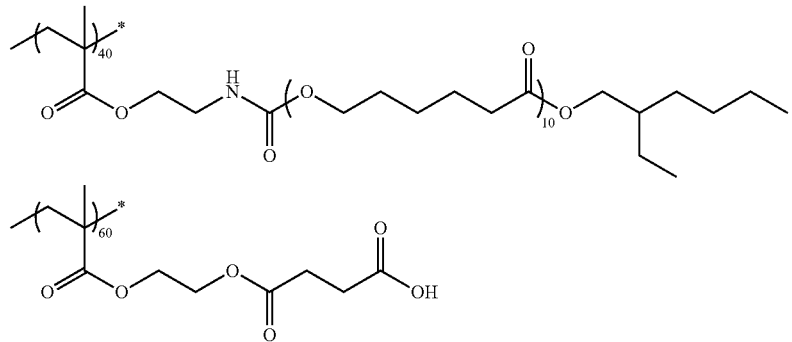

In the present invention, as the dispersant, an oligoimine-based dispersant having a basic nitrogen atom in at least one of the main chain or a side chain is also preferable. As the oligoimine-based dispersant, a resin including a repeating unit having a partial structure X having a functional group with a power of Ka (pKa; Ka is an acid dissociation constant) of 14 or less and a side chain including an oligomer chain or polymer chain Y having 40 to 10,000 atoms, and having a basic nitrogen atom in at least one of the main chain or the side chain is preferable. This resin interacts with a pigment (for example, inorganic particles such as titanium oxide) at both a nitrogen atom and a functional group contained in the structure X, with a pKa of 14 or less, and the resin has an oligomer chain or polymer chain Y having 40 to 10,000 atoms. Therefore, for example, the oligomer chain or polymer chain Y functions as a sterically repulsive group and thus exhibits good dispersibility, and thus, inorganic particles such as titanium oxide can be uniformly dispersed. Further, the oligomer chain or polymer chain Y interacts with a solvent, and thus, sedimentation of inorganic particles such as titanium oxide can be suppressed for a long period of time. In addition, the oligomer chain or polymer chain Y functions as a sterically repulsive group, and thus, aggregation of a pigment (for example, inorganic particles such as titanium oxide) is prevented, and therefore, even in a case where the content of the pigment (preferably inorganic particles such as titanium oxide) is increased, excellent dispersibility is obtained.

Here, the basic nitrogen atom is not particularly limited as long as it is a nitrogen atom exhibiting basicity, but the resin preferably contains a structure having a nitrogen atom with a power of Kb (pKb; Kb is a base dissociation constant) of 14 or less, and more preferably contains a structure having a nitrogen atom with a pKb of 10 or less. In the present invention, the pKb (base strength) refers to a pKb at a water temperature of 25° C., is one of the indices for quantitatively representing the intensity of a base, and has the same definition as the basicity constant. The base strength pKb and the acid strength pKa are in a relationship of pKb=14-pKa.

The functional group with a pKa of 14 or less contained in the partial structure X is not particularly limited, and its structure or the like is not particularly limited as long as the physical properties satisfy the condition. The functional group with a pKa of 12 or less is particularly preferable, and the functional group with a pKa of 11 or less is most preferable. Specific examples of the functional group include a carboxyl group (pKa: approximately 3 to 5), a sulfo group (pKa: approximately −3 to −2), a —COCH$_2$CO— group (pKa: approximately 8 to 10), a —COCH$_2$CN group (pKa: approximately 8 to 11), a —CONHCO— group, a phenolic hydroxyl group, a —R$_F$CH$_2$OH group, or a —(R$_F$)$_2$CHOH group (R$_F$ represents a perfluoroalkyl group, pKa: approximately 9 to 11), and a sulfonamido group (pKa: approximately 9 to 11). The partial structure X having a functional group with a pKa of 14 or less preferably is directly bonded to a basic nitrogen atom in a repeating unit containing a nitrogen atom, but the basic nitrogen atom of the repeating unit containing a basic nitrogen atom and the partial structure X may be linked to each other via a covalent bond as well as an ion bond such that a salt is formed.

The oligoimine-based dispersant is preferably a resin having a repeating unit containing a basic nitrogen atom to which the partial structure X having a functional group with a pKa of 14 or less is bonded, and an oligomer chain or polymer chain Y having 40 to 10,000 atoms in a side chain.

Furthermore, the oligoimine-based dispersant is preferably a resin which has (i) at least one repeating unit having a basic nitrogen atom, selected from a poly(lower alkylenimine)-based repeating unit, a polyallylamine-based repeating unit, a polydiallylamine-based repeating unit, a metaxylenediamine-epichlorohydrin polycondensate-based repeating unit, and a polyvinylamine-based repeating unit, in which the repeating unit is bonded to the basic nitrogen atom and has a partial structure X having a functional group with a pKa of 14 or less, and (ii) an oligomer chain or polymer chain Y having 40 to 10,000 atoms in a side chain. Further, in the present invention, the "lower" in the poly(lower alkylenimine) represents that the number of carbon atoms is 1 to 5, and a lower alkylenimine represents an alkylenimine having 1 to 5 carbon atoms.

Examples of the oligomer chain or polymer chain Y having 40 to 10,000 atoms include known polymer chains such as a polyester, a polyamide, a polyimide, and a poly (meth)acrylic acid ester, which can be linked to the main chain portion of the resin. The binding site in the oligomer chain or polymer chain Y to the resin is preferably the terminal of Y.

The oligomer chain or polymer chain Y is preferably bonded to the nitrogen atom in at least one repeating unit containing a basic nitrogen atom, selected from a poly(lower alkylenimine)-based repeating unit, a polyallylamine-based repeating unit, a polydiallylamine-based repeating unit, a metaxylenediamine-epichlorohydrin polycondensate-based repeating unit, and a polyvinylamine-based repeating unit. The bonding mode between the main chain portion of a repeating unit which has at least one repeating unit containing a basic nitrogen atom, selected from a poly(lower alkylenimine)-based repeating unit, a polyarylamine-based repeating unit, a polydiarylamine-based repeating unit, a metaxylenediamine-epichlorohydrin polycondensate-based repeating unit, and a polyvinylamine-based repeating unit, and Y is a covalent bond, an ionic bond, or a mixture of the covalent bond and the ionic bond. The ratio of the bonding mode between Y and the main chain portion in terms of covalent bonds:ionic bonds is 100:0 to 0:100, and preferably 95:5 to 5:95. Y is preferably bonded to a nitrogen atom of a repeating unit containing the nitrogen atom via an amide bond, or via an ionic bond as a carboxylate.

From the viewpoint of the dispersibility, the dispersion stability and the developability, the number of atoms of the oligomer chain or polymer chain Y is preferably 50 to 5,000, and more preferably 60 to 3,000. In addition, it is possible to measure the number-average molecular weight of Y using a value in terms of polystyrene according to a GPC method. The number-average molecular weight of Y is preferably 1,000 to 50,000, and more preferably 1,000 to 30,000.

Examples of the oligoimine-based dispersant include a resin including at least one of a repeating unit represented by Formula (I-1), a repeating unit represented by Formula (I-2), or a repeating unit represented by Formula (I-2a).

(I-1)

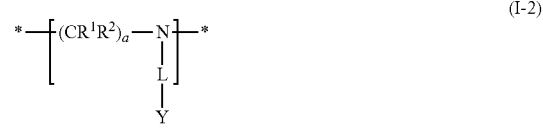

(I-2)

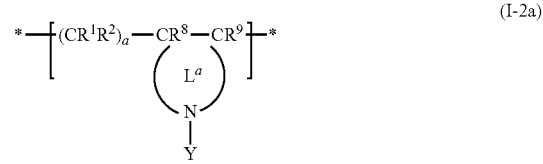

(I-2a)

R$^1$ and R$^2$ each independently represent a hydrogen atom, a halogen atom, or an alkyl group (preferably having 1 to 6 carbon atoms).

a each independently represents an integer from 1 to 5. * represents a linking moiety between the repeating units.

$R^8$ and $R^9$ are each a group having the same definition as R'.

L is a single bond, an alkylene group (preferably having 1 to 6 carbon atoms), an alkenylene group (preferably having 2 to 6 carbon atoms), an arylene group (preferably having 6 to 24 carbon atoms), a heteroarylene group (preferably having 1 to 6 carbon atoms), an imino group (preferably having 0 to 6 carbon atoms), an ether group, a thioether group, a carbonyl group, or a linking group which is related to a combination thereof. Among these, a single bond or —$CR^5R^6$—NR'— (an imino group bonds with X or Y) is preferable. Here, $R^5$ and $R^6$ each independently represent a hydrogen atom, a halogen atom or an alkyl group (preferably having 1 to 6 carbon atoms). $R^7$ is a hydrogen atom or an alkyl group having 1 to 6 carbon atoms.

$L^a$ is a structural site which forms a ring structure along with $CR^8CR^9$ and N, and is preferably a structural site which forms a non-aromatic heterocycle which has 3 to 7 carbon atoms along with the carbon atoms of $CR^8CR^9$. A structural site which forms a non-aromatic heterocycle which has 5 to 7 members along with the carbon atoms of $CR^8CR^9$ and N (a nitrogen atom) is more preferable, a structural site which forms a non-aromatic heterocycle which has 5 members is even more preferable, and a structural site which forms pyrrolidine is particularly preferable. Here, the structural site may further have a substituent such as an alkyl group. X represents a group which has a functional group with a pKa of 14 or less. Y represents an oligomer chain or polymer chain which has 40 to 10,000 atoms.

The dispersant (oligoimine-based dispersant) may further, contain one or more selected from repeating units represented by Formulae (I-3), (I-4), and (I-5) as a copolymerization component. It is possible to further improve the dispersibility of the particles by incorporating such a repeating unit into the dispersant.

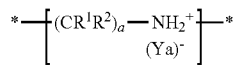
(I-3)

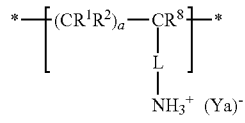
(I-4)

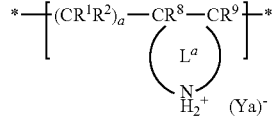
(I-5)

$R^1$, $R^2$, $R^8$, $R^9$, L, $L^a$, a, and * have the same definitions as in Formulae (I-1), (I-2), and (I-2a). Ya represents an oligomer chain or polymer chain having 40 to 10,000 atoms, which has an anion group.

With regard to the oligoimine-based dispersant, reference can be made to the descriptions in paragraph Nos. 0118 to 0190 of JP2015-34961A, the contents of which are incorporated herein by reference. As specific examples of the oligoimine-based dispersant, for example, the following resins or the resins described in paragraph Nos. 0169 to 0190 of JP2015-34961A can be used.

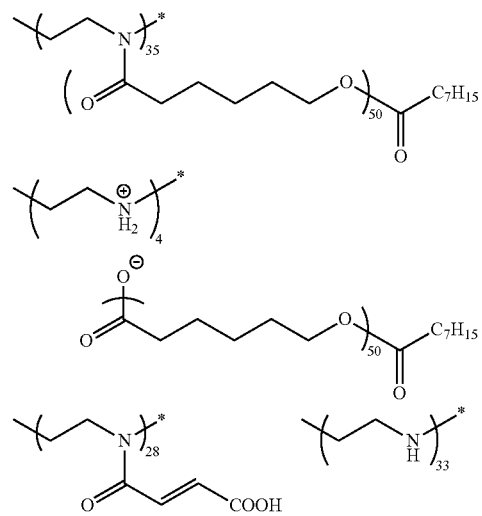

The dispersant can also be available as a commercially available product, and specific examples thereof include "Disperbyk-101 (polyamidoamine phosphate), 107 (carboxylate ester), 110 and 180 (a copolymer which includes an acid group), 130 (polyamide), 161, 162, 163, 164, 165, 166, and 170 (polymer copolymer)", and "BYK-P104 and P105 (high-molecular-weight unsaturated polycarboxylic acid)" manufactured by BYK Chemie Co., Ltd., "EFKA 4047, 4050, 4010, and 4165 (polyurethane-based), EFKA 4330 and 4340 (block copolymers), 4400 and 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA Ltd., "AJISPER PB821 and PB822" manufactured by Ajinomoto Fine-Techno Co., Inc., "FLOWREN TG-710 (urethane oligomer)" and "POLYFLOW No. 50E and No. 300 (acrylic copolymer)" manufactured by Kyoeisha Chemical Co., Ltd., "DISPARLON KS-860, 873SN, 874, and #2150 (aliphatic polycarboxylic acid), #7004 (polyether ester), DA-703-50, DA-705, and DA-725" manufactured by Kusumoto Chemicals, Ltd., "DEMOL RN and N (naphthalenesulfonic acid formalin polycondensate), and MS, C, and SN-B (aromatic sulfonic acid/formalin polycondensate)", "HOMOGENOL L-18 (polymer polycarboxylic acid)", "EMULGEN 920, 930, 935, and 985 (polyoxyethylene nonyl phenyl ether)" and "ACETAMIN 86 (stearylamine acetate)" manufactured by Kao Corp., "Solsperse 5000 (phthalocyanine derivative), 22000 (azo pigment derivative), 13240 (polyester amine), 3000, 17000, and 27000 (polymers which have a functional section in the terminal), 24000, 26000, 28000, 32000, 36000, and 38500 (graft type polymers), 41000, and 46000" manufactured by Lubrizol Corp., "NIKKOL T106 (polyoxyethylene sorbitan monooleate), and MYS-IEX (polyoxyethylene monostearate)" manufactured by Nikko Chemicals Co., Ltd., and the like.

In addition, examples of the commercially available product of the dispersant having a phosphorus atom-containing group (for example, a phosphoric acid group) as an acid-based adsorptive site include "Solsperse 26000, 36000, and 41000" manufactured by Lubrizol Japan Ltd., which can be appropriately used.

The dispersants can be used singly or in combination of two or more kinds thereof.

For the dispersant, the resin described for the binder as described above can also be used. Further, for the dispersant, a resin having a refractive index to light at a wavelength of 589 nm of 1.5 or less may be used.

The composition of the present invention may contain a dispersion aid having an acid group and a crosslinkable group as the dispersion aid. Preferred examples of the acid group include a sulfonic acid group, a phosphoric acid group, a phosphonic acid group, and a carboxylic acid group, with the phosphoric acid group being more preferable. Examples of the crosslinkable group include an ethylenically unsaturated bond-containing group, an epoxy group, and a mercapto group, with the ethylenically unsaturated bond-containing group being more preferable. Examples of the ethylenically unsaturated bond-containing group also include addition-polymerizable ethylene groups exemplified in the description of the polymerizable compound.

Examples of commercially available products of the dispersion aid include LIGHT ESTER P-1M, LIGHT ESTER P-2M, LIGHT ESTER HO-MS, and LIGHT ESTER HO-HH (all manufactured by Kyoei-Sha Chemical Co., Ltd), PHOSMER M, PHOSMER PE, PHOSMER MH, Hosmer CL, and PHOSMER PP (all manufactured by Uni-Chemical Co., Ltd.), and TBAS-Q and TBAS-R (manufactured by MRC Unitech Co., Ltd.).

The content of the dispersant is preferably 1% to 80% by mass with respect to the total solid content of the composition, from the viewpoints of a pattern shape and adhesiveness. The upper limit is preferably 70% by mass or less, and more preferably 60% by mass or less, with respect to the total solid content of the composition. The lower limit is preferably 1.5% by mass or more, and more preferably 2% by mass or more.

Furthermore, the content of the dispersant is preferably 1 to 100 parts by mass with respect to 100 parts by mass of the pigment. The upper limit is preferably 80 parts by mass or less, and more preferably 60 parts by mass or less. The lower limit is preferably 2.5 parts by mass or more, and more preferably 5 parts by mass or more.

Moreover, the content of the dispersant is preferably 1 to 100 parts by mass with respect to 100 parts by mass of the inorganic pigment. The upper limit is preferably 80 parts by mass or less, and more preferably 60 parts by mass or less. The lower limit is preferably 2.5 parts by mass or more, and more preferably 5 parts by mass or more.

In addition, the content of the dispersant is preferably 1 to 100 parts by mass with respect to 100 parts by mass of titanium oxide. The upper limit is preferably 80 parts by mass or less, and more preferably 60 parts by mass or less. The lower limit is preferably 2.5 parts by mass or more, and more preferably 5 parts by mass or more.

<<Solvent>>

The composition of the present invention preferably contains a solvent. The solvent can be constituted with various organic solvents. Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, and ethyl lactate. These organic solvents may be used individually or as a mixture.

In the present invention, a solvent having a small metal content is preferably used as the solvent. The metal content of the solvent is preferably for example, 10 ppb by mass or less. As desired, a solvent having a metal content at a ppt level may be used, and such a high-purity solvent is provided by, for example, Toyo Gosei Co., Ltd. (The Chemical Daily (Kagaku Kogyo Nippo), Nov. 13, 2015).

Examples of a method for removing impurities such as metals from the solvent include distillation (molecular distillation, thin film distillation, or the like) and filtration using a filter. As for the filter pore diameter of the filter used for the filtration, the pore size is preferably 10 nm or less, more preferably 5 nm or less, and still more preferably 3 nm or less. As for the materials of a filter, a polytetrafluoroethylene-made filter, a polyethylene-made filter, or a nylon-made filter is preferable.

The solvent may include isomers (compounds having the same number of atoms and different structures). Further, one kind or a plurality of kinds of the isomers may be included.

The content of the solvent is preferably a content such that the concentration of the solid content of the composition reached 25% to 70% by mass, and more preferably a content such that the concentration of the solid content of the composition reached 30% to 60% by mass.

<<Curable Compound>>

The composition of the present invention preferably contains a curable compound.

For the curable compound, a compound which can be crosslinked (including being subjected to polymerization and condensation) by a radical, an acid, or heat can be used. Examples of the curable compound used in the present invention include a compound having an ethylenically unsaturated bond-containing group, a compound having an epoxy group, and a compound having a methylol group, with the compound having an ethylenically unsaturated bond-containing group being preferable. Examples of the ethylenically unsaturated bond-containing group include a vinyl group, a (meth)allyl group, and a (meth)acryloyl group.

In the present invention, the curable compound is preferably a radically polymerizable compound. Examples of the radically polymerizable compound include a compound having an ethylenically unsaturated bond-containing group. The composition of the present invention may have a compound having an epoxy group which will be described later as the curable compound. Hereinafter, in a case where a polymerizable compound is referred unless otherwise specified, it means a radically polymerizable compound.

The content of the curable compound is preferably 1% to 70% by mass with respect to the total solid content of the composition. The lower limit is preferably 3% by mass or more, and more preferably 5% by mass or more. The upper limit is preferably 60% by mass or less, and more preferably 50% by mass or less. These ranges are preferable from the viewpoints of a pattern shape, heat resistance, and L*. The curable compounds may be used singly or in combination of two or more kinds thereof. In a case where the curable compounds are used in combination of two or more kinds thereof, the total amount thereof preferably falls within the range.

In a case where a polymerizable compound is used as the curable compound, the content of the polymerizable compound is preferably 1% to 70% by mass with respect to the total solid content of the composition. The lower limit is preferably 3% by mass or more, and more preferably 5% by mass or more. The upper limit is preferably 60% by mass or less, and more preferably 50% by mass or less. The polymerizable compound used in the composition may be used singly or in combination of two or more kinds thereof. In a case of using two or more kinds of polymerization compounds, the total amount thereof preferably falls within the range.

In addition, the content of the polymerizable compound is preferably 10% to 100% by mass, and more preferably 30% to 100% by mass, with respect to the total mass of the curable compound.

(Polymerizable Compound)

The polymerizable compound is preferably a compound having at least one ethylenically unsaturated bond-containing group, and more preferably a compound having at least one terminal ethylenically unsaturated bond-containing group, or preferably two or more terminal ethylenically unsaturated bond-containing groups. Further, the polymerizable compound is preferably a compound having 6 or more ethylenically unsaturated bond-containing groups, more preferably a compound having 3 or 4 ethylenically unsaturated bond-containing groups, and still more preferably a compound having 3 or 4 ethylenically unsaturated bond-containing group. The ethylenically unsaturated bond-containing group is preferably a (meth)acryloyl group or a (meth)acryloyloxy group.

The polymerizable compound may be in any form of a monomer and a polymer, with the monomer being preferable. The monomer type polymerizable compound preferably has a molecular weight of 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, more preferably a trifunctional to hexafunctional (meth)acrylate compound, and still more preferably a trifunctional or tetrafunctional (meth)acrylate compound. According to this aspect, the solvent resistance of the obtained film or the adhesiveness to a substrate can be improved. Further, the polymerizable compound is preferably a hexafunctional or higher (meth)acrylate compound.

The polymerizable compound is preferably a compound which has at least one addition-polymerizable ethylene group, which is a compound having an ethylenically unsaturated bond-containing group, with a boiling point of 100° C. or higher at normal pressure. Examples thereof include monofunctional acrylates or methacrylates such as polyethylene glycol mono(meth)acrylate, polypropylene glycol mono(meth)acrylate, and phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl) ether, tri(acryloyloxyethyl) isocyanurate, and a mixture thereof, and the polymerizable compound is preferably pentaerythritol tetra(meth)acrylate.

As the polymerizable compound, the polymerizable compounds represented by Formulae (MO-1) to (MO-5) can be suitably used. Further, in a case where T is an oxyalkylene group in the formula, a terminal on the side of the carbon atom is bonded to R.

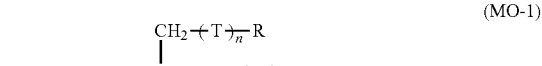

(MO-1)

(MO-2)

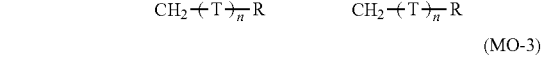

(MO-3)

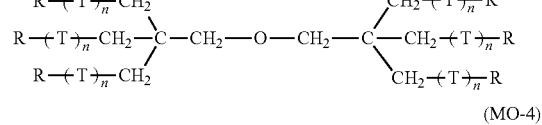

(MO-4)

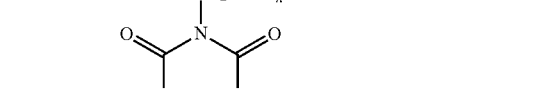

(MO-5)

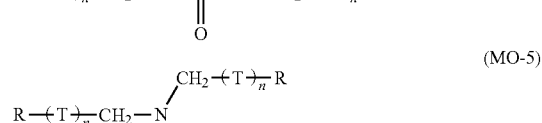

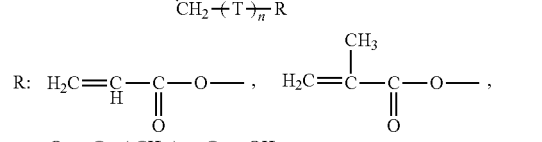

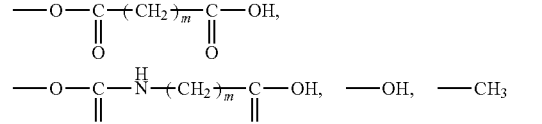

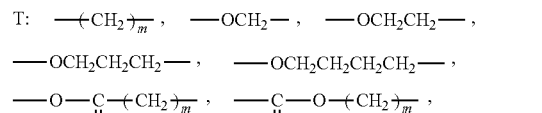

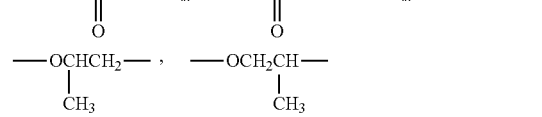

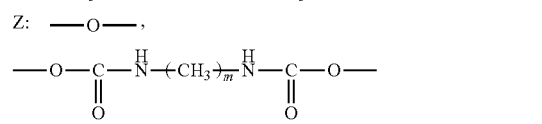

In the formulae, n is 0 to 14, and m is 1 to 8. A plurality of R's and T's which are present in the same molecule may be the same as or different from each other.

In each of the polymerizable compounds represented by Formulae (MO-1) to (MO-5), at least one of the plurality of R's represents a group represented by —OC(=O)CH=CH$_2$ or —OC(=O)C(CH$_3$)=CH$_2$.

Specific examples of the polymerizable compounds represented by Formulae (MO-1) to (MO-5) include the compounds described in paragraphs 0248 to 0251 of JP2007-269779A.

Furthermore, a compound obtained by adding ethylene oxide or propylene oxide to a polyfunctional alcohol, followed by (meth)acrylation, which is described in JP1998-62986A (JP-H10-62986A), can be used as the polymerizable compound.

As the polymerizable compound, pentaerythritol tetraacrylate (A-TMMT as a commercially available product; manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), or dipentaerythritol hexa(meth)acrylate (KAYARAD DPHA as a commercially available product; manufactured by Nippon Kayaku Co., Ltd.) is preferable, and pentaerythritol tetraacrylate and dipentaerythritol hexa(meth)acrylate are more preferable from the viewpoint of a pattern shape.

The polymerizable compound may have an acid group such as a carboxyl group, a sulfo group, and a phosphoric acid group. The polymerizable compound having an acid group is obtained by a method including (meth)acrylating a hydroxyl group in a part of a polyhydric alcohol, and subjecting the remaining hydroxyl group to an addition reaction with an acid anhydride to form a carboxyl group, or the like. Examples of the polymerizable compound having an acid group include an ester of an aliphatic polyhydroxy compound with an unsaturated carboxylic acid. The polymerizable compound having an acid group is preferably an ester of an aliphatic polyhydroxy compound with an unsaturated carboxylic acid, and more preferably a polymerizable compound in which a non-aromatic carboxylic acid anhydride is reacted with an unreacted hydroxyl group of the aliphatic polyhydroxy compound to make an acid group bonded thereto. Particularly preferably in this ester, the aliphatic polyhydroxy compound is at least one of pentaerythritol or dipentaerythritol. Examples of the commercially available product thereof include ARONIX series M-305, M-510, and M-520 as a polybasic acid-modified acryl oligomer manufactured by TOAGOSEI, CO., LTD. The acid value of the polymerizable compound having an acid group is preferably 0.1 to 40 mgKOH/g. The lower limit is preferably 5 mgKOH/g or more. The upper limit is preferably 30 mgKOH/g or less.

It is also a preferred aspect that the polymerizable compound is a compound having a caprolactone structure. The polymerizable compound having a caprolactone structure is not particularly limited as long as it has a caprolactone structure in a molecule thereof, and examples thereof include ε-caprolactone-modified polyfunctional (meth)acrylates which are obtained by esterifying polyhydric alcohols such as trimethylolethane, ditrimethylolethane, trimethylolpropane, ditrimethylolpropane, pentaerythritol, dipentaerythritol, tripentaerythritol, glycerin, diglycerol, and trimethylolmelamine with (meth)acrylic acid and ε-caprolactone. Among those, the polymerizable compound having a caprolactone structure is preferably a compound represented by Formula (Z-1).

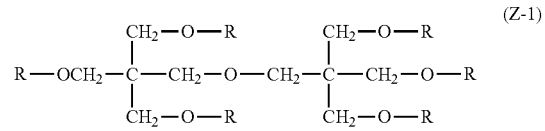

In Formula (Z-1), all of six R's are a group represented by Formula (Z-2). Alternatively, one to five out of six R's are a group represented by Formula (Z-2), and the remainder is a group represented by Formula (Z-3).

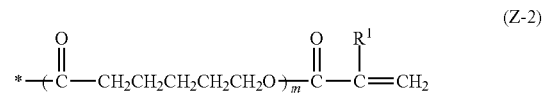

In Formula (Z-2), $R^1$ represents a hydrogen atom or a methyl group, m represents a number 1 or 2, and "*" represents a binding arm.

In Formula (Z-3), $R^1$ represents a hydrogen atom or a methyl group, and "*" represents a binding arm.

The polymerizable compound having a caprolactone structure is commercially available as a KAYARAD DPCA series from Nippon Kayaku Co., Ltd., and examples thereof include DPCA-20 (a compound in which m is 1, the number of the groups represented by Formula (Z-2) is 2, and all of $R^1$'s are hydrogen atoms in Formulae (Z-1) to (Z-3)), DPCA-30 (a compound in which m is 1, the number of the groups represented by Formula (Z-2) is 3, and all of $R^1$'s are hydrogen atoms in Formulae (Z-1) to (Z-3)), DPCA-60 (a compound in which m is 1, the number of the groups represented by Formula (Z-2) is 6, and all of $R^1$'s are hydrogen atoms in Formulae (Z-1) to (Z-3)), and DPCA-120 (a compound in which m is 2, the number of the groups represented by Formula (Z-2) is 6, and all of $R^1$'s are hydrogen atoms in Formulae (Z-1) to (Z-3)).

As the polymerizable compound, a compound represented by Formula (Z-4) or (Z-5) can also be used.

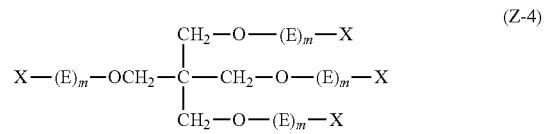

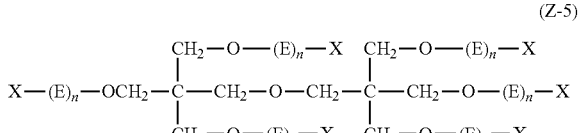

In Formulae (Z-4) and (Z-5), E's each independently represent $-((CH_2)_yCH_2O)-$ or $-((CH_2)_yCH(CH_3)O)-$, y's each independently represent an integer of 0 to 10, and X's each independently represent a (meth)acryloyl group, a hydrogen atom, or a carboxyl group.

In Formula (Z-4), the sum of the (meth)acryloyl groups is 3 or 4, m's each independently represent an integer of 0 to 10, and the sum of the respective m's is an integer of 0 to 40.

In Formula (Z-5), the sum of the (meth)acryloyl groups is 5 or 6, n's each independently represent an integer of 0 to 10, and the sum of the respective n's is an integer of 0 to 60.

In Formula (Z-4), m is preferably an integer of 0 to 6, and more preferably an integer of 0 to 4.

Furthermore, the sum of the respective m's is preferably an integer of 2 to 40, more preferably an integer of 2 to 16, and particularly preferably an integer of 4 to 8.

In Formula (Z-5), n is preferably an integer of 0 to 6, and more preferably an integer of 0 to 4.

Furthermore, the sum of the respective n's is preferably an integer of 3 to 60, more preferably an integer of 3 to 24, and particularly preferably an integer of 6 to 12.

In addition, —((CH$_2$)$_y$CH$_2$O)— or —((CH$_2$)$_y$ CH(CH$_3$)O)— in Formula (Z-4) or (Z-5) is preferably in the form in which the terminal at an oxygen atom side binds to X.

The compound represented by Formula (Z-4) or (Z-5) may be used singly or in combination of two or more kinds thereof. In particular, a form in which all of six X's in Formula (Z-5) are acryloyl groups are preferable.

Moreover, the total content of the compound represented by Formula (Z-4) or (Z-5) in the polymerizable compound is preferably 20% by mass or more, and more preferably 50% by mass or more.

The compound represented by Formula (Z-4) or (Z-5) can be synthesized by steps known in the related art, which includes a step of bonding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by Formula (Z-4) or (Z-5).

Among the compounds represented by Formula (Z-4) or (Z-5), at least one of a pentaerythritol derivative or a dipentaerythritol derivative is more preferable.

Specific examples of the compounds include compounds represented by Formulae (a) to (f) (hereinafter also referred to as "exemplary compounds (a) to (f)"). Among those, the compound represented by the following formulae (a), (b), (e), and (f) are preferable.

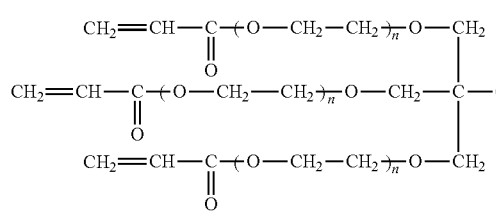
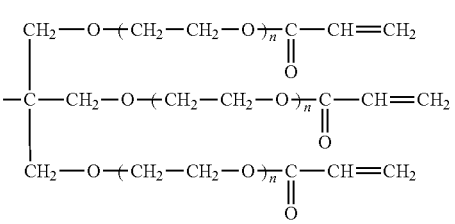

(a)

(the sum of the respective n's is 6)

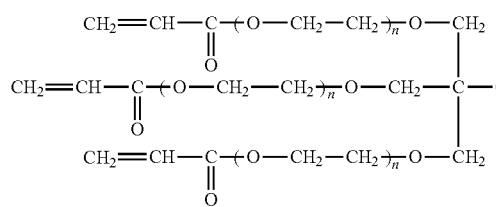
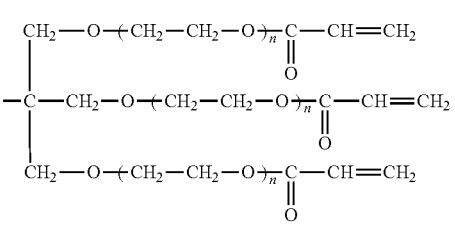

(b)

(the sum of the respective n's is 12)

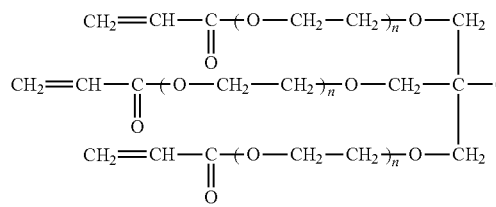
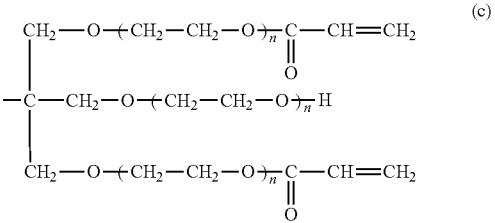

(c)

(the sum of the respective n's is 12)

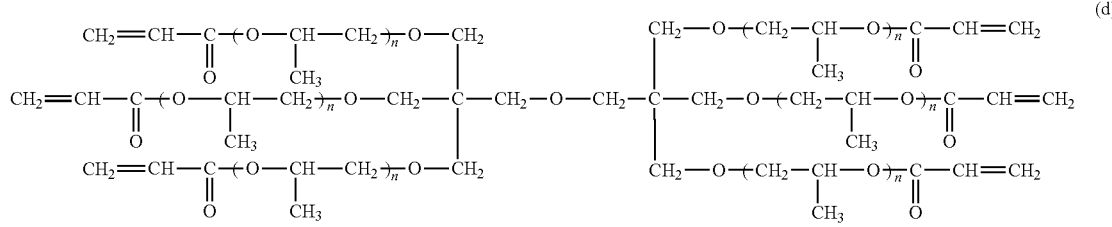

(the sum of the respective n's is 6)

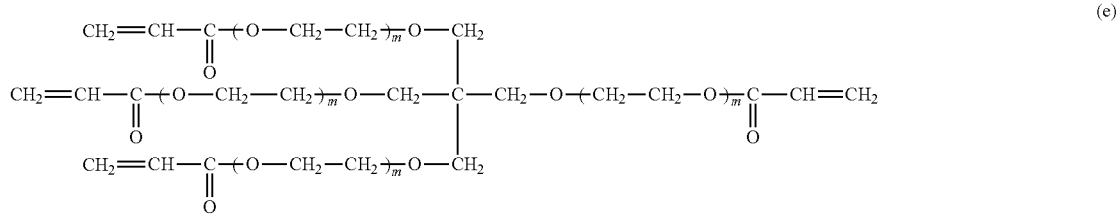

(the sum of the respective m's is 4)

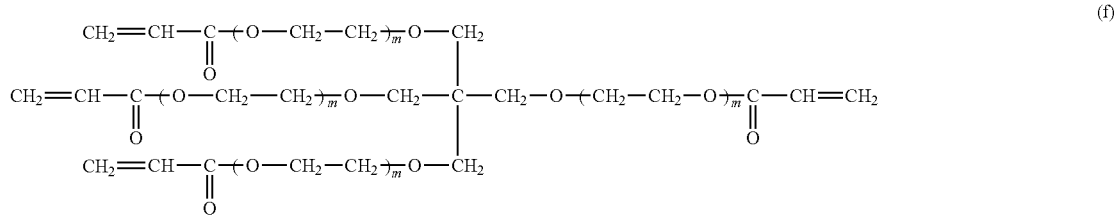

(the sum of the respective m's is 12)

Examples of the commercially available product of the polymerizable compound represented by Formula (Z-4) or (Z-5) include SR-494 which is a tetrafunctional acrylate having four ethyleneoxy groups, manufactured by Sartomer, and DPCA-60 which is a hexafunctional acrylate having six pentyleneoxy groups, and TPA-330 which is a trifunctional acrylate having three isobutyleneoxy groups, manufactured by Nippon Kayaku Co., Ltd.

As the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, the addition-polymerizable compounds having an amino structure or a sulfide structure in a molecule, which are described in JP1988-277653A (JP-S63-277653A), JP1988-260909A (JP-S63-260909A), and JP1989-105238A (JP-H01-105238A), are also preferable.

Examples of commercially available products of the polymerizable compound include urethane oligomers UAS-10 and UAB-140 (manufactured by Sanyo-Kokusaku Pulp, Co., Ltd.), U-4HA, U-6LPA, UA-32P, U-10HA, U-10PA, UA-122P, UA-1100H, and UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600, and AI-600 (manufactured by Kyoeisha Chemical Co., Ltd.), and UA-9050 and UA-9048 (manufactured by BASF).

Furthermore, in another preferred aspect, the polymerizable compound is a polymerizable compound having a Si atom in the molecule thereof. Examples of a commercially available product of the polymerizable compound is a polymerizable compound having a Si atom in the molecule thereof include EBECRYL 1360 (manufactured by Daicel-Allnex Ltd.) which is a siloxane bond-containing polyfunctional acrylate, and VINYLTRIISOPROPENOXYSILANE (manufactured by AZmax Co., Ltd.) which is a Si atom-containing polyfunctional vinyl compound.

As for these polymerizable compounds, details of the method of use such as the structure of the compounds, single use or use of a combination, and the amount to be added may be arbitrarily set in accordance with the final performance design of the compositions. From the viewpoint of sensitivity, a structure having a high content of unsaturated groups per one molecule is preferable, and in many cases, bifunctionality or higher functionality is preferred. Further, in order to increase the strength of a cured film, a trifunctional or higher compound is preferable, and in addition, it is effective to use a method of controlling both the sensitivity and the strength by using compounds that are different in at least one of functionalities or polymerizable groups (for example, an acrylic acid ester, a methacrylic acid ester, a styrene-based compound, and a vinyl ether-based compound) in combination. In addition, it is also preferable to use another polymerizable compound which is a trifunctional or higher compound and is in an ethylene oxide chain form. According to this aspect, it is possible to form a pattern having controllable and excellent developability of the composition. Further, at least one of the selection of the polymerizable compounds or the method of using the same is also important factors for at least one the compatibility with other components (for example, a photopolymerization initiator and a resin) contained in the composition or the dispersibility, and for example, the compatibility or the like can be improved by using a low-purity compound or using a combination of two or more kinds of other components.

(Compound Having Epoxy Group)

For the composition of the present invention, a compound having an epoxy group can also be used as the curable compound. According to this aspect, the solvent resistance of the obtained film can be improved. Examples of the compound having an epoxy group include a monofunctional or polyfunctional glycidyl ether compound and a polyfunctional aliphatic glycidyl ether compound. Further, a compound having an epoxy group as a part of a glycidyl group, such as glycidyl (meth)acrylate and allyl glycidyl ether, or an alicyclic compound having an epoxy group can also be used.

Examples of the compound having an epoxy group include a compound having one or more epoxy groups per molecule, and the number of epoxy groups per molecule is preferably 1 to 100. The upper limit can be set to, for example, 10 or less, or to 5 or less. The lower limit is preferably 2 or more.

The epoxy equivalents (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low molecular compound (for example, further, a molecular weight of less than 1,000) or a polymer compound (macromolecule) (for example, a molecular weight of 1,000 or more, and in the case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 10,000 or less, more preferably 5,000 or less, and still more preferably 3,000 or less.

It is preferable that the compound having an epoxy group is an aliphatic epoxy resin from the viewpoint of solvent resistance.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-40105, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

As the compound having an epoxy group, the compounds described in paragraph No. 0045 of JP2009-265518, and the like can be used, the contents of which are incorporated herein by reference.

<<Polymerization Initiator>>

The composition of the present invention preferably includes a polymerization initiator.

The content of the polymerization initiator is preferably 0.1% to 50% by mass with respect to the total solid content of the composition from the viewpoints of solvent resistance and coloring properties, more preferably 0.5 to 30% by mass, and still more preferably 1% to 20% by mass. The composition may have one kind or two or more kinds of the polymerization initiators. In a case where two or more kinds of the polymerization initiators are included, the total amount thereof preferably falls within the range.

As the polymerization initiator, a photopolymerization initiator or a thermal polymerization initiator is preferable, with the photopolymerization initiator being preferable. The thermal polymerization initiator is not particularly limited, known compounds can be used.

(Photopolymerization Initiator)

The composition of the present invention can contain a photopolymerization initiator. In particular, in a case where the composition includes a polymerizable compound, it is preferable that the composition contains a photopolymerization initiator. The photopolymerization initiator is not particularly limited, and can be appropriately selected from known photopolymerization initiators. For example, a photopolymerization initiator having photosensitivity with respect to light rays in a range ranging from an ultraviolet region to visible light region is preferable. Further, the photopolymerization initiator is preferably a photoradical polymerization initiator. In addition, it is preferable that the photopolymerization initiator contains at least one compound having at least a molar light absorption coefficient of about 50 in a range from about 300 nm to 800 nm (more preferably 330 nm to 500 nm).

Examples of the photopolymerization initiator include halogenated hydrocarbon derivatives (for example, a derivative having a triazine skeleton and a derivative having an oxadiazole skeleton), acylphosphine compounds such as acylphosphine oxide, hexaaryl biimidazole, oxime compounds such as an oxime derivative, organic peroxide, thio compounds, ketone compounds, aromatic onium salts, ketoxime ethers, aminoacetophenone compounds, and hydroxyacetophenone. Examples of the halogenated hydrocarbon compound having a triazine skeleton include the compounds described in Wakabayashi et al., Bull. Chem. Soc. Japan, 42, 2924 (1969), the compounds described in UK1388492B, the compound described in JP1978-133428A (JP-S53-133428A), the compounds described in GE3337024B, the compounds described in F. C. Schaefer et al., J. Org. Chem.; 29, 1527 (1964), the compounds described in JP1987-58241A (JP-S62-58241A), the compounds described in JP1993-281728A (JP-H05-281728A), the compounds described in JP1993-34920A (JP-H05-34920A), and the compounds described in U.S. Pat. No. 4,212,976A.

Furthermore, from the viewpoint of exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acylphosphine compound can also suitably be used. More specifically, for example, the aminoacetophenone-based initiators described in JP1998-291969A (JP-H10-291969A) and the acylphosphine-based initiators described in JP4225898B can also be used. As the hydroxyacetophenone-based initiator, IRGACURE 184, DAROCUR-1173, IRGACURE 500, IRGACURE 2959, and IRGACURE 127 (trade names: all manufactured by BASF) can be used. As the aminoacetophenone-based initiator, IRGACURE 907, IRGACURE 369, IRGACURE 379, and IRGACURE 379EG (trade names: all manufactured by BASF) which are commercially available products can be used. As the aminoacetophenone-based initiator, the compound described in JP2009-191179A, of which an absorption wavelength matches with a light source of a long wavelength of 365 nm, 405 nm, or the like can also be used.

IRGACURE 819 or IRGACURE TPO (trade name: both manufactured by BASF) which are commercially available products can be used as the acylphosphine-based initiator.

From the viewpoint of coloring properties, an aminoacetophenone-based initiator or an acylphosphine-based initiator is preferable, and from the viewpoints of coloring properties and adhesiveness, the acylphosphine-based initiator is more preferable.

As the photopolymerization initiator, an oxime compound can be preferably used. As the oxime compound, an oxime ester compound is more preferable. As the specific examples of the oxime compounds, the compound described in JP2001-233842A, the compound described in JP2000-80068A, or the compound described in JP2006-342166A can be used.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. Furthermore, examples of the oxime compound also include the compounds described in J. C. S. Perkin II (1979), pp. 1653-1660, J. C. S. Perkin II (1979), pp. 156-162, Journal of Photopolymer Science and Technology (1995), pp. 202-232, and each publication of JP2000-66385A, JP2000-80068A, JP2004-534797A, and JP2006-342166A, and the like. As the commercially available products thereof, IRGACURE OXE01 (manufactured by BASF) and IRGACURE OXE02 (manufactured by BASF) are also suitably used. In addition, TR-PBG-304 (manufactured by Changzhou Tronly New Electronic Materials Co., Ltd.), ADEKA ARKLS NCI-930 (manufactured by ADEKA Corporation), and ADEKA OPTOMER N-1919 (manufactured by ADEKA Corporation) can also be used.

Furthermore, as oxime compounds other than the above, the compounds described in JP2009-519904A in which oxime is linked to an N-position of carbazole, the compounds described in U.S. Pat. No. 7,626,957B in which a hetero-substituent is introduced into a benzophenone moiety, the compounds described in JP2010-15025A and US2009-292039A in which a nitro group is introduced into a coloring agent moiety, the ketoxime compounds described in WO2009/131189A, the compounds described in U.S. Pat. No. 7,556,910B, which contain a triazine skeleton and an oxime skeleton in the same molecule, the compounds described in JP2009-221114A, which have a maximum absorption wavelength at 405 nm and have excellent sensitivity to a light source of g-rays, the compounds described in paragraph Nos. 0076 to 0079 of JP2014-137466A, and the like, may be used.

Preferably, reference can be made to, for example, paragraphs 0274 to 0275 of JP2013-29760A, the contents of which are incorporated herein by reference.

Specifically, the oxime compound is preferably a compound represented by Formula (OX-1). Incidentally, the oxime compound may be an oxime compound in which an N—O bond of oxime forms an (E) isomer, an oxime compound in which the N—O bond of oxime forms a (Z) isomer, or an oxime compound in which the N—O bond forms a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in Formula (OX-1), an alkylene group having 1 to 12 carbon atoms, a cycloalkylene group, or an alkynylene group is preferable. These groups may have one or more substituents. Examples of the substituent include the above-mentioned substituents.

In the present invention, an oxime compound having a fluorene ring can also be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A. The contents of the publications are incorporated herein by reference.

In the present invention, an oxime compound having a nitro group can also be used as the photopolymerization initiator. The oxime compound having a nitro group is preferably used in the form of a dimer. Specific examples of the oxime compound having a nitro group include the compounds described in paragraphs 0031 to 0047 of JP2013-114249 and paragraphs 0008 to 0012, and 0070 to 0079 of JP2014-137466A, the compounds described in paragraphs 0007 to 0025 of JP4223071B, and ADEKA ARKLS NCI-831 (manufactured by ADEKA Corporation).

Specific examples of the oxime compound which is preferably used in the present invention are shown below, but the present invention is not limited thereto.

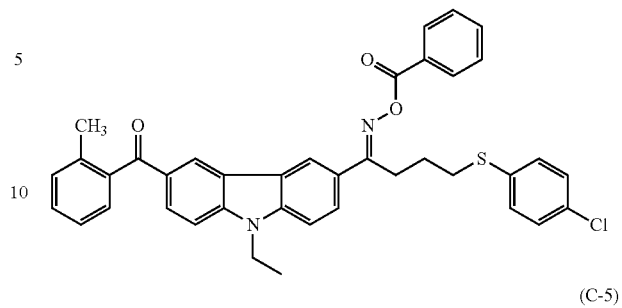

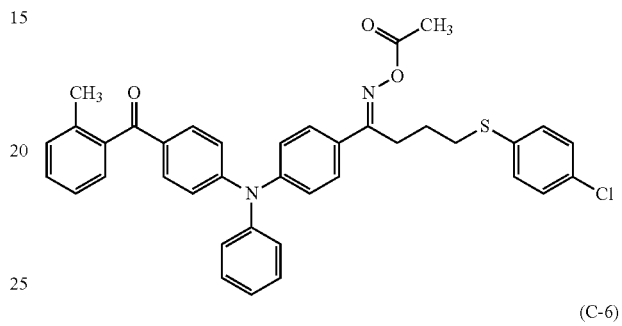

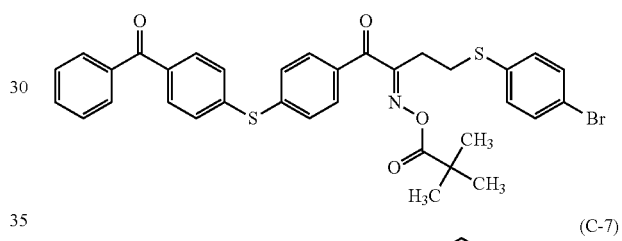

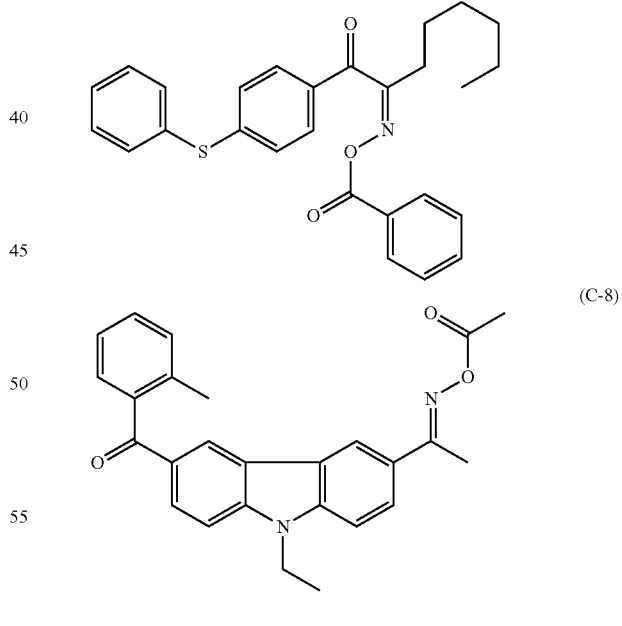

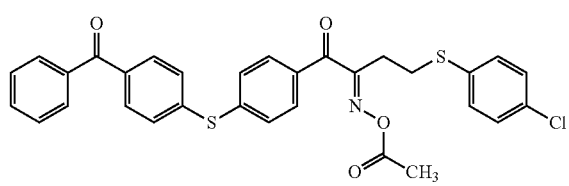

The oxime compound is the compound having a maximum absorption wavelength in a wavelength range of preferably 350 nm to 500 nm, more preferably the compound having an absorption wavelength in a wavelength range of 360 nm to 480 nm, and particularly preferably the compound having a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, and specifically, it is preferable to measure the molar light absorption coefficient by means of, for example, an ultraviolet and visible light spectrophotometer (Cary-5 spectrophotometer manufactured by Varian) by using an ethyl acetate solvent at a concentration of 0.01 g/L.

In the present invention, it is also preferable that the photopolymerization initiator is used in combination of two or more kinds thereof. For example, it is preferable to use a combination of a photopolymerization initiator with a light absorption coefficient at 365 nm in methanol of $1.0 \times 10^3$ mL/gcm or more and a photopolymerization initiator with an absorption coefficient at 365 nm in methanol of $1.0 \times 10^2$ mL/gcm or less and an absorption coefficient at 254 nm in methanol of $1.0 \times 10^3$ mL/gcm or more. Specific examples of use of combinations include use of a combination of an aminoacetophenone compound and an oxime compound. According to this aspect, it is possible to produce a film having excellent curability even under a low-temperature condition. For example, in the pattern forming step, by exposing the composition in two steps before the developing step and after the developing step, the composition can be suitably cured with the initial exposure, and approximately the entirety of the composition can be cured by the next exposure. As a result, the curability of the composition can be improved even under the low-temperature condition.

<<Coloring Inhibitor>>

The composition of the present invention preferably contains a coloring inhibitor.

The coloring inhibitor can also be used as the antioxidant described in the present specification and the antioxidant can also be used as the coloring inhibitor.

Examples of the coloring inhibitor include a phenol compound, a phosphorous acid ester compound, and a thioether compound, and the coloring inhibitor is more preferably a phenol compound having a molecular weight of 500 or more, a phosphorous acid ester compound having a molecular weight of 500 or more, or a thioether compound having a molecular weight of 500 or more is more preferable. Further, the coloring inhibitor is preferably a phenol compound, and more preferably a phenol compound having a molecular weight of 500 or more.

As the phenol compound, any of phenol compounds known as the phenol-based coloring inhibitor can be used. Preferred examples of the phenol compound include a hindered phenol compound. Particularly, a compound having a substituent at a site (ortho-position) adjacent to the phenolic hydroxyl group is preferable. As the above-mentioned substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. Further, a compound having a phenol group and a phosphorous acid ester group in the same molecule is also preferable.

As the phenol-based hydroxyl group-containing compound, in particular, multi-substituted phenol compounds are preferably used.

The multi-substituted phenol-based compounds are mainly classified into three types having different substitution positions and structures, based on reactivity to peroxy radicals due to stable phenoxy radical generation, as follows: a hindered type of Formula (A), a semi-hindered type of Formula (B), and a less-hindered type of Formula (C).

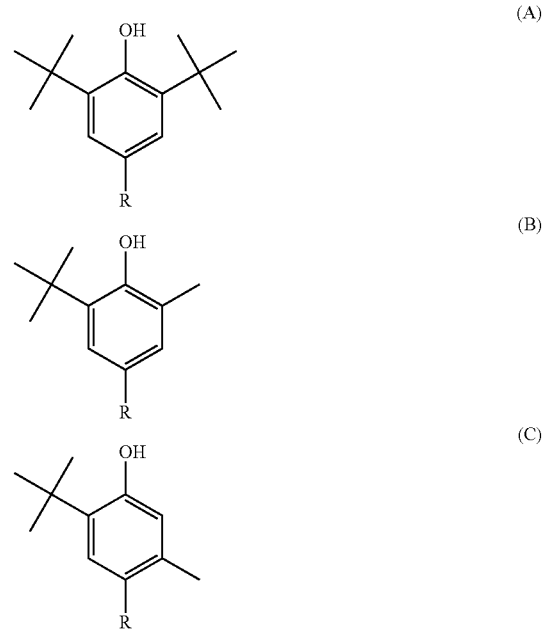

In Formulae (A) to (C) that are structural moieties expressing a coloration-preventing function, R is a substituent, and examples thereof include a hydrogen atom, a halogen atom, an amino group which may have a substituent, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Among those, the amino group which may have a substituent, the alkyl group which may have a substituent, the aryl group which may have a substituent, the alkoxy group which may have a substituent, the aryloxy group which may have a substituent, the alkylamino group which may have a substituent, or the arylamino group which may have a substituent is preferable.

In a more preferred embodiment, the compound is a composite type coloring inhibitor in which a plurality of structures expressing a coloration-preventing function, represented by Formulae (A) to (C) are present, in the same molecule, and specifically, the compound preferably has 2 to 4 structures expressing a coloration-preventing function, represented by Formulae (A) to (C) in the same molecule. Among these, the semi-hindered type of Formula (B) is more preferable from the viewpoint of coloring properties.

Examples of the phenol-based hydroxyl group-containing compound include a compound selected from the group consisting of paramethoxyphenol, di-t-butyl-paracresol, pyrogallol, t-butylcatechol, 4,4-thiobis(3-methyl-6-t-butyl-phenol), 2,2'-methylenebis(4-methyl-6-t-butylphenol), phenol resins, and cresol resins.

As representative examples of the coloring inhibitor which is available as a commercially available product, examples of (A) include Sumilizer BHT (manufactured by Sumitomo Chemical Co., Ltd.), Irganox 1010 and 1222

(manufactured by BASF), and ADK STAB AO-20, AO-50, and AO-60 (manufactured by ADEKA Corporation); examples of (B) include Sumilizer BBM-S (manufactured by Sumitomo Chemical Co., Ltd.), Irganox 245 (manufactured by BASF), ADK STAB AO-80 (manufactured by ADEKA Corporation); and examples of (C) include ADK STAB AO-30 and AO-40 (manufactured by ADEKA Corporation).

Examples of the phosphorous acid ester compound include at least one compound selected from the group consisting of tris[2-[[2,4,8,10-tetrakis(1,1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-ditert-butyl-6-methylphenyl) phosphite.

Preferred examples of the thioether compound include dialkylthiodipropionates such as dilauryl thiodipropionate, dimyristyl thiodipropionate, and distearyl thiodipropionate, and pentaerythritol tetra(β-propionic acid)esters; pentaerythritol tetrakis(3-laurylthiopropionate), dilauryl-3,3'-thiodipropionate, dimyristyl-3,3'-thiodipropionate, distearyl-3,3'-thiodipropionate, and the like; tetrakis[methylene-3-(laurylthio)propionate]methane, bis(methyl-4-[3-n-alkyl(C12/C14)thiopropionyloxy]5-t-butylphenyl) sulfide, ditridecyl-3,3'-thiodipropionate, dilauryl-3,3'-thiodipropionate, dimyristyl-3,3'-thiodipropionate, distearyl-3,3'-thiodipropionate, lauryl/stearyl thiodipropionate, 4,4'-thiobis(6-t-butyl-m-cresol), 2,2'-thiobis(6-t-butyl-p-cresol), and distearyl-disulfide.

Representative examples of the coloring inhibitor which is available as a commercially available product of the thioether compound include ADEKA STAB AO-412S (CAS: 29598-76-3, manufactured by ADEKA Corporation), ADEKA STAB AO-503 (CAS: 10595-72-9, manufactured by ADEKA Corporation), and KEMINOX PLS (CAS: 29598-76-3, manufactured by Chemipro Kasei Kaisha, Ltd.).

The coloring inhibitor is easily available as a commercially available product, and representative examples of the coloring inhibitor which is available as a commercially available product other than the above coloring inhibitors include ADEKA STAB AO-50F, ADEKA STAB AO-60G, ADEKA STAB AO-330, and ADEKA STAB PEP-36A (ADEKA Corporation).

From the viewpoints of coloring properties and solvent resistance, the content of the coloring inhibitor is preferably 0.01% to 20% by mass, more preferably 0.1% to 15% by mass, and particularly preferably 0.3% to 5% by mass, with respect to the total solid content of the composition. The coloring inhibitor may be used singly or in combination of two or more kinds thereof. In a case where the coloring inhibitors are used in combination of two or more kinds thereof, the total amount thereof preferably falls within the range.

<<Ultraviolet Absorber>>

The composition of the present invention may contain an ultraviolet absorber. As the ultraviolet absorber, a conjugated diene-based compound is preferable, and a compound represented by Formula (I) is more preferable.

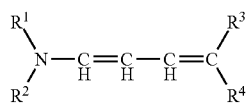

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the may be the same as or different from each other, but represent a hydrogen atom at the same time in no case.

$R^1$ and $R^2$ may form a cyclic amino group with a nitrogen atom to which $R^1$ and $R^2$ are bonded to. Examples of the cyclic amino group include a piperidino group, a morpholino group, a pyrrolidino group, a hexahydroazepino group, and a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each independently represent an electron-withdrawing group. Here, the electron-withdrawing group is an electron-withdrawing group having a Hammett's substituent constant, a $\sigma_p$ value (hereinafter simply referred to as "$\sigma_p$ value") from 0.20 to 1.0. The electron-withdrawing group is preferably an electron-withdrawing group having a $\sigma_p$ value from 0.30 to 0.8. $R^3$ and $R^4$ may be bonded to each other to form a ring. $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

Furthermore, at least one of $R^1$, $R^2$, $R^3$, or $R^4$ may be in the form of a polymer derived from a monomer which is bonded to a vinyl group via a linking group. A copolymer with other monomers may be used.

Specific examples of the ultraviolet absorber represented by Formula (I) include the following compounds. With regard to the descriptions of the substituent of the ultraviolet absorber represented by Formula (I)) reference can be made to paragraphs 0024 to 0033 of WO2009/123109A (<0040> to <0059> of the corresponding US2011/0039195A, the contents of which are incorporated herein by reference. With regard to specific preferred examples of the compound represented by Formula (I), reference can be made to the exemplary compounds (1) to (14) in paragraphs 0034 to 0037 of WO2009/123109A (<0060> of the corresponding US2011/0039195A), the contents of which are incorporated herein by reference.

Specific examples of the ultraviolet absorber represented by Formula (I) include the following compound (an ultraviolet absorber J-1 used in Examples which will be described later).

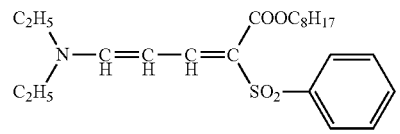

From the viewpoints of a pattern shape and solvent resistance, the content of the ultraviolet absorber is preferably 0.1% to 10% by mass, more preferably 0.1% to 7% by mass, particularly preferably 0.1% to 5% by mass, and still more preferably 0.1% to 3% by mass, with respect to the total solid content of the composition. Further, in the present invention, the ultraviolet absorber may be used singly or in combination of two or more kinds thereof. In a case where the ultraviolet absorbers are used in combination of two or more kinds thereof, the total amount thereof preferably falls within the range.

<<Adhesive>>

The composition of the present invention preferably further contains an adhesive. The adhesive is not particularly limited, and known adhesives can be used. Examples of the adhesive include a silane coupling agent. According to this aspect, the adhesiveness of a film to a substrate can be improved.

In the present invention, the silane coupling agent means a silane compound having a hydrolyzable group and other functional groups. Further, the hydrolyzable group refers to a substituent which can be directly linked to a silicon atom to generate a siloxane bond by at least one of a hydrolysis reaction or a condensation reaction. Examples of the hydrolyzable group include a halogen atom, an alkoxy group, and an acyloxy group, with the alkoxy group being preferable. That is, the silane coupling agent is preferably a compound having an alkoxysilyl group. Further, a functional group other than the hydrolyzable group preferably has a group which interacts with a resin or forms a bond, and thus, exhibits affinity. Examples thereof include a (meth)acryloyl group, a phenyl group, a mercapto group, an epoxy group, and an oxetanyl group, with the (meth)acryloyl group and the epoxy group being preferable. That is, the silane coupling agent is preferably a compound having at least one of an alkoxysilyl group, a (meth)acryloyl group, or an epoxy group.

The number of carbon atoms of the alkoxy groups in the alkoxysilyl group is preferably 1 to 5, more preferably 1 to 3, and particularly preferably 1 or 2. The number of alkoxysilyl groups contained in the same molecule is preferably 2 or more, and more preferably 2 or 3.

Specific examples of the silane coupling agent include 3-methacryloxypropyltrimethoxysilane, 3-methacryloxypropyltriethoxysilane, 3-acryloxypropyltrimethoxysilane, 3-acryloxypropyltriethoxysilane, 3-mercaptopropyltrimethoxysilane, 3-aminopropyltriethoxysilane, phenyltrimethoxysilane, methyltrimethoxysilane, dimethyldimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, hexamethyldisilanzane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, para-styryltrimethoxysilane, 3-methacryloxypropylmethyldimethoxysilane, 3-methacryloxypropylmethyldiethoxysilane, N-2-(aminomethylethyl)-3-aminopropylmethyldimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-triethoxysilyl-N-(1,3-dimethyl-butylidene)propylamine, N-phenyl-3-aminopropyltrimethoxysilane, a basic salt of N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, bis(triethoxysilylpropyl)tetrasulfide, and 3-isocyanatopropyltriethoxysilane. Incidentally, in addition to the silane coupling agents, an alkoxy oligomer can be used. Further, the following compounds can also be used.

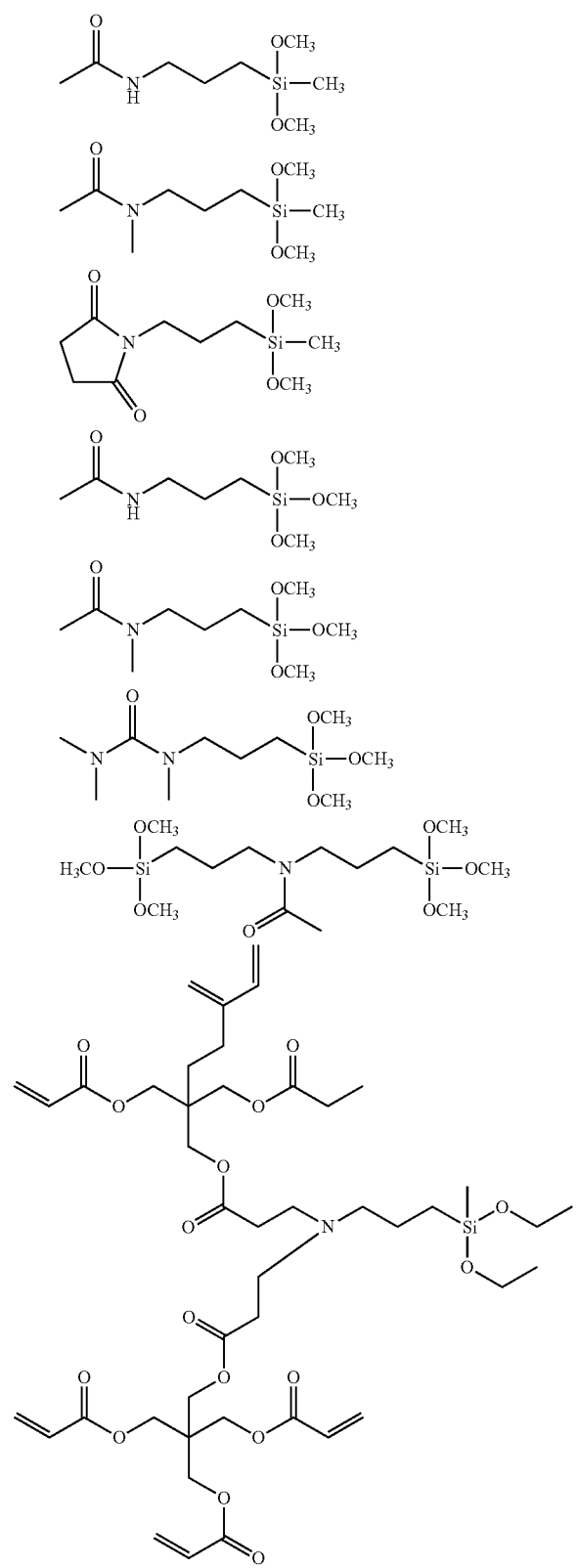

Examples of a commercially available product thereof include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238, manufactured by Shin-Etsu Chemical Co., Ltd. Further, examples of the silane coupling agent include the compounds described in paragraph Nos. 0018 to 0036 of JP2009-288703A, and the compounds described in paragraphs 0056 to 0066 of JP2009-242604A, the contents of which are incorporated herein by reference.

In addition, for the compound having an alkoxysilyl group, a polymer having an alkoxysilyl group in a side chain can also be used.

As the silane coupling agent, the specific silane compounds described in <0011> to <037> of JP2009-288703A can also be used by reference, the contents of which are incorporated herein by reference.

The content of the adhesive is preferably 0.01% to 10% by mass, more preferably 0.1% to 7% by mass, and particularly preferably 1% to 5% by mass, with respect to the total solid content of the composition. The content within these ranges is preferable from the viewpoints of adhesiveness and defects. Further, in the present invention, the adhesive contained in the composition may be used singly or in combination of two or more kinds thereof. In a case where the adhesives are used in combination of two or more kinds thereof, the total amount thereof preferably falls within the range.

<<Chain Transfer Agent>>

The composition of the invention preferably contains a chain transfer agent. According to this aspect, it is possible to accelerate the curing of a film surface (pattern surface) in the exposure during pattern formation. Thus, reduction in the film thickness during the exposure, and the like can be suppressed, and a pattern having more excellent rectangularity and adhesiveness is easily formed.

Examples of the chain transfer agent include an alkyl N,N-dialkylaminobenzoae ester and a thiol compound, with the thiol compound being preferable. As the chain transfer agent, the thiol compound is preferably a compound having 2 or more (preferably 2 to 8, and more preferably 3 to 6) mercapto groups in the molecule thereof. Specific examples of the thiol compound include a heterocycle-containing thiol compound such as 2-mercaptobenzothiazole, 2-mercaptobenzoxazole, 2-mercaptobenzimidazole, N-phenylmercaptobenzimidazole, and 1,3,5-tris(3-mercaptobutyloxyethyl)-1,3,5-triazine-2,4,6(1H,3H,5H)-trione, and an aliphatic thiol compound such as pentaerythritoltetrakis(3-mercaptobutyrate) and 1,4-bis(3-mercaptobutyryloxy)butane.

Furthermore, examples of the commercially available product of the chain transfer agent include PEMP (manufactured by SC Organic Chemical Co., Ltd., thiol compound), SANCELER M manufactured by Sanshin Chemical Industry Co., Ltd., thiol compound), and KARENZ MT BD1 (manufactured by Showa Denko K. K., thiol compound).

Furthermore, the following compounds are also preferably used.

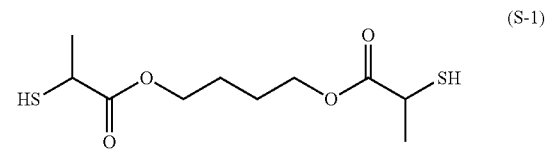
(S-1)

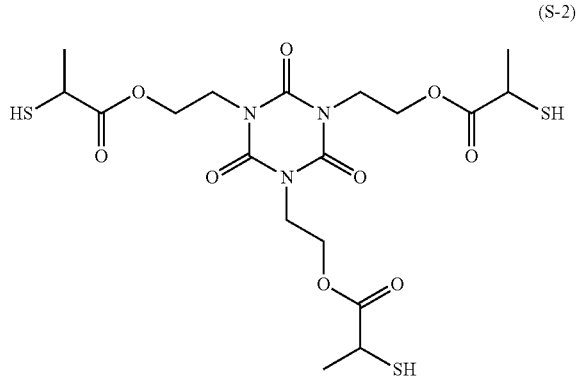
(S-2)

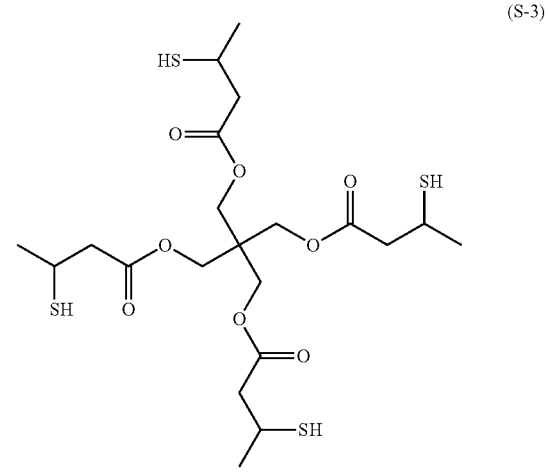
(S-3)

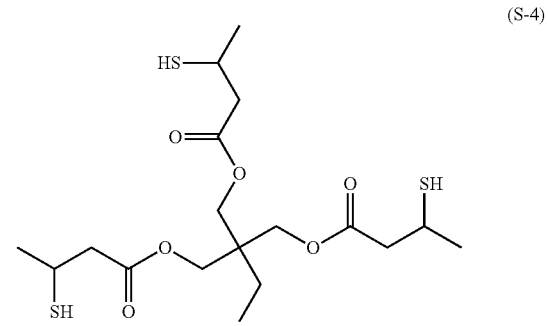
(S-4)

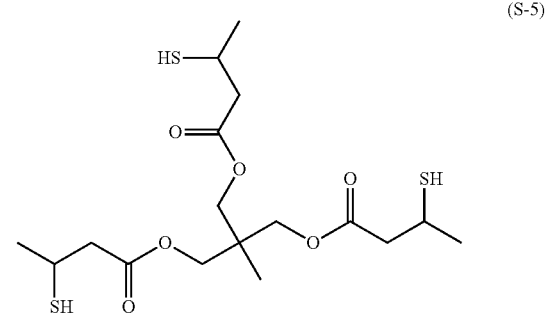
(S-5)

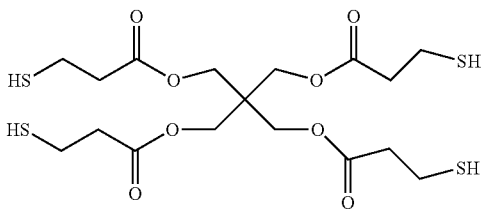
(S-6)

The content of the chain transfer agent is preferably 0.2% to 5.0% by mass, and more preferably 0.4% to 3.0% by mass, with respect to the total solid content of the composition.

The content of the chain transfer agent is preferably 1 to 40 parts by mass, and more preferably 2 to 20 parts by mass, with respect to 100 parts by mass of the polymerizable compound.

The chain transfer agent may be used singly or in combination of two or more kinds thereof. In a case where the chain transfer agents are used in combination of two or more kinds thereof, the total amount thereof preferably falls within the range.

<<Sensitizer>>

The composition of the present invention may contain a sensitizer for the purposes of improving radical generation efficiency of the photopolymerization initiator, and shifting the sensitive wavelength to a longer wavelength. The sensitizer preferably sensitizes the photopolymerization initiator by the electron transfer mechanism or the energy transfer mechanism. Examples of the sensitizer include sensitizers that belong to the compounds to be listed below and have an absorption wavelength in the wavelength range of 300 nm to 450 nm. Specifically, reference can be made to the descriptions in paragraphs 0231 to 0253 of JP2010-106268A (<0256> to <0273> of the corresponding US2011/0124824A), the contents of which are incorporated herein by reference.

The content of the sensitizer is preferably 0.1% to 20% by mass, and more preferably 0.5% to 15% by mass, with respect to the total solid content of the composition. The sensitizer may be used singly or in combination of two or more kinds thereof. In a case where the sensitizers are used in combination of two or more kinds thereof, the total amount thereof preferably falls within the range.

<<Co-Sensitizer>>

It is also preferable that the composition of the present invention further contains a co-sensitizer. The co-sensitizer has functions of further improving the sensitivity of the photopolymerization initiator (E) or a sensitizer to the active radiation, suppressing the polymerization inhibition of the polymerizable compound due to oxygen, and the like. With regard to the co-sensitizer, specifically, reference can be made to the descriptions in paragraphs 0254 to 0257 of JP2010-106268A (<0277> to <0279> of the corresponding US2011/0124824A), the contents of which are incorporated herein by reference.

The content of the co-sensitizer is preferably 0.1% to 30% by mass, more preferably 1% to 25% by mass, and still more preferably 1.5% to 20% by mass, with respect to the total solid content of the composition, from the viewpoint of increasing the polymerization growth rate and the curing rate. The co-sensitizer may be used singly or in combination of two or more kinds thereof. In a case where the co-sensitizers are used in combination of two or more kinds thereof, the total amount thereof preferably falls within the range.

<<Polymerization Inhibitor>>

It is preferable that a polymerization inhibitor is added to the composition of the present invention in order to inhibit unnecessary polymerization of a polymerizable compound and the like during production or preservation of the composition.

Examples of the polymerization inhibitor include:

a compound containing a phenol-based hydroxyl group (preferably a compound selected from the group consisting of hydroquinone, para-methoxyphenol, di-t-butyl-para-cresol, pyrogallol, t-butyl catechol, benzoquinone, 4,4-thio-bis(3-methyl-6-t-butyl phenol), 2,2'-methylenebis(4-methyl-6-t-butyl phenol), 2,6-di-t-butyl-4-methylphenol (BHT), phenolic resins, and cresol resins);

N-oxide compounds (preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide);

piperidine 1-oxyl free radical compounds (preferably a compound selected from the group consisting of piperidine 1-oxyl free radicals, 2,2,6,6-tetramethylpiperidine 1-oxyl free radicals, 4-oxo-2,2,6,6-tetramethylpiperidine 1-oxyl free radicals, 4-hydroxy-2,2,6,6-tetramethylpiperidine 1-oxyl free radicals, 4-acetamido-2,2,6,6-tetramethylpiperidine 1-oxyl free radicals, 4-maleimide 2,2,6,6-tetramethylpiperidine 1-oxyl free radicals, and 4-phosphonoxy-2,2,6,6-tetramethylpiperidine 1-oxyl free radicals);

pyrrolidine 1-oxyl free radical compounds (preferably 3-carboxy proxy free radicals (3-carboxy-2,2,5,5-tetramethylpyrrolidine 1-oxyl free radicals));

N-nitroso phenyl hydroxylamines (preferably a compound selected from the group consisting of an N-nitrosophenylhydroxylamine cerous salt and an N-nitrosophenylhydroxylamine aluminum salt);

diazonium compounds (preferably a compound selected from the group consisting of hydrogen sulfate of 4-diazophenyldimethylamine, tetrafluoroborate of 4-diazodiphenylamine, and hexafluorophosphate of 3-methoxy-4-diazodiphenylamine);

cationic dyes;

sulfide group-containing compounds;

nitro group-containing compounds; and transition metal compounds such as $FeCl_3$ and $CuCl_2$. Further, these compounds may be composite compounds in which a plurality of structures showing a polymerization inhibition function, such as a phenol skeleton and a phosphorus-containing skeleton, are present in the same molecule. For example, the compounds described in JP1998-46035A (JP-H10-46035A) and the like are also suitably used.

Specific examples of the polymerization inhibitor include the compounds described in paragraphs 0211 to 0223 of JP2015-34961A, the contents of which are incorporated herein by reference.

The content of the polymerization inhibitor is preferably 0.01 parts by mass to 10 parts by mass, more preferably 0.01 to 8 parts by mass, and most preferably 0.01 to 5 parts by mass, with respect to 100 parts by mass of the photopolymerization initiator. By setting the content within the range, suppression of a curing reaction in a non-image area and acceleration of a curing reaction in an image area are sufficiently performed, and thus, the pattern shape and the sensitivity are improved. The polymerization inhibitor may be used singly or in combination of two or more kinds thereof. In a case where the polymerization inhibitors are used in combination of two or more kinds thereof, the total amount thereof preferably falls within the range.

<<Surfactant>>

From the viewpoint of further improving coatability, various surfactants may be incorporated into the composition of the present invention. As the surfactant, various surfactants such as a fluorine-based surfactant, a cationic surfactant, an anionic surfactant, and a silicon-based surfactant can be used.

By incorporating a fluorine-based surfactant into the composition of the present invention, liquid characteristics (in particular, fluidity) in a case of preparation of a coating liquid using the composition are further improved, and thus, the evenness of coating thickness or liquid saving properties can be further improved. That is, in a case where a film is formed using a coating liquid to which a composition containing a fluorine-based surfactant has been applied, the interface tension between a surface to be coated and the coating liquid is reduced to improve wettability with respect to the surface to be coated, and enhance coatability with respect to the surface to be coated. Thus, a film with an even thickness which exhibits a small extent of thickness unevenness can be more suitably formed.

The fluorine content in the fluorine-based surfactant is preferably 3% to 40% by mass, more preferably 5% to 30% by mass, and particularly preferably 7% to 25% by mass. The fluorine-based surfactant having a fluorine content which falls within the above-mentioned range is effective in terms of the thickness evenness of the coating film and the liquid saving properties, and the solubility in the composition is also good.

Specific examples of the fluorine-based surfactant include the surfactants described in paragraphs 0060 to 0064 of JP2014-41318A (paragraphs 0060 to 0064 of the pamphlet of the corresponding WO2014/17669A) and the like, and the surfactants described in paragraphs 0117 to 0132 of JP2011-132503A, and the contents of the publications are incorporated herein by reference. Examples of a commercially available product of the fluorine-based surfactant include MEGAFACE F-171, MEGAFACE F-172, MEGAFACE F-173, MEGAFACE F-176, MEGAFACE F-177, MEGAFACE F-141, MEGAFACE F-142, MEGAFACE F-143, MEGAFACE F-144, MEGAFACE R30, MEGAFACE F-437, MEGAFACE F-475, MEGAFACE F-479, MEGAFACE F-482, MEGAFACE F-554, and MEGAFACE F-780 (all manufactured by DIC Corporation), FLUORAD FC430, FLUORAD FC431, and FLUORAD FC171 (all manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PolyFox PF636, PF656, PF6320, PF6520, and PF7002 (manufactured by OMNOVA Solutions Inc.).

As the fluorine-based surfactant, a block polymer can also be used. Examples thereof include the compounds described in JP2011-89090A. For the fluorine-based surfactant, a fluorine-containing polymer compound including a repeating unit derived from a (meth)acrylate compound having a fluorine atom and a repeating unit derived from a (meth) acrylate compound having 2 or more (preferably 5 or more) alkyleneoxy groups (preferably ethyleneoxy groups or propyleneoxy groups) can also preferably used. The following compounds are also exemplified as a fluorine-based surfactant for use in the present invention.

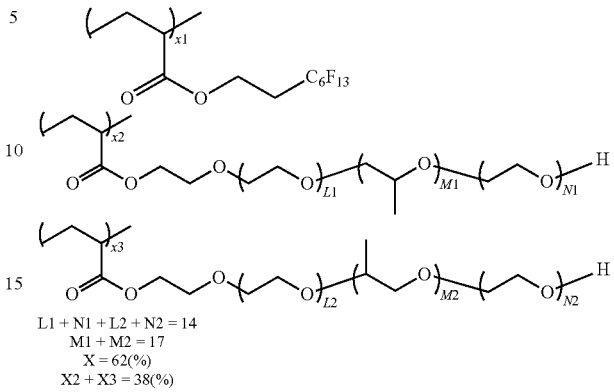

The weight-average molecular weight of the compounds is preferably 3,000 to 50,000, and is, for example, 14,000.

Furthermore, for the fluorine-based surfactant, a fluorine-containing polymer having an ethylenically unsaturated bond-containing group in a side chain can also be used. Specific examples thereof include the compounds described in paragraphs 0050 to 0090 and paragraphs 0289 to 0295 of JP2010-164965A, such as MEGAFACE RS-101, RS-102, RS-718K, and RS-72-K, all manufactured by DIC Corporation. For the fluorine-based surfactant, the compounds described in paragraphs 0015 to 0158 of JP2015-117327A can also be used.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters, PLURONIC L10, L31, L61, L62, 10R5, 17R2, and 25R2 (manufactured by BASF Corporation), TETRONIC 304, 701, 704, 901, 904, and 150R1 (manufactured by BASF Corporation), Solsperse 20000 (manufactured by Lubrizol Japan Ltd.), NCW-101, NCW-1001, and NCW-1002 (manufactured by Wako Pure Chemical Industries, Ltd.), PIONIN D-6112, D-6112-W, and D-6315 (manufactured by Takemoto Oil & Fat Co., Ltd.), OLFINE E1010, and SURFYNOL 104, 400, and 440 (manufactured by Nissin Chemical Co., Ltd.).

Examples of the cationic surfactant include an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Examples of the anionic surfactant include W004, W005, and W017 (manufactured by Yusho Co., Ltd.), and Sandet B L (manufactured by Sanyo Kasei Co., Ltd.).

Examples of the silicone-based surfactant include SILICONE DC3PA manufactured by Toray Dow Corning Co., Ltd., SILICONE SH7PA manufactured by Toray Dow Corning Co., Ltd., SILICONE DC11PA manufactured by Toray Dow Corning Co., Ltd., SILICONE SH21PA manufactured by Toray Dow Corning Co., Ltd., SILICONE SH28PA manufactured by Toray Dow Corning Co., Ltd., SILICONE SH29PA manufactured by Toray Dow Corning Co., Ltd., SILICONE SH30PA manufactured by Toray Dow Corning Co., Ltd., and SILICONE SH8400 (all manufactured by Toray Dow Corning Co., Ltd.), TSF-4440, TSF-4300, TSF-4445, TSF-4460, and TSF-4452 (all manufactured by Momentive Performance Materials Co., Ltd.), KP341, KF6001, and KF6002 (all manufactured by Shin-Etsu Chemical Co., Ltd.), and BYK307, BYK323, and BYK330 (all manufactured by BYK Chemie).

The surfactant may be used singly or in combination of two or more kinds thereof.

The content of the surfactant is preferably 0.001% by mass to 2.0% by mass, and more preferably 0.005% to 1.0% by mass, with respect to the total solid content of the composition.

<<Other Additives>>

Furthermore, a known additive such as a plasticizer and a sensitizer may be added to the composition in order to improve the physical properties of a film or a cured film. Examples of the plasticizer include dioctyl phthalate, didodecyl phthalate, triethylene glycol dicaprylate, dimethyl glycol phthalate, tricresyl phosphate, dioctyl adipate, dibutyl sebacate, and tryacetyl glycerin. The content of the plasticizer is preferably 10% by mass or less with respect to the total mass of the polymerizable compound and the resin.

<Method of Preparing Composition>

The above-mentioned composition can be prepared by mixing the above-mentioned components.

In the preparation of the composition, the respective components may be mixed with each other collectively or may be mixed with each other sequentially after at least one of being dissolved or being dispersed in a solvent. In addition, the order of addition or working conditions during blending is not particularly limited.

Furthermore, examples of a process for dispersing a pigment include processes using compression, pressing, impact, shear, cavitation, and the like as a mechanical force used to disperse the pigment. Specific examples of these processes include a beads mill, a sand mill, a roll mill, a high-speed impeller, a sand grinder, a flow jet mixer, high-pressure wet atomization, and ultrasonic dispersion. In addition, the process and dispersing machine described in "Dispersion Technology Comprehension" issued by Johokiko Co., Ltd., Jul. 15, 2005; and "Actual comprehensive data collection on dispersion technology and industrial application centered on suspension (solid/liquid dispersion system), issued by Publication Department, Management Development Center, Oct. 10, 1978" can be suitably used.

It is preferable that in the preparation of the composition, filtration is performed using a filter for the purpose of removing foreign matters, reducing defects, or the like. As the filter, any filters that have been used in the related art for filtration use and the like may be used without particular limitation. Examples of the filter include filters using materials including, for example, a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform and smooth composition in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

[Film]

In a first aspect, the film of the present invention is a film formed using the composition of the present invention.

In a second aspect, the film of the present invention contains at least one of particles having an average primary particle diameter of 50 to 150 nm or particles having an average major axis length of 50 to 150 nm, and a resin, in which the film has an L* in an L*a*b* color space of CIE 1976 of 35 to 75.

<L*>

The film of the present invention preferably has an L* in an L*a*b* color space of CIE 1976 of 35 to 75. The film more preferably has an upper limit of the L* in an L*a*b* color space of CIE 1976 of 70 or less. The lower limit of the L* in an L*a*b* color space of CIE 1976 of the film is more preferably 40 or more, and particularly preferably 50 or more. Further, the L* in a second aspect is measured by the same method as the method described in Examples except that only the film thickness is changed to one in the first aspect.

<a* and b*>

The film of the present invention has a* and b* in an L*a*b* color space of CIE 1976 of preferably −30 to 30, more preferably −20 to 20, and particularly preferably −10 to 10.

<Thickness>

The thickness of the film of the present invention is preferably 10 µm or less, more preferably 3 µm or less, and particularly preferably 1 µm or less. The lower limit value of the thickness is preferably 0.5 µm or more.

<Average Transmittance>

The average transmittance of the film of the present invention in a case where the film has a thickness of 3 µm at a wavelength of 400 to 700 nm is preferably 1% or more, more preferably 10% or more, and particularly preferably 30% or more. The upper limit value of the average transmittance at a wavelength of 400 to 700 nm is preferably 50% or less.

<Applications>

The film of the present invention can be used in the state of being incorporated into various sensors such as a solid-state imaging device or an image display device (for example, a liquid crystal display device and an organic electroluminescence (organic EL) display device). In addition, it can also be used as a material for an application of appearance adjustment of an optical member.

For example, the film of the present invention can also be incorporated into various sensors or image display devices, and used as a member that appropriately shields or transmits light or as a member that scatters light. Further, it can also be used in light emitting diode (LED) reflecting applications, organic EL light-scattering layer applications, conductive materials, insulating materials, materials for a solar cell, and the like.

[Cured Film]

The cured film of the present invention is a cured film obtained by curing the film of the present invention. The cured film is preferably formed by removing the solvent from the film of the present invention. Further, the cured film is preferably formed by the curing through the polymerization of the polymerizable compound of the film of the present invention.

The L* in an L*a*b* color space of CIE 1976 of the cured film of the present invention in the state of a cured film is preferably 35 to 75. The upper limit of the L* in an L*a*b* color space of CIE 1976 of the cured film of the present invention in the state of a cured film is preferably 70 or less. The lower limit of the L* in an L*a*b* color space of CIE 1976 of the cured film of the present invention in the state of a cured film is preferably 40 or more, and more preferably 50 or more.

[Optical Sensor]

The optical sensor of the present invention is an optical sensor having the cured film of the present invention. Examples of the optical sensor include a solid-state imaging device.

[Method for Producing Film]

The method for producing a film of the present invention includes a step of exposing the composition of the present invention through a mask with a pattern, and a step of developing the exposed composition to form a pattern.

It is preferable that the method includes a step of applying the composition of the present invention onto a substrate or the like to form a film and a step of drying the film before the step of exposing the composition of the present invention through a mask with a pattern. The film thickness, the laminated structure, and the like can be appropriately selected according to the purposes.

Examples of the method of applying the composition in the step of forming a film, known methods can be used. Examples thereof include a dropwise addition method (drop cast); a slit coating method; a spraying method; a roll coating method; a rotation coating method (spin coating); a cast coating method; a slit-and-spin method; a pre-wetting method (for example, the method described in JP2009-145395A); various printing methods such as ink jet (for example, an on-demand mode, a piezo mode, and a thermal mode), a discharge system such as nozzle jet, flexographic printing, screen printing, gravure printing, reverse offset printing, and metal mask printing; a transfer method using a mold or the like; and a nanoimprint method. The application method using ink jet is not particularly limited as long the composition can be discharged using this method, and examples thereof include a method (in particular, pp. 115 to 133) described in "Extension of Use of Injector-Infinite Possibilities in Patent-" (February, 2005, S.B. Research Co., Ltd.) and the methods described in JP2003-262716A, JP2003-185831A, JP2003-261827A, JP2012-126830A, and JP2006-169325A in which a composition to be discharged is replaced with the composition of the present invention. In the application using the spin coating method, from the viewpoint of coatability, spin coating is preferably carried out in the range of 300 to 6,000 rpm, and more preferably carried out in the range of 400 to 3,000 rpm. Further, a substrate temperature for spin coating is preferably 10° C. to 100° C., and more preferably 20° C. to 70° C. Within the range, the coating evenness is excellent, and thus, a film having suppressed coating unevenness is easily produced.

In a case of the dropwise addition method (drop cast), it is preferable that a dropwise addition region of a composition having a photoresist as a partition wall is formed on a substrate such that an even film with a predetermined film thickness may be obtained. A desired film thickness is obtained by adjusting the dropwise addition amount and the concentration of the solid content of the composition, and the dropwise addition area. The thickness of the film after drying is not particularly limited and can be appropriately selected according to the purpose.

The substrate is not particularly limited and can be appropriately selected according to applications. Examples of the substrate include alkali-free glass used in a liquid crystal display device and the like, soda glass, PYREX (registered trademark) glass, quartz glass, a substrate obtained by attaching a transparent conductive film to the substrate, a photoelectric conversion element substrate, a silicon substrate, or the like used in a solid-state imaging device or the like, and a complementary metal oxide film semiconductor (CMOS). Moreover, an undercoat layer may be provided on these substrates, as desired, for the purpose of improving the adhesiveness to the upper layer, preventing the diffusion of materials, or planarizing the surface.

In the step of drying the film, drying conditions vary depending on the types of the respective components and the solvent, the ratios therebetween to be used, and the like. For example, it is preferable that the film is dried at a temperature of 60° C. to 150° C. for 30 seconds to 15 minutes.

Examples of the step of exposing the composition of the present invention through a mask with a pattern, and the step of developing the exposed composition to form a pattern include a method including a step of applying the composition of the present invention to a substrate to form a composition layer having a film shape, a step of patternwise exposing the composition layer, and a step of removing an unexposed area by development to form a pattern. In the step of forming a pattern, a pattern may be formed using a photolithography method or using a dry etching method.

In the exposing step, it is preferable that the film formed on the substrate is patternwise exposed. For example, the film formed on the substrate can be patternwise exposed by performing exposure through a mask having a predetermined mask pattern, using an exposure device such as a stepper. Thus, the exposed area can be cured.

As the radiation (light) which can be used during the exposure, ultraviolet rays such as g-rays and i-rays (particularly preferably i-rays) are preferably used. For example, the irradiation dose (exposure dose) is preferably 0.03 to 2.5 J/cm$^2$, and more preferably 0.05 to 1.0 J/cm$^2$.

The oxygen concentration during the exposure can be appropriately selected, and the exposure may also be performed, for example, in a low-oxygen atmosphere having an oxygen concentration of 19% by volume or less (for example, 15% by volume or less, 5% by volume or less, and substantially oxygen-free) or in a high-oxygen atmosphere having an oxygen concentration of more than 21% by volume (for example, 22% by volume or more, 30% by volume or more, and 50% by volume or more). Further, the exposure illuminance can be appropriately set, and can be usually selected from a range of 1,000 W/m$^2$ to 100,000 W/m$^2$ (for example, 5,000 W/m$^2$ or more, 15,000 W/m$^2$ or more, or 35,000 W/m$^2$ or more). Appropriate conditions of each of the oxygen concentration and the exposure illuminance may be combined, and for example, a combination of an oxygen concentration of 10% by volume and an illuminance of 10,000 W/m$^2$, a combination of an oxygen concentration of 35% by volume and an illuminance of 20,000 W/m$^2$, or the like is available.

Next, the unexposed area is preferably removed by development to form a pattern. The removal of the unexposed area by development can be carried out using a developer. Thus, the composition layer of the unexposed area in the exposing step is eluted into the developer, and as a result, only a photocured portion remains. As the developer, an alkali developer causing no damage on an underlying circuit or the like is preferable. As the developer, a solvent described in the present specification may also be used to perform development. The temperature of the developer is preferably, for example, 20° C. to 30° C. The development time is preferably 20 to 180 seconds, and more preferably 20 to 90 seconds.

Examples of the alkali agent used for the alkali developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, choline, pyrrole, piperidine, 1,8-diazabicyclo-[5,4,0]-7-undecene, and dimethylbis(2-hydroxyethyl)ammonium hydroxide. An aqueous alkaline solution obtained by diluting the alkali agent with pure water to have a concentration of 0.001% to 10% by mass, and preferably 0.01% to 1% by mass is preferably used as the developer.

In addition, an inorganic alkali may be used in the developer. Preferred examples of the inorganic alkali include sodium hydroxide, potassium hydroxide, sodium carbonate, sodium hydrogen carbonate, sodium silicate, and sodium metasilicate.

Furthermore, a surfactant may also be used in the developer. Examples of the surfactant include the surfactants described as the above-mentioned composition, with a nonionic surfactant being preferable.

Incidentally, in a case where a developer composed of such an aqueous alkaline solution is used, it is generally preferable that washing (rinsing) with pure water is performed after development.

The method may include other steps. Such other steps are not particularly limited, and can be appropriately selected depending on the purposes. Examples of such other steps include a surface treatment step for a substrate, a pre-heating step (pre-baking step), a curing step, and a post-heating step (post-baking step). After development, at least one of heating or exposure may further be carried out. According to this aspect, curing of the film can further be performed to produce a film which has been more rigidly cured.

A heating temperature in the pre-heating step and the post-heating step is preferably 80° C. to 200° C. The upper limit is more preferably 150° C. or lower. The lower limit is more preferably 90° C. or higher. Incidentally, a heating time in the pre-heating step and the post-heating step is preferably 30 to 240 seconds. The upper limit is more preferably 180 seconds or less. The lower limit is more preferably 60 seconds or more.

Examples of a method for the heat treatment include a method of heating the entire area of the formed film. Due to the heat treatment, the film strength of the pattern is improved. The heating temperature is preferably 100° C. to 260° C. The lower limit is more preferably 120° C. or higher, and particularly preferably 160° C. or higher. The upper limit is more preferably 240° C. or lower, and particularly preferably 220° C. or lower. In a case where the heating temperature is within the range, a film having excellent strength is easily obtained. The heating time is preferably 1 to 180 minutes. The lower limit is more preferably 3 minutes or more. The upper limit is more preferably 120 minutes or less. A heating device is not particularly limited and can be appropriately selected from well-known devices, and examples thereof include a dry oven, a hot plate, and an infrared heater.

EXAMPLES

Hereinbelow, the present invention will be specifically described with reference to Examples, but the present invention is not limited to these Examples. In addition, "parts" and "%" are on a mass basis unless otherwise specified.

The viscosity was measured under a condition of a rotation speed of 5 revolutions per minute (rpm), using an E type viscometer (RE85L manufactured by Toki Sangyo Co., Ltd.) with 1° 34'×R24 as a conical rotor. In addition, in a case where the measurement cannot be performed under the above-mentioned conditions, the rotation speed was appropriately changed to perform the measurement.

<Measurement of Weight-Average Molecular Weight>

The weight-average molecular weight of the resins was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 μL (sample concentration: 0.1% by mass)

Device name: HLC-8220GPC manufactured by Tosoh Corporation

Detector: Refractive index (RI) detector

Calibration curve base resin: Polystyrene

<Method for Measuring Acid Value>

The acid value is a representation of the mass of potassium hydroxide required to neutralize acidic components per gram of the solid content. A measurement sample was dissolved in a mixed solvent of tetrahydrofuran/water=9/1 (mass ratio), and the obtained solution was titration by neutralization with a 0.1-mol/L aqueous sodium hydroxide solution, using a potentiometric titrator (trade name: AT-510, manufactured by Kyoto Denshi K. K.) at 25° C. By using the inflection point in a titration pH curve as a titration end point, an acid value was calculated by the following equation.

$$A = 56.11 \times Vs \times 0.5 \times f/w$$

A: Acid value (mgKOH/g)

Vs: Used amount (mL) of a 0.1-mol/L aqueous sodium hydroxide solution required for titration f: Titer of a 0.1-mol/L aqueous sodium hydroxide solution w: Mass (g) (in terms of a solid content) of a measurement sample <Method for Measuring Amine Value>

The amine value is a representation of the mass of potassium hydroxide (KOH) equivalent to the basic components per gram of the solid content. A measurement sample was dissolved in a mixed solvent of acetic acid, and the obtained solution was titration by neutralization with a 0.1-mol/L perchloric acid/acetic acid solution, using a potentiometric titrator (trade name: AT-510, manufactured by Kyoto Denshi K. K.) at 25° C. By using the inflection point in a titration pH curve as a titration end point, an amine value was calculated by the following equation.

$$B = 56.11 \times Vs \times 0.1 \times f/w$$

B: Amine Value (mgKOH/g)

Vs: Used amount (mL) of a 0.1-mol/L perchloric acid/acetic acid solution required for titration f: Titer of a 0.1-mol/L perchloric acid/acetic acid solution w: Mass (g) (in terms of a solid content) of a measurement sample <Measurement of Average Primary Particle Diameter, Average Major Axis Length, and Average Minor Axis Length of Particles>

The primary particle diameters of the powder particles were observed with a transmission electron microscope (TEM), and a portion in which the particles were not aggregated was observed to determine the values. Further, with regard to the particle size distribution of the particles, a transmission electron microscopic image of the powder particles that are primary particles was taken using a transmission electron microscope, and the particle size distribution was measured with an image treatment device, using the image. With regard to the average primary particle diameter of the particles, a number-based arithmetic mean diameter calculated from the particle size distribution was taken as an average primary particle diameter. An electron microscope (H-7000) by Hitachi High-Technologies Corporation was used as the transmission electron microscope, and LUZEX AP manufactured by NIRECO Corporation was used as the image treatment device.

The major axis length and the minor axis length of the powder particles were observed with a transmission electron microscope (TEM), and a portion in which the particles were not aggregated was observed to determine the values. Further, as for the particle size distribution of the powder particles, a transmission electron microscopic image of the powder particles that are primary particles was taken using a transmission electron microscope, and the particle size distribution of the major axis length and the minor axis length was measured with an image treatment device, using the image. As for the average major axis length and the average minor axis length of the particles, a number-based arithmetic mean diameter calculated from the particle size distribution was taken as the average major axis length and the average minor axis length. An electron microscope by Hitachi High-Technologies Corporation (H-7000) was used as the transmission electron microscope, and LUZEX AP manufactured by NIRECO Corporation was used as the image treatment device.

Examples 1 to 39 and Comparative Examples 1 to 6

<Production of Dispersion Liquid>

A mixed solution having the following composition was subjected to a dispersion treatment as follows, using Ultra Apex Mill manufactured by Kotobuki Industries Co., Ltd. as a circulation type dispersion device (beads mill), thereby obtaining a dispersion liquid.

<<Composition of Mixed Liquid>>

Particles described in the following table: 30 parts by mass, dispersants described in the following table: the amounts described in the following table, and propylene glycol-1-monomethyl ether-2-acetate (PGMEA): the amounts described in the following table Incidentally, the dispersion device was operated under the following conditions.

Beads diameter: diameter of 0.2 mm, bead filling ratio: 65% by volume, circumferential speed: 6 m/sec, pump supply amount: 10.8 kg/hour, cooling water: tap water, inner volume of beads mill annular passage: 0.15 L, amount of mixed solution for dispersion treatment: 0.65 kg After initiating the dispersion, the average particle diameter of the particles was measured every 30 minutes. The average particle diameter of the pigments decreased over the dispersion time, but a change amount thereof gradually decreased. At a point of time when the change amount d50 (integrated value 50%) in the particle size distribution has disappeared, dispersion was finished.

The compositions of the obtained dispersion liquids 1 to 5, 7, 11 to 14, and 16 to 33 are shown in the following table.

TABLE 5

|  | Particles | | Dispersant/dispersion aid | | Solvent | |
| --- | --- | --- | --- | --- | --- | --- |
|  | Type | Addition amount (parts by mass) | Type | Addition amount (parts by mass) | Type | Addition amount (parts by mass) |
| Dispersion liquid 1 | A-1 | 30 | H-1 | 18 | PGMEA | 52 |
| Dispersion liquid 2 | A-2 | 30 | H-1 | 18 | PGMEA | 52 |
| Dispersion liquid 3 | A-3 | 30 | H-1 | 18 | PGMEA | 52 |
| Dispersion liquid 4 | A-4 | 30 | H-1 | 18 | PGMEA | 52 |
| Dispersion liquid 5 | A-5 | 30 | H-1 | 18 | PGMEA | 52 |
| Dispersion liquid 7 | A-7 | 30 | H-1 | 18 | PGMEA | 52 |
| Dispersion liquid 11 | A-11 | 30 | H-1 | 18 | PGMEA | 52 |
| Dispersion liquid 12 | A-12 | 30 | H-1 | 18 | PGMEA | 52 |
| Dispersion liquid 13 | A-13 | 30 | H-1 | 18 | PGMEA | 52 |
| Dispersion liquid 14 | A-14 | 30 | H-1 | 18 | PGMEA | 52 |
| Dispersion liquid 16 | A-16 | 30 | H-1 | 18 | PGMEA | 52 |
| Dispersion liquid 17 | A-17 | 30 | H-1 | 18 | PGMEA | 52 |
| Dispersion liquid 18 | A-18 | 30 | H-1 | 18 | PGMEA | 52 |
| Dispersion liquid 19 | A-3 | 30 | H-1 | 9 | PGMEA | 61 |
| Dispersion liquid 20 | A-3 | 30 | H-1 | 3 | PGMEA | 67 |
| Dispersion liquid 21 | A-3 | 30 | H-2 | 9 | PGMEA | 61 |
| Dispersion liquid 22 | A-3 | 30 | H-3 | 9 | PGMEA | 61 |
| Dispersion liquid 23 | A-3 | 30 | H-4 | 9 | PGMEA | 61 |

TABLE 5-continued

|  | Particles | | Dispersant/dispersion aid | | Solvent | |
|---|---|---|---|---|---|---|
|  | Type | Addition amount (parts by mass) | Type | Addition amount (parts by mass) | Type | Addition amount (parts by mass) |
| Dispersion liquid 24 | A-19 | 30 | H-1 | 18 | PGMEA | 52 |
| Dispersion liquid 25 | A-20 | 30 | H-1 | 18 | PGMEA | 52 |
| Dispersion liquid 26 | A-21 | 30 | H-1 | 18 | PGMEA | 52 |
| Dispersion liquid 27 | A-22 | 30 | H-1 | 18 | PGMEA | 52 |
| Dispersion liquid 28 | A-23 | 30 | H-1 | 18 | PGMEA | 52 |
| Dispersion liquid 29 | A-24 | 30 | H-1 | 18 | PGMEA | 52 |
| Dispersion liquid 30 | A-25 | 30 | H-1 | 18 | PGMEA | 52 |
| Dispersion liquid 31 | A-26 | 30 | H-1 | 18 | PGMEA | 52 |
| Dispersion liquid 32 | A-4 | 30 | H-1/H-5 | 6/3 | PGMEA | 61 |
| Dispersion liquid 33 | A-4 | 30 | H-1/H-6 | 6/3 | PGMEA | 61 |

(Particles)

As A-1 to A-5, A-7, A-11 to A-14, and A-16 to A-26, the particles represented in the following table were used.

TABLE 6

|  | Particles | Material | Surface treating agent | Manufacturer | Average primary particle diameter or average minor axis length × average major axis length | Density (g/cm$^3$) | Refractive index |
|---|---|---|---|---|---|---|---|
| A-1 | TTO-80A | Titanium oxide | Aluminum hydroxide | Manufactured by Ishihara Sangyo Kaisha, Ltd. | 60 nm | 4.1 | 2.7 |
| A-2 | PT-401M | Titanium oxide | None | Manufactured by Ishihara Sangyo Kaisha, Ltd. | 70 nm | 4.1 | 2.7 |
| A-3 | MPT-140 | Titanium oxide | Aluminum hydroxide | Manufactured by Ishihara Sangyo Kaisha, Ltd. | 74 nm | 4.1 | 2.7 |
| A-4 | MPT-141 | Titanium oxide | Aluminum hydroxide | Manufactured by Ishihara Sangyo Kaisha, Ltd. | 91 nm | 4.1 | 2.7 |
| A-5 | PT-401L | Titanium oxide | None | Manufactured by Ishihara Sangyo Kaisha, Ltd. | 130 nm | 4.1 | 2.7 |
| A-7 | TTO-S-2 | Titanium oxide | Zirconium oxide, aluminum hydroxide, stearic acid | Manufactured by Ishihara Sangyo Kaisha, Ltd. | 15 nm × 75 nm | 4.1 | 2.7 |
| A-11 | STR-100A-LP | Titanium oxide | Aluminum hydroxide, hydrated silica, hydrogen dimethicone | Manufactured by Sakai Chemical Industry Co., Ltd. | 10 nm × 90 nm | 4.1 | 2.7 |
| A-12 | MT-700B | Titanium oxide | None | Manufactured by Teika Co. | 80 nm | 4.1 | 2.7 |
| A-13 | MT-700Z | Titanium oxide | Aluminum hydroxide, stearic acid | Manufactured by Teika Co. | 80 nm | 4.1 | 2.7 |
| A-14 | MT-700BS | Titanium oxide | Hydrogen dimethicone | Manufactured by Teika Co. | 80 nm | 4.1 | 2.7 |
| A-16 | ST-485SA15 | Titanium oxide | Aluminum hydroxide, stearic acid | Manufactured by Titanium Kogyo K. K. | 8 nm × 100 nm | 4.1 | 2.7 |
| A-17 | Classification-treated product of MPT-141 | Titanium oxide | Aluminum hydroxide | Manufactured by Ishihara Sangyo Kaisha, Ltd. | 80 nm | 4.1 | 2.7 |
| A-18 | Classification-treated product of CR-90-2 | Titanium oxide | Aluminum hydroxide, silica, organic compound | Manufactured by Ishihara Sangyo Kaisha, Ltd. | 80 nm | 4.1 | 2.7 |
| A-19 | TT0-51C | Titanium oxide | Aluminum hydroxide, stearic acid | Manufactured by Ishihara Sangyo Kaisha, Ltd. | 20 nm | 4.1 | 2.7 |
| A-20 | A-220 | Titanium oxide | Aluminum hydroxide | Manufactured by Ishihara Sangyo Kaisha, Ltd. | 160 nm | 4.1 | 2.7 |
| A-21 | PT-501R | Titanium oxide | None | Manufactured by Ishihara Sangyo Kaisha, Ltd. | 180 nm | 4.1 | 2.7 |
| A-22 | R-21 | Titanium oxide | Aluminum oxide, silica | Manufactured by Sakai Chemical Industry Co., Ltd. | 200 nm | 4.1 | 2.7 |
| A-23 | R-62N | Titanium oxide | Aluminum oxide, silica | Manufactured by Sakai Chemical Industry Co., Ltd. | 260 nm | 4.1 | 2.7 |
| A-24 | R-45M | Titanium oxide | Aluminum oxide, silica | Manufactured by Sakai Chemical Industry Co., Ltd. | 290 nm | 4.1 | 2.7 |
| A-25 | SW-100 | Strontium titanate | None | Manufactured by Titanium Kogyo K. K. | 80 nm. | 4.8 | 2.4 |
| A-26 | Zincox Super F-1 | Zinc oxide | None | Manufactured by Hakusui Tech Co., Ltd. | 100 nm | 5.6 | 2.0 |

The refractive index of the particles is measured by the following method.

First, dispersion is performed using a dispersant with a known refractive index and PGMEA. Thereafter, a dispersion liquid thus prepared and resin with a known refractive index were mixed such that the concentration of the solid content of the particles reached 10% by mass, 20% by mass, 30% by mass, and 40% by mass, thereby preparing 4 types of coating liquids. These coating liquids are used to form a film in 300 nm on a Si wafer, and then the refractive index of the obtained film is measured using ellipsometry (Lambda Ace RE-3300 (trade name), Dainippon Screen Mfg. Co., Ltd.). Thereafter, by plotting the particle concentration and the refractive index, and performing extrapolation, the refractive index of the particles is derived.

(Dispersant)

H-1: Solsperse 36000, manufactured by The Lubrizol Corporation

H-2: Solsperse 41000, manufactured by The Lubrizol Corporation

H-3: Resin having the following structure (acid value=51.7 mgKOH/g and Mw=13,000). The numerical values shown together with the respective repeating units represent the contents [mass ratios] of the respective repeating units. The numerical values shown together with the repeating sites of the side chain represent the repetition numbers of the repeating sites.

H-4: Resin having the following structure (acid value=32 mgKOH/g, amine value=45 mgKOH/g, and Mw=15,000). The numerical values shown together with the respective repeating units represent the contents [mass ratios] of the respective repeating units. The numerical values shown together with the repeating sites of the side chain represent the repetition numbers of the repeating sites.

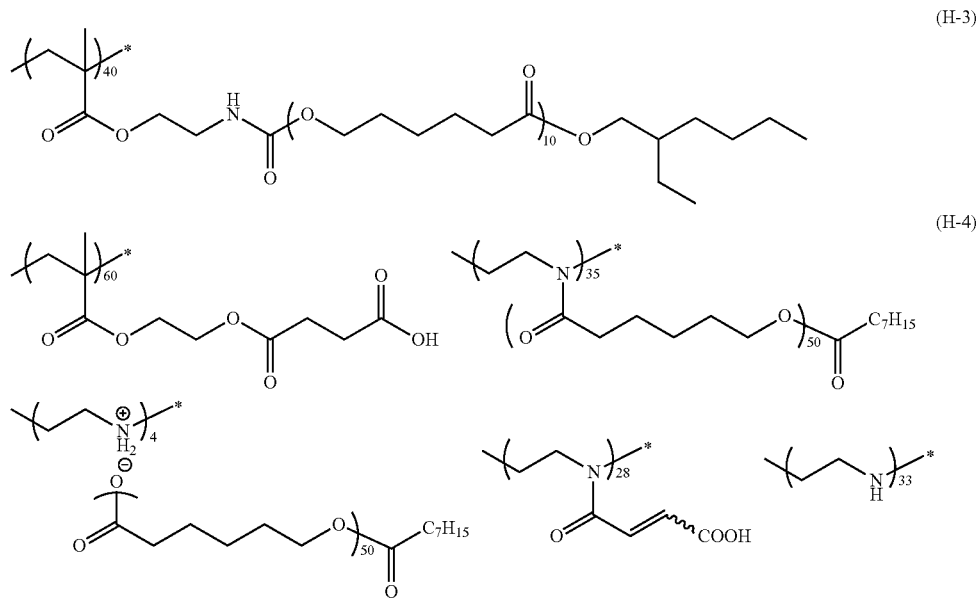

(H-3)

(H-4)

(Dispersion Aid)

H-5: LIGHT ESTER P-1M, manufactured by Kyoei-Sha Chemical Co., Ltd.

H-6: LIGHT ESTER P-2M, manufactured by Kyoei-Sha Chemical Co., Ltd.

<Preparation of Composition>

The raw materials described in the following table were mixed to prepare a composition. Further, "-" in the table indicates that a component is not contained.

TABLE 7

| | Dispersion liquid | | Alkali-soluble resin | | Polymerizable compound | | Photo-polymerization initiator | | Solvent | |
|---|---|---|---|---|---|---|---|---|---|---|
| | Type | Parts by mass | Content of particles (% by mass with respect to the total solid content) | Compound | Parts by mass | Compound | Parts by mass | Compound | Parts by mass | Compound | Parts by mass |
| Example 1 | Dispersion liquid 3 | 73.1 | 42.8 | C-1 | 3.4 | D-1 | 10 | E-1 | 2.8 | PGMEA | 10.7 |
| Example 2 | Dispersion liquid 3 | 73.1 | 42.5 | C-1 | 3.4 | D-1 | 10 | E-1 | 2.8 | PGMEA | 10.4 |

TABLE 7-continued

| Example | Dispersion | | | | | | | | | | | |
|---|---|---|---|---|---|---|---|---|---|---|---|---|
| Example 3 | Dispersion liquid 3 | 73.1 | 42.5 | C-1 | 3.4 | D-1 | 10 | E-1 | 2.8 | PGMEA | 10.4 |
| Example 4 | Dispersion liquid 3 | 73.1 | 42.5 | C-1 | 3.4 | D-1 | 10 | E-1 | 2.8 | PGMEA | 10.4 |
| Example 5 | Dispersion liquid 3 | 73.1 | 42.5 | C-1 | 3.4 | D-1 | 10 | E-1 | 2.8 | PGMEA | 10.4 |
| Example 6 | Dispersion liquid 3 | 73.1 | 40.8 | C-1 | 3.4 | D-1 | 10 | E-1 | 2.8 | PGMEA | 8.2 |
| Example 7 | Dispersion liquid 3 | 73.1 | 40.8 | C-1 | 3.4 | D-1 | 10 | E-1 | 2.8 | PGMEA | 8.2 |
| Example 8 | Dispersion liquid 3 | 73.1 | 42.1 | C-2 | 3.4 | D-2 | 10 | E-3 | 2.8 | PGMEA | 9.9 |
| Example 9 | Dispersion liquid 3 | 73.1 | 40.2 | C-1 | 3.4 | D-2 | 10 | E-3 | 2.8 | PGMEA | 7.4 |
| Example 10 | Dispersion liquid 3 | 73.1 | 40.2 | C-2 | 3.4 | D-1 | 10 | E-3 | 2.8 | PGMEA | 7.4 |
| Example 11 | Dispersion liquid 3 | 73.1 | 40.2 | C-2 | 3.4 | D-2 | 10 | E-1 | 2.8 | PGMEA | 7.4 |
| Example 12 | Dispersion liquid 3 | 73.1 | 40.2 | C-2 | 3.4 | D-2 | 10 | E-2 | 2.8 | PGMEA | 7.4 |
| Example 13 | Dispersion liquid 3 | 73.1 | 40.2 | C-1/C-2 | 1.0/2.4 | D-1/D-2 | 2/8 | E-1/E-4 | 0.5/2.3 | PGMEA/cyclohexanone | 3.7/3.7 |
| Example 14 | Dispersion liquid 3 | 73.1 | 40.2 | C-2 | 3.4 | D-2 | 10 | E-4 | 2.8 | PGMEA | 7.4 |
| Example 15 | Dispersion liquid 1 | 73.1 | 40.2 | C-2 | 3.4 | D-2 | 10 | E-3 | 2.8 | PGMEA | 7.4 |
| Example 16 | Dispersion liquid 2 | 73.1 | 40.2 | C-2 | 3.4 | D-2 | 10 | E-3 | 2.8 | PGMEA | 7.4 |
| Example 17 | Dispersion liquid 3 | 73.1 | 40.2 | C-2 | 3.4 | D-2 | 10 | E-3 | 2.8 | PGMEA | 7.4 |
| Example 18 | Dispersion liquid 4 | 73.1 | 40.2 | C-2 | 3.4 | D-2 | 10 | E-3 | 2.8 | PGMEA | 7.4 |
| Example 19 | Dispersion liquid 5 | 73.1 | 40.2 | C-2 | 3.4 | D-2 | 10 | E-3 | 2.8 | PGMEA | 7.4 |
| Example 20 | Dispersion liquid 12 | 73.1 | 40.2 | C-2 | 3.4 | D-2 | 10 | E-3 | 2.8 | PGMEA | 7.4 |
| Example 21 | Dispersion liquid 13 | 73.1 | 40.2 | C-2 | 3.4 | D-2 | 10 | E-3 | 2.8 | PGMEA | 7.4 |
| Example 22 | Dispersion liquid 14 | 73.1 | 40.2 | C-2 | 3.4 | D-2 | 10 | E-3 | 2.8 | PGMEA | 7.4 |
| Example 23 | Dispersion liquid 17 | 73.1 | 40.2 | C-2 | 3.4 | D-2 | 10 | E-3 | 2.8 | PGMEA | 7.4 |
| Example 24 | Dispersion liquid 18 | 73.1 | 40.2 | C-2 | 3.4 | D-2 | 10 | E-3 | 2.8 | PGMEA | 7.4 |
| Example 25 | Dispersion liquid 19 | 66.7 | 39.9 | C-2 | 9.1 | D-2 | 9.1 | E-3 | 2.6 | PGMEA | 9.2 |
| Example 26 | Dispersion liquid 20 | 66.7 | 39.9 | C-2 | 13.1 | D-2 | 9.1 | E-3 | 2.6 | PGMEA | 5.2 |

| | Coloring inhibitor | | Compound having epoxy group | | Ultraviolet absorber | | Adhesive | | Chain transfer agent | |
|---|---|---|---|---|---|---|---|---|---|---|
| | Compound | Parts by mass | Compound | Parts by mass | Compound | Parts by mass | Compound | Parts by mass | Compound | Parts by mass |
| Example 1 | — | | — | | — | | — | | — | |
| Example 2 | F-1 | 0.3 | — | | — | | — | | — | |
| Example 3 | F-2 | 0.3 | — | | — | | — | | — | |
| Example 4 | F-3 | 0.3 | — | | — | | — | | — | |
| Example 5 | F-4 | 0.3 | — | | — | | — | | — | |
| Example 6 | F-3 | 0.3 | G-1 | 2.2 | — | | — | | — | |
| Example 7 | F-3 | 0.3 | G-2 | 2.2 | — | | — | | — | |
| Example 8 | F-3 | 0.3 | — | | J-1 | 0.5 | — | | — | |
| Example 9 | F-3 | 0.3 | — | | J-1 | 0.5 | I-1 | 2.5 | — | |
| Example 10 | F-3 | 0.3 | — | | J-1 | 0.5 | I-1 | 2.5 | — | |
| Example 11 | F-3 | 0.3 | — | | J-1 | 0.5 | I-1 | 2.5 | — | |
| Example 12 | F-3 | 0.3 | — | | J-1 | 0.5 | I-1 | 2.5 | — | |
| Example 13 | F-3 | 0.3 | — | | J-1 | 0.5 | I-1 | 2.5 | — | |
| Example 14 | F-3 | 0.3 | — | | J-1 | 0.5 | I-1 | 2.5 | — | |
| Example 15 | F-3 | 0.3 | — | | J-1 | 0.5 | I-1 | 2.5 | — | |
| Example 16 | F-3 | 0.3 | — | | J-1 | 0.5 | I-1 | 2.5 | — | |
| Example 17 | F-3 | 0.3 | — | | J-1 | 0.5 | I-1 | 2.5 | — | |
| Example 18 | F-3 | 0.3 | — | | J-1 | 0.5 | I-1 | 2.5 | — | |
| Example 19 | F-3 | 0.3 | — | | J-1 | 0.5 | I-1 | 2.5 | — | |
| Example 20 | F-3 | 0.3 | — | | J-1 | 0.5 | I-1 | 2.5 | — | |
| Example 21 | F-3 | 0.3 | — | | J-1 | 0.5 | I-1 | 2.5 | — | |
| Example 22 | F-3 | 0.3 | — | | J-1 | 0.5 | I-1 | 2.5 | — | |
| Example 23 | F-3 | 0.3 | — | | J-1 | 0.5 | I-1 | 2.5 | — | |
| Example 24 | F-3 | 0.3 | — | | J-1 | 0.5 | I-1 | 2.5 | — | |

TABLE 7-continued

| | | | | | | | | |
|---|---|---|---|---|---|---|---|---|
| Example 25 | F-3 | 0.3 | — | J-1 | 0.5 | I-1 | 2.5 | — |
| Example 26 | F-3 | 0.3 | — | J-1 | 0.5 | I-1 | 2.5 | — |

TABLE 8

| | Dispersion liquid | | Alkali-soluble resin | | Polymerizable compound | | Photopolymerization initiator | | Solvent | |
|---|---|---|---|---|---|---|---|---|---|---|
| | Type | Parts by mass | Content of particles (% by mass with respect to the total solid content) | Compound | Parts by mass | Compound | Parts by mass | Compound | Parts by mass | Compound | Parts by mass |
| Example 27 | Dispersion liquid 20 | 73.3 | 55.0 | C-2 | 6.5 | D-2 | 5.2 | E-3 | 1.5 | PGMEA | 10.9 |
| Example 28 | Dispersion liquid 20 | 50 | 29.9 | C-2 | 16.4 | D-2 | 10.8 | E-3 | 3.1 | PGMEA | 16.4 |
| Example 29 | Dispersion liquid 21 | 66.7 | 39.9 | C-2 | 9.1 | D-2 | 9.1 | E-3 | 2.6 | PGMEA | 9.2 |
| Example 30 | Dispersion liquid 22 | 66.7 | 39.9 | C-2 | 9.1 | D-2 | 9.1 | E-3 | 2.6 | PGMEA | 9.2 |
| Example 31 | Dispersion liquid 23 | 66.7 | 39.9 | C-2 | 9.1 | D-2 | 9.1 | E-3 | 2.6 | PGMEA | 9.2 |
| Example 32 | Dispersion liquid 30 | 73.1 | 40.2 | C-2 | 3.4 | D-2 | 10 | E-3 | 2.8 | PGMEA | 7.4 |
| Example 33 | Dispersion liquid 31 | 73.1 | 40.2 | C-2 | 3.4 | D-2 | 10 | E-3 | 2.8 | PGMEA | 7.4 |
| Example 34 | Dispersion liquid 4 Dispersion liquid 7 | 63.1 10.0 | 40.2 | C-2 | 3.4 | D-2 | 10 | E-3 | 2.8 | PGMEA | 7.4 |
| Example 35 | Dispersion liquid 4 Dispersion liquid | 68.1 5.0 | 40.2 | C-2 | 3.4 | D-2 | 10 | E-3 | 2.8 | PGMEA | 7.4 |
| Example 36 | Dispersion liquid 3 | 73.1 | 40.2 | C-2 | 3.4 | D-2 | 10 | E-1 | 2.8 | PGMEA | 7.4 |
| Example 37 | Dispersion liquid 11 | 73.1 | 40.2 | C-2 | 3.4 | D-2 | 10 | E-3 | 2.8 | PGMEA | 7.4 |
| Example 38 | Dispersion liquid 32 | 66.7 | 39.9 | C-2 | 9.1 | D-2 | 9.1 | E-3 | 2.6 | PGMEA | 9.2 |
| Example 39 | Dispersion liquid 33 | 66.7 | 39.9 | C-2 | 9.1 | D-2 | 9.1 | E-3 | 2.6 | PGMEA | 9.2 |
| Comparative Example 1 | Dispersion liquid 24 | 73.1 | 40.2 | C-2 | 3.4 | D-2 | 10 | E-3 | 2.8 | PGMEA | 7.4 |
| Comparative Example 2 | Dispersion liquid 25 | 73.1 | 40.2 | C-2 | 3.4 | D-2 | 10 | E-3 | 2.8 | PGMEA | 7.4 |
| Comparative Example 3 | Dispersion liquid 26 | 73.1 | 40.2 | C-2 | 3.4 | D-2 | 10 | E-3 | 2.8 | PGMEA | 7.4 |
| Comparative Example 4 | Dispersion liquid 27 | 73.1 | 40.2 | C-2 | 3.4 | D-2 | 10 | E-3 | 2.8 | PGMEA | 7.4 |
| Comparative Example 5 | Dispersion liquid 28 | 73.1 | 40.2 | C-2 | 3.4 | D-2 | 10 | E-3 | 2.8 | PGMEA | 7.4 |
| Comparative Example 6 | Dispersion liquid 29 | 73.1 | 40.2 | C-2 | 3.4 | D-2 | 10 | E-3 | 2.8 | PGMEA | 7.4 |

| | Coloring inhibitor | | Compound having epoxy group | | Ultraviolet absorber | | Adhesive | | Chain transfer agent | |
|---|---|---|---|---|---|---|---|---|---|---|
| | Compound | Parts by mass | Compound | Parts by mass | Compound | Parts by mass | Compound | Parts by mass | Compound | Parts by mass |
| Example 27 | F-3 | 0.2 | — | | J-1 | 0.4 | I-1 | 2 | — | |
| Example 28 | F-3 | 0.3 | — | | J-1 | 0.5 | I-1 | 2.5 | — | |
| Example 29 | F-3 | 0.3 | — | | J-1 | 0.5 | I-1 | 2.5 | — | |
| Example 30 | F-3 | 0.3 | — | | J-1 | 0.5 | I-1 | 2.5 | — | |
| Example 31 | F-3 | 0.3 | — | | J-1 | 0.5 | I-1 | 2.5 | — | |
| Example 32 | F-3 | 0.3 | — | | J-1 | 0.5 | I-1 | 2.5 | — | |
| Example 33 | F-3 | 0.3 | — | | J-1 | 0.5 | I-1 | 2.5 | — | |
| Example 34 | F-3 | 0.3 | — | | J-1 | 0.5 | I-1 | 2.5 | — | |
| Example 35 | F-3 | 0.3 | — | | J-1 | 0.5 | I-1 | 2.5 | — | |
| Example 36 | F-3 | 0.3 | — | | J-1 | 0.5 | I-1 | 1.7 | K-1 | 0.8 |
| Example 37 | F-3 | 0.3 | — | | J-1 | 0.5 | I-1 | 2.5 | — | |
| Example 38 | F-3 | 0.3 | — | | J-1 | 0.5 | I-1 | 2.5 | — | |
| Example 39 | F-3 | 0.3 | — | | J-1 | 0.5 | I-1 | 2.5 | — | |
| Comparative Example 1 | F-3 | 0.3 | — | | J-1 | 0.5 | I-1 | 2.5 | — | |

TABLE 8-continued

| | | | | | | | | |
|---|---|---|---|---|---|---|---|---|
| Comparative Example 2 | F-3 | 0.3 | — | J-1 | 0.5 | I-1 | 2.5 | — |
| Comparative Example 3 | F-3 | 0.3 | — | J-1 | 0.5 | I-1 | 2.5 | — |
| Comparative Example 4 | F-3 | 0.3 | — | J-1 | 0.5 | I-1 | 2.5 | — |
| Comparative Example 5 | F-3 | 0.3 | — | J-1 | 0.5 | I-1 | 2.5 | — |
| Comparative Example 6 | F-3 | 0.3 | — | J-1 | 0.5 | I-1 | 2.5 | — |

<<Raw Materials>>

The raw materials described in the table are as follows.

(Dispersion Liquid)

Dispersion liquid 1 to 5, 7, 11 to 14, and 16 to 33: Dispersion liquids 1 to 5, 7, 11 to 14, and 16 to 33 above.

(Alkali-Soluble Resin)

C-1: Resin having the following structure (acid value=113 mgKOH/g and Mw=33,000). The numerical values shown together with the respective repeating units represent the contents [mass ratios] of the respective repeating units.

C-2: Resin having the following structure (acid value=32 mgKOH/g and Mw=14,000). The numerical values shown together with the respective repeating units represent the contents [mass ratios] of the respective repeating units.

(Polymerizable Compound)

D-1: Dipentaerythritol hexa(meth)acrylate, KAYARAD DPHA (manufactured by Nippon Kayaku Co., Ltd.)

D-2: Pentaerythritol tetraacrylate, NK ESTER A-TMMT (manufactured by Shin-Nakamura Chemical Co., Ltd.)

(Photopolymerization Initiator)

E-1: IRGACURE OXE01 (manufactured by BASF)
E-2: IRGACURE 379 (manufactured by BASF)
E-3: IRGACURE TPO (manufactured by BASF)
E-4: IRGACURE 819 (manufactured by BASF)

(Solvent)

PGMEA: Propylene glycol monomethyl ether acetate (Coloring Inhibitor)

F-1: ADEKA STAB PEP-36A (manufactured by ADEKA Corporation, the following structure)

F-2: ADEKA STAB AO-50 (manufactured by ADEKA Corporation, the following structure)

F-3: ADEKA STAB AO-80 (manufactured by ADEKA Corporation, the following structure)

F-4: ADEKA STAB AO-4125 (manufactured by ADEKA Corporation, the following structure)

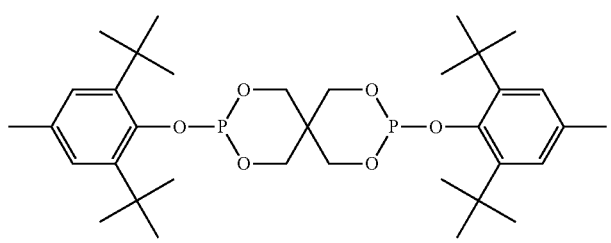

F-1

-continued
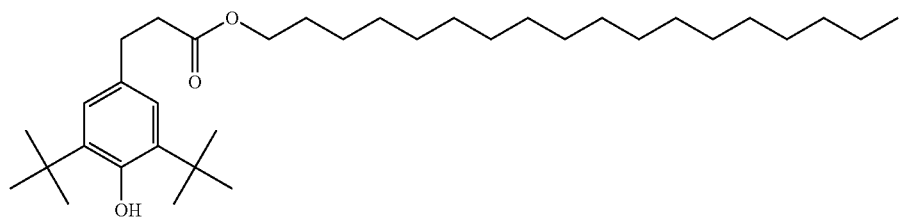
F-2
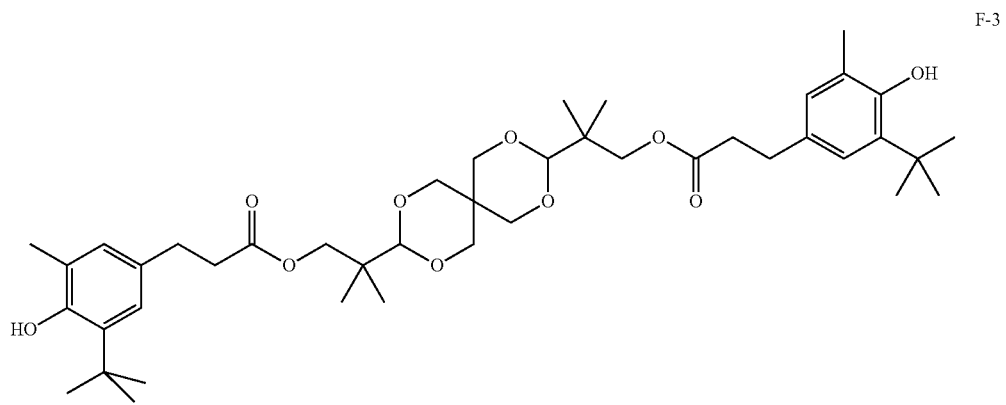
F-3
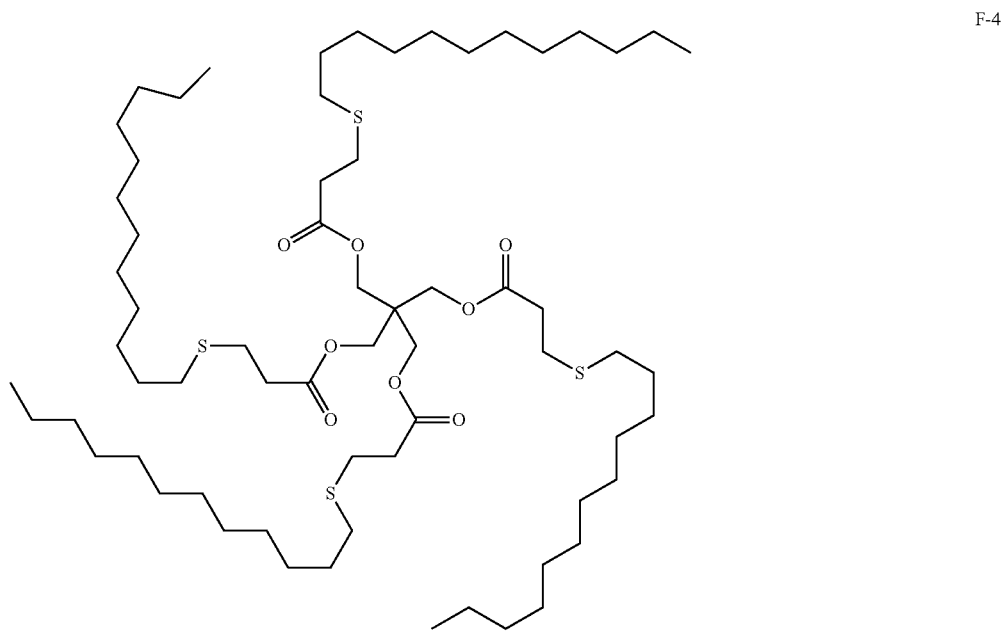
F-4

(Compound Having Epoxy Group)

G-1: EHPE 3150 (manufactured by Daicel Corporation)

G-2: EPICLON N-695 (manufactured by DIC Corporation)

(Ultraviolet Absorber)

J-1: Compound III in JP2009-217221A, the following structure.

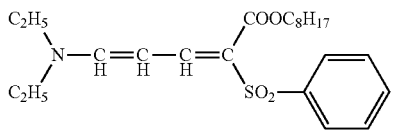

(Adhesive)

I-1: Compound C described in JP2009-288703, the following structure.

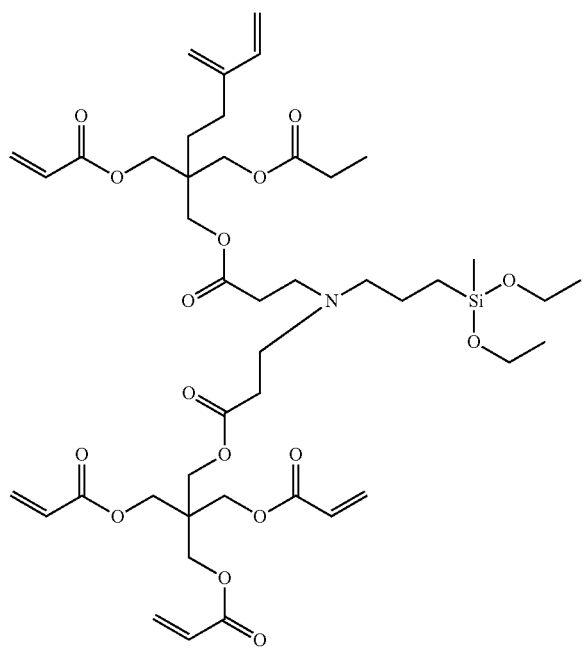 [SMILES: C=CC(=C)CCC(COC(=O)C=C)(COC(=O)CC)COC(=O)CCN(CCC[Si](C)(OCC)OCC)CCC(=O)OCC(COC(=O)C=C)(COC(=O)C=C)COC(=O)C=C]

(Chain Transfer Agent)

K-1: PEMP (manufactured by SC Organic Chemical Co., Ltd.), thiol compound, the following structure.

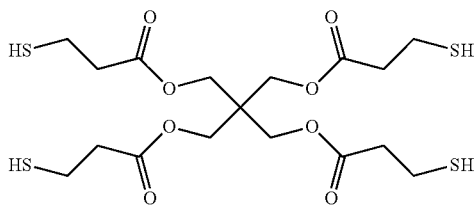 [SMILES: O=C(CCS)OCC(COC(=O)CCS)(COC(=O)CCS)COC(=O)CCS]

[Evaluation]

<L*>

Each of the obtained compositions was applied onto an 8-inch (1 inch equals to 2.54 cm) glass wafer with an undercoat layer (CT-4000L manufactured by FUJIFILM Electronic Materials Co., Ltd.; film thickness of 0.1 μm) using a spin coater such that the film thickness after drying became 3.0 μm, and subjected to a heating treatment (prebaking) using a hot plate at 110° C. for 120 seconds.

Subsequently, exposure was performed through a mask with a pattern in 2 cm×2 cm at 1,000 mJ/cm$^2$ with light at a wavelength of 365 nm, using an i-ray stepper exposure device FPA-3000i5+(manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. In the present specification, the L* is measured in a state where the amount of the solvent included in the film is 1% by mass or less.

The value of the L* in an L*a*b* color space of CIE 1976 of the obtained white pattern was obtained, using a spectrophotometer under the measurement conditions of a D65 light source, an observation field of view at 2°, and a white patch of a calibration reference plate in X-Rite 528 (trade name, manufactured by X-Rite Inc.) as a white reference. The results are described as L* in the following table. As the spectrophotometer, X-Rite 528 (trade name, manufactured by X-Rite Inc.) was used. Similarly, the values of a* and b* are also described in the table.

<Temporal Liquid Stability>

A volatile fraction was dried from each of the obtained compositions under a condition of 160° C. and 1 hour, using an oven. The amount reduction caused by drying was measured between before and after drying, and a difference in the weight before drying and the volatilized amount of the composition was calculated, thereby calculating "the solid content before the centrifugation treatment".

Furthermore, the obtained composition was subjected to a centrifugation treatment under the conditions of room temperature and 3,500 rpm for 47 minutes, and for the resulting supernatant, "the solid content after the centrifugation treatment" was calculated by the same method as above.

A difference between "the solid content after the centrifugation treatment" and "the solid content before the centrifugation treatment" was divided by "the solid content before the centrifugation treatment" to calculate sedimentations of the solid contents in percentages, which were classified as follows and used for a test on temporal liquid stability. Evaluation as A, B, or C is considered to indicate that there is no problem in practical use. Evaluation as A or B is preferable, and evaluation as A is more preferable. The obtained results are shown in the following table.

A: The sedimentation of the solid content is in a range of 2% by mass or less.

B: The sedimentation of the solid content is in a range of more than 2% by mass and 5% by mass or less.

C: The sedimentation of the solid content is in a range of more than 5% by mass and 10% by mass or less.

D: The sedimentation of the solid content is in a range of more than 10% by mass and 15% by mass or less.

E: The sedimentation of the solid content is in a range of more than 15% by mass.

<Light Fastness>

Each of the obtained compositions was applied onto an 8-inch glass wafer with an undercoat layer (CT-4000L manufactured by FUJIFILM Electronic Materials Co., Ltd.; film thickness of 0.1 μm) using a spin coater such that the film thickness after drying became 5.0 μm, and subjected to a heating treatment (pre-baking) using a hot plate at 110° C. for 120 seconds.

Subsequently, exposure was performed through a mask with a pattern in 2 cm×2 cm at 1,000 mJ/cm$^2$ with light at a wavelength of 365 nm, using an i-ray stepper exposure device FPA-3000i5+ (manufactured by Canon Inc.).

Thereafter, the glass wafer having the exposed film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. Thereafter, a heating treatment (post-baking) was performed for 5 minutes, using a hot plate at 200° C., and the film thickness after post-baking was measured using a stylus film thickness measuring device, DEKTAK.

Then, the film thickness after irradiation with light at a luminance of 100,000 lux for 50 hours was measured using a Super Xenon Weather Meter SX75 manufactured by Suga Test Instruments Co., Ltd., and taken as a film thickness after the light fastness test.

The ratio (%) of the film thickness after the light fastness test to the film thickness after post-baking was classified as follows and evaluated in a light fastness test. Evaluation as A, B, C, or D is preferable, evaluation as A, B, or C is more preferable, evaluation as A or B is particularly preferable, and evaluation as A is more particularly preferable. The obtained results are shown in the following table.

A: The ratio of the film thickness after the light fastness test to the film thickness after post-baking is in a range of 95% to 100%

B: The ratio of the film thickness after the light fastness test to the film thickness after post-baking is in a range of 90% or more and less than 95%.

C: The ratio of the film thickness after the light fastness test to the film thickness after post-baking is in a range of 80% or more and less than 90%.

D: The ratio of the film thickness after the light fastness test to the film thickness after post-baking is in a range of 70% or more and less than 80%.

E: The ratio of the film thickness after the light fastness test to the film thickness after post-baking is in a range of less than 70%.

<Solvent Resistance>

Each of the obtained compositions was applied onto an 8-inch glass wafer with an undercoat layer, using a spin coater, such that the film thickness after drying became 3.0 μm, and subjected to a heating treatment (pre-baking) using a hot plate at 110° C. for 120 seconds.

Subsequently, exposure was performed through a mask with a pattern in 2 cm×2 cm at 1,000 mJ/cm$^2$ with light at a wavelength of 365 nm, using an i-ray stepper exposure device FPA-3000i5+ (manufactured by Canon Inc.).

Thereafter, the glass wafer having the exposed coating film formed thereon was placed on a horizontal rotary table of a spin-shower developing machine (DW-30 Type, manufactured by Chemitronics Co., Ltd.), and subjected to puddle development at 23° C. for 60 seconds, using a 0.3%-by-mass aqueous tetramethylammonium hydroxide (TMAH) solution, to form a white pattern on the glass wafer.

The glass wafer having the white pattern formed thereon was fixed to the horizontal rotary table in a vacuum chuck mode, and while the glass wafer was rotated by a rotating apparatus at a rotation speed of 50 rpm, it was subjected to a rinsing treatment by supplying pure water provided in shower from above the rotational center from nozzles, and then spray-dried. Thereafter, a heating treatment (post-baking) was performed for 5 minutes using a hot plate at 230° C.

The transmittances at a wavelength of 400 to 700 nm in the obtained white pattern and the white pattern which had been dipped in N-methyl-2-pyrrolidinone for 5 minutes were measured using MCPD-3000 (manufactured by Otsuka Electronics Co., Ltd.). With regard to the spectral variation (ΔT %), a variation at a wavelength having the highest spectral variation was defined as ΔT % max, and the solvent resistance was evaluated therewith. As the variation is smaller, the solvent resistance is better and more preferable. Evaluation as A, B, C, or D is preferable, evaluation as A, B, or C is more preferable, evaluation as A or B is particularly preferable, and evaluation as A is more particularly preferable. The obtained results are shown in the following table.

A: ΔTmax<0.5%
B: 0.5%≤ΔTmax<1.0%
C: 1.0%≤ΔTmax<3.0%
D: 3.0%≤ΔTmax<5.0%
E: ΔTmax≥5.0%

<Pattern Shape>

Each of the obtained compositions was applied onto an 8-inch silicon wafer with an undercoat layer by a spin coating method such that the film thickness after application became 3.0 μm, and then heated on a hot plate at 100° C. for 2 minutes, thereby obtaining a composition layer.

Subsequently, the obtained composition layer was exposed (at an exposure dose of 50 to 1,700 mJ/cm$^2$) through a mask with an island pattern in 20 μm$^2$, using an i-ray stepper exposure device FPA-3000i5+ (manufactured by Canon Inc.).

Then, the exposed composition layer was developed using a development apparatus (Act8 manufactured by Tokyo Electron Ltd.). The obtained composition layer was subjected to shower development at 23° C. for 60 seconds, using a 0.3%-by-mass aqueous tetramethylammonium hydroxide (TMAH) solution as a developer. Thereafter, the silicon wafer was rinsed in spin shower using pure water to obtain a pattern. The shape of the obtained pattern was observed (magnification: 5,000 times), using a scanning electron microscope (SEM) (S-4800H, manufactured by Hitachi High-Technologies Corporation), and evaluated. The evaluation standards of the pattern shape are as follows. Evaluation as A, B, C, or D is preferable, evaluation as A, B, or C is more preferable, evaluation as A or B is particularly preferable, and evaluation as A is more particularly preferable. The obtained results are shown in the following table.

A: One side of the pattern is linear as in (a) of FIG. 1.
B: Corners of the pattern is slightly rounded as in (b) of FIG. 1.
C: One side of the pattern is slightly rounded as in (c) of FIG. 1.

D: The pattern is rounded as in (d) of FIG. 1.

E: The pattern is rounded as in (e) of FIG. 1.

<Adhesiveness>

A pattern group having a pattern size of 20 μm out of the patterns prepared in the evaluation of the pattern shape was observed with an optical microscope (manufactured by Olympus Corporation). The evaluation standards of the adhesiveness are as follows. Evaluation as A, B, C, or D is preferable, evaluation as A, B, or C is more preferable, evaluation as A or B is particularly preferable, and evaluation as A is more particularly preferable. The obtained results are shown in the following table.

A: There is no peeling or chipping in the pattern.

B: The peeling or chipping of the pattern as observed is less than 5%.

C: The peeling or chipping of the pattern as observed is 5% or more and less than 10%.

D: The peeling or chipping of the pattern as observed is 10% or more and less than 30%.

E: The peeling or chipping of the pattern as observed is 30% or more.

<Coloring Properties>

The spectral values, L*, a*, and b*, of the pattern prepared by the same method as for the evaluation of solvent resistance were measured using a spectrophotometer under the measurement conditions of a D65 light source, an observation field of view at 2°, and a white patch of a calibration reference plate included in X-Rite 528 (trade name, manufactured by X-Rite Inc.) as a white reference. As the spectrophotometer, X-Rite 528 (trade name, manufactured by X-Rite Inc.) was used. Further, in the measurement, the glass wafer having a pattern formed thereon was placed on a board coated with a black resist (black board), and measured. The optical density (OD) of the black resist layer on the black board was 3.5 (transmittance of 0.03%) at 400 nm, 3.2 (transmittance of 0.06%) at 550 nm, and 2.5 (transmittance of 0.32%) at 700 nm, and the average reflectivity in the range of 400 nm to 700 nm was 7%. The OD of the black board was measured by "MCPD-3000" manufactured by Otsuka Electronics Co., Ltd., and the reflectivity was measured by "SPECTROPHOTOMETER CM-2600" manufactured by Konica Minolta Co., Ltd.

The prepared pattern was heated using a hot plate at 265° C. for 15 minutes, the spectrum of the pattern after heating was measured, and the color difference ΔE*ab of the pattern before and after heating in an L*a*b* color space of CIE 1976 was calculated. In addition, an equation for calculating the color difference ΔE*ab is as follows.

$$\Delta E^{*}ab=[(\Delta L^{*})^{2}+(\Delta a^{*})^{2}+(\Delta b^{*})^{2}]^{1/2}$$

A: The color difference ΔE*ab is 0 or more and less than 0.5.

B: The color difference ΔE*ab is 0.5 or more and less than 1.0.

C: The color difference ΔE*ab is 1.0 or more and less than 2.0.

D: The color difference ΔE*ab is 2.0 or more and less than 3.0.

E: The color difference ΔE*ab is 3.0 or more.

Evaluation as A, B, C, or D is preferable, evaluation as A, B, or C is more preferable, evaluation as A or B is particularly preferable, and evaluation as A is more particularly preferable. The obtained results are shown in the following table.

<Defects>

Each of the obtained compositions was applied onto an 8-inch silicon wafer with an undercoat layer, using a spin coater, such that the film thickness after drying became 3.0 μm, and subjected to a heating treatment (pre-baking) using a hot plate at 110° C. for 120 seconds, thereby forming a composition layer.

With respect to the substrate having the composition layer formed thereon, the number of impurities having a size of 5.0 μm or more was counted by using a defect inspector, ComPLUS (manufactured by Applied Materials, Inc.).

This evaluation was carried out on the composition layer immediately after the preparation thereof and the composition layer which had been placed at room temperature (23° C.) for one month from the preparation thereof, and an increase rate in impurities was evaluated in accordance with the following evaluation standard.

The increase rate in impurities was calculated as (number of impurities which had been placed at room temperature for one month/number of impurities immediately after the preparation). Evaluation as A, B, C, or D is preferable, evaluation as A, B, or C is more preferable, evaluation as A or B is particularly preferable, and evaluation as A is more particularly preferable. The obtained results are shown in the following table.

A: Less than 1.1

B: 1.1 or more and less than 1.3

C: 1.3 or more and less than 1.5

D: 1.5 or more and less than 3.0

E: 3.0 or more

TABLE 9

| | L* in case of film thickness of 3.0 μm | a* in case of film thickness of 3.0 μm | b* in case of film thickness of 3.0 μm | Temporal liquid stability | Light fastness | Solvent resistance | Pattern shape | Adhesiveness | Coloring properties | Defects |
|---|---|---|---|---|---|---|---|---|---|---|
| Example 1 | 46.9 | −3.2 | −27.9 | A | A | D | B | C | D | A |
| Example 2 | 46.5 | −3.0 | −29.6 | A | A | D | B | C | C | A |
| Example 3 | 47.1 | −3.5 | −29.3 | A | A | D | B | C | B | A |
| Example 4 | 46.9 | −3.3 | −28.7 | A | A | D | B | C | A | A |
| Example 5 | 46.8 | −4.0 | −28.9 | A | A | D | B | C | C | A |
| Example 6 | 46.7 | −3.6 | −28.4 | A | A | B | B | C | A | A |
| Example 7 | 47.2 | −3.5 | −28.5 | A | A | C | B | C | A | A |
| Example 8 | 46.8 | −3.3 | −28.9 | A | A | A | A | C | A | A |
| Example 9 | 46.9 | −3.1 | −28.4 | A | A | B | A | B | A | A |
| Example 10 | 46.7 | −3.0 | −28.7 | A | A | A | B | A | A | A |
| Example 11 | 46.6 | −3.4 | −28.7 | A | A | A | A | B | B | A |
| Example 12 | 47.0 | −3.4 | −29.1 | A | A | A | A | B | A | A |
| Example 13 | 47.0 | −3.7 | −29.9 | A | A | A | A | B | A | A |
| Example 14 | 46.8 | −3.7 | −29.9 | A | A | A | A | A | A | A |
| Example 15 | 41.0 | −3.1 | −30.6 | A | A | A | A | A | A | A |

TABLE 9-continued

|  | L* in case of film thickness of 3.0 μm | a* in case of film thickness of 3.0 μm | b* in case of film thickness of 3.0 μm | Temporal liquid stability | Light fastness | Solvent resistance | Pattern shape | Adhesiveness | Coloring properties | Defects |
|---|---|---|---|---|---|---|---|---|---|---|
| Example 16 | 54.0 | −2.5 | −17.9 | A | D | A | A | A | A | A |
| Example 17 | 47.1 | −3.6 | −29.5 | A | A | A | A | A | A | A |
| Example 18 | 62.4 | −4.1 | −20.5 | B | A | A | A | A | A | A |
| Example 19 | 63.1 | −4.1 | −18.8 | B | D | A | A | A | A | A |
| Example 20 | 50.2 | −4.3 | −32.5 | A | D | A | A | A | A | A |
| Example 21 | 50.6 | −4.1 | −28.9 | A | A | A | A | A | A | A |
| Example 22 | 51.0 | −4.5 | −29.0 | A | C | A | A | A | A | A |
| Example 23 | 55.4 | −3.3 | −18.2 | A | A | A | A | A | A | A |
| Example 24 | 57.8 | −3.9 | −17.6 | A | A | A | A | A | A | A |
| Example 25 | 46.0 | −3.6 | −28.0 | A | A | A | A | A | A | A |
| Example 26 | 45.8 | −3.7 | −27.6 | A | A | A | A | A | A | A |
| Example 27 | 53.0 | −3.0 | −28.6 | A | A | A | A | A | A | A |
| Example 28 | 42.1 | −3.9 | −27.3 | A | A | A | A | A | A | A |
| Example 29 | 46.0 | −4.1 | −26.5 | A | A | A | A | A | A | A |
| Example 30 | 45.8 | −3.5 | −28.7 | A | A | A | A | B | A | A |
| Example 31 | 46.2 | −3.6 | −28.8 | A | A | A | A | A | B | A |
| Example 32 | 49.5 | −3.3 | −29.0 | C | A | A | B | A | A | B |
| Example 33 | 35.5 | −2.0 | −15.5 | B | A | A | B | A | A | B |
| Example 34 | 58.3 | −3.8 | −19.5 | B | A | A | A | A | A | A |
| Example 35 | 57.3 | −3.7 | −19.0 | B | A | A | A | A | A | A |
| Example 36 | 46.1 | −3.3 | −26.5 | A | A | A | A | A | B | A |
| Example 37 | 36.0 | −4.3 | −33.3 | B | A | A | A | A | A | C |
| Example 38 | 60.5 | −4.1 | −20.5 | B | A | A | A | A | A | A |
| Example 39 | 61.2 | −4.1 | −20.5 | B | A | A | A | A | A | A |
| Comparative Example 1 | 6.2 | 1.0 | −16.5 | A | A | A | A | A | A | A |
| Comparative Example 2 | 63.5 | −3.5 | −15.5 | E | A | A | A | A | A | E |
| Comparative Example 3 | 71.0 | −3.5 | −14.9 | E | E | A | A | A | A | E |
| Comparative Example 4 | 69.7 | −3.0 | −13.9 | E | A | A | A | A | A | E |
| Comparative Example 5 | 71.4 | −3.5 | −10.3 | E | A | A | A | A | A | E |
| Comparative Example 6 | 72.3 | −2.9 | −7.7 | E | A | A | A | A | A | E |

From the table above, it could be seen that the composition of each of Examples has an L* in an L*a*b* color space of CIE 1976 of 35 to 75 in a case of forming a film with a thickness of 3.0 μm, and had excellent temporal liquid stability.

In contrast, the composition of Comparative Example 1 using the particles having an average primary particle diameter below 50 nm had L* in an L*a*b* color space of CIE 1976 of less than 35 in a case of forming a film with a thickness of 3.0 μm. It could be seen that the compositions of Comparative Examples 2 to 6 using the particles having an average primary particle diameter of more than 150 nm had deteriorated temporal liquid stability.

Example 40

By using the same method as in Example 1 except that the alkali-soluble resin was changed from C-1 to C-3, evaluations were carried out. The evaluation results are the same as in Example 1.

C-3: Polysiloxane-based resin (Mw=10,000) which is Specific Example 54 as described above. This was synthesized according to the following procedure with reference to Synthesis Example 11 of <0117> and Synthesis Example 1 of <0107> in WO2014/126013A, the contents of which are incorporated herein by reference.

The following materials were introduced into a 500-mL eggplant flask, and an aqueous solution in which 2 g of phosphoric acid had been dissolved in 54 g of water at room temperature was added dropwise thereto over 30 minutes under stirring. Thereafter, the solution was stirred at 40° C. for 30 minutes, then stirred at 70° C. for 30 minutes, and finally heated at 110° C. for 3 hours to complete the reaction. The solvent was removed by an evaporator.

—Materials—

Dimethoxydimethylsilane . . . 84 parts by mass (70% by mole)

3-Acryloxypropyltrimethoxysilane . . . 47 parts by mass (20% by mole)

3-Trimethoxysilylpropyl succinic anhydride . . . 13 parts by mass (5% by mole)

3-Glycidyloxypropyltrimethoxysilane . . . 14 parts by mass (5% by mole)

PGMEA . . . 102 parts by mass

<Average Transmittance>

For the film with a thickness of 3 μm which was the pattern formed for the evaluation of solvent resistance using each of the compositions of Examples, the transmittance in a wavelength range of 400 to 700 nm was measured with a pitch of 5 nm using MCPD-3000 manufactured by Otsuka Electronics Co., Ltd., and an average value thereof was taken as an average transmittance.

As a result, it could be seen that the film of each of Examples has an average transmittance of 1% to 45% in the wavelength range of 400 to 700 nm in a case where the film has a thickness of 3 μm.

<Effect of Developer>

Even in a case where the solvent described in the present specification was used instead of the developer used in the evaluation of <Pattern Shape> for each of the compositions of Examples, the same pattern was obtained.

The film obtained from the composition of the present invention is a film which has an L* in an L*a*b* color space of CIE 1976 of 35 to 75 in a case of forming a film with a thickness of 3.0 μm, and has excellent temporal liquid stability. Such a film can exert a good optical sensor function in a case where it is cured and used as a cured film in a variety of optical sensors such as a solid-state imaging device, and thus, has significant industrial applicability.

What is claimed is:

1. A composition comprising:
   at least one of inorganic particles having an average primary particle diameter of 50 to 150 nm or inorganic particles having an average major axis length of 50 to 150 nm; and
   a resin,
   wherein a content of the inorganic particles is 30% to 60% by mass with respect to the total solid content of the composition and
   the composition has an L* in an L*a*b* color space of CIE 1976 of 35 to 75 and an average transmittance in a wavelength range of 400 to 700 nm of 1% to 50% in a case of forming a film with a thickness of 3 μm using the composition.

2. The composition according to claim 1,
   wherein the composition is a curable composition.

3. The composition according to claim 1,
   wherein the inorganic particles include a white pigment.

4. The composition according to claim 1,
   wherein the inorganic particles include titanium oxide.

5. The composition according to claim 1,
   wherein the resin is an alkali-soluble resin.

6. The composition according to claim 1, further comprising:
   a radically polymerizable compound; and
   a polymerization initiator.

7. The composition according to claim 1, further comprising a coloring inhibitor.

8. The composition according to claim 1, further comprising a chain transfer agent.

9. The composition according to claim 1, further comprising at least one of a dispersant or a dispersion aid.

10. A film formed using the composition according to claim 1.

11. The film according to claim 10,
    wherein the film has a thickness of 10 μm or less.

12. A cured film formed by curing the film according to claim 10.

13. An optical sensor comprising the cured film according to claim 12.

14. A method for producing a film, comprising:
    exposing the composition according to claim 1 through a mask with a pattern; and
    developing the exposed composition to form a pattern.

15. The composition according to claim 1,
    wherein the concentration of the solid content of the composition is 30% to 60% by mass.

16. The composition according to claim 1,
    wherein the composition includes at least one of inorganic particles having an average primary particle diameter of 80 to 130 nm or inorganic particles having an average major axis length of 80 to 130 nm.

17. A film comprising:
    at least one of inorganic particles having an average primary particle diameter of 50 to 150 nm or inorganic particles having an average major axis length of 50 to 150 nm; and
    a resin,
    wherein the film has an L* in an L*a*b* color space of CIE 1976 of 35 to 75 and an average transmittance in a wavelength range of 400 to 700 nm of 1% to 50%.

18. The film according to claim 17,
    wherein the film includes at least one of inorganic particles having an average primary particle diameter of 80 to 130 nm or inorganic particles having an average major axis length of 80 to 130 nm.

* * * * *